United States Patent [19]

Okudaira et al.

[11] Patent Number: 5,668,041
[45] Date of Patent: Sep. 16, 1997

[54] METHOD OF MANUFACTURING A SEMICONDUCTOR DEVICE HAVING A CAPACITOR

[75] Inventors: Tomonori Okudaira; Takeharu Kuroiwa; Nobuo Fujiwara; Keiichiro Kashihara, all of Hyogo, Japan

[73] Assignee: Mitsubishi Denki Kabushiki Kaisha, Tokyo, Japan

[21] Appl. No.: 632,194

[22] Filed: Apr. 15, 1996

Related U.S. Application Data

[62] Division of Ser. No. 442,925, May 17, 1995, Pat. No. 5,534,458, which is a division of Ser. No. 255,854, Jun. 7, 1994, Pat. No. 5,442,213.

[30] Foreign Application Priority Data

Jun. 23, 1993 [JP] Japan ............... 5-152364

[51] Int. Cl.$^6$ ............... H01L 21/70; H01L 27/00
[52] U.S. Cl. ............... 438/240; 438/396
[58] Field of Search ............... 437/60, 919, 52; 257/295

[56] References Cited

U.S. PATENT DOCUMENTS

| | | |
|---|---|---|
| 5,046,043 | 9/1991 | Miller et al. . |
| 5,164,337 | 11/1992 | Ogawa et al. ............... 437/52 |
| 5,187,638 | 2/1993 | Sandhu et al. . |
| 5,248,628 | 9/1993 | Okabe et al. . |
| 5,332,684 | 7/1994 | Yamamichi et al. . |
| 5,335,138 | 8/1994 | Sandhu et al. . |
| 5,386,382 | 1/1995 | Ahn ............... 437/52 |
| 5,401,680 | 3/1995 | Abt et al. . |
| 5,444,010 | 8/1995 | Park et al. . |

FOREIGN PATENT DOCUMENTS

| | | |
|---|---|---|
| 3-256358 | 11/1991 | Japan . |
| 4-63471 | 2/1992 | Japan . |
| 4-99057 | 3/1992 | Japan . |

*Primary Examiner*—Jey Tsai
*Attorney, Agent, or Firm*—Lowe, Price, LeBlanc & Becker

[57] ABSTRACT

According to a semiconductor device and a method of manufacturing thereof, a sidewall spacer is formed at a sidewall of a contact hole, in a recess portion defined by the sidewall of the contact hole and a buried conductive layer, having a film thickness gradually increasing from a top face corner of an interlayer insulation film to the surface of the buried conductive layer. Therefore, a semiconductor device that can achieve favorable breakdown voltage and anti-leak characteristics between a lower electrode layer and an upper electrode layer forming a capacitor of a DRAM.

1 Claim, 56 Drawing Sheets

5,668,041

METHOD OF MANUFACTURING A SEMICONDUCTOR DEVICE HAVING A CAPACITOR

This application is a division of application Ser. No. 08/442,925 filed May 17, 1995, U.S. Pat. No. 5,534,458 which is a division of application Ser. No. 08/255,854 filed Jun. 7, 1994 U.S. Pat. No. 5,442,213.

BACKGROUND OF THE INVENTION

1. Field of the Invention

The present invention relates to semiconductor devices and a method of manufacturing the same, and more particularly, to a semiconductor device using a high dielectric constant material for a dielectric film interposed between electrodes of a capacitor.

2. Description of the Background Art

In accordance with the significant spread of information equipment such as computers, the demand for semiconductor devices is growing rapidly. Semiconductor devices having a large storage capacity and that can operate at high speed are required.

To meet these demands, technical efforts have been made to increase the integration density, response and reliability of semiconductor devices.

A DRAM (Dynamic Random Access Memory) is well known as a semiconductor device that allows random input and output of information.

A DRAM includes a memory cell array which is a memory region for storing various information, and a peripheral circuit required for carrying out input and output with an external source.

A structure of a general DRAM will be described hereinafter with reference to FIG. 76 showing a block diagram of the structure thereof.

Referring to FIG. 76, a DRAM 350 include a memory cell array 351, a row and column address buffer 352, a row decoder 353, a column decoder 354, a sense refresh amplifier 355, a data-in buffer 356, a data-out buffer 357, and a clock generator 358.

Memory cell array 351 serves to store data signals of stored information. Row and column address buffer 352 receives an externally applied address buffer signal for selecting a memory cell forming a unit memory circuit.

Row decoder 353 and column decoder 354 specify a memory cell by decoding an address buffer signal.

Sense refresh amplifier 355 amplifies and reads out a signal stored in a specified memory cell. Data-in buffer 356 and data-out buffer 357 input or output data. Clock generator 358 generates a clock signal.

Memory cell array 351 occupies a large area on a semiconductor chip of such a DRAM. Memory cell array 351 has a plurality of memory cells arranged in a matrix for storing unit storage information.

More specifically, a memory cell includes one MOS (Metal Oxide Semiconductor) transistor, and one capacitor connected thereto.

Such a one-transistor one-capacitor type memory cell is well known. A memory cell of this structure facilitates increase of the integration density of a memory cell array due to its simple structure. Memory cells can be classified into several types according to the structure of its capacitor.

A stacked type capacitor is noteworthy for its readiness to increase the opposing area between the electrodes of a capacitor. The capacitance of a capacitor can be ensured even when the elements forming a semiconductor device are reduced in size according to the increased scale of integration. Stacked type capacitors are widely used in accordance with increase in integration density of semiconductor devices.

FIG. 77 is a sectional view of a DRAM including a conventional stacked type capacitor. Referring to FIG. 77, an isolation oxide film 333 for electrically isolating each element is formed on the surface of a silicon substrate 331.

A channel stopper region 335 is formed under isolation oxide film 333. The area of silicon substrate 331 is divided into a plurality of regions by respective isolation oxide films 333 and channel stopper regions 335. A memory cell of a DRAM is formed on the surface of an electrically isolated region of silicon substrate 331. This memory cell includes one transfer gate transistor 330 and one capacitor 320.

Transfer gate transistor 330 includes a gate oxide film 321, a gate electrode 323, and a source/drain region 325. A pair of source/drain regions 325 with a predetermined distance therebetween are formed on the surface of silicon substrate 331.

Source/drain region 325 has a LDD (Lightly Doped Drain) structure. More specifically, source/drain region 325 has a two-layered structure of an impurity region 325a of a relatively low concentration and an impurity region 325b of a relatively high concentration.

Gate electrode 323 is formed on the region sandwiched by source/drain regions 325 with gate oxide film 321 thereunder. An insulation film 327 is formed so as to cover gate electrode 323.

An insulation film 329 is formed so as to cover transfer gate transistor 330 and so as to expose partially the surface of source/drain region 325. A capacitor 320 is formed so as to come into contact with one of source/drain regions 325.

Capacitor 320 includes a lower electrode layer 313, a capacitor dielectric film 315, and an upper electrode layer 317.

Lower electrode layer (storage node) 313 is formed to come into contact with the surface of the pair of source/drain regions 325 and to extend over insulation film 329. Capacitor dielectric film 315 mainly of silicon oxide is formed to cover the surface of lower electrode layer 313.

Upper electrode layer (cell plate) 317 is formed so as to cover lower electrode layer 313 with capacitor dielectric film 315 therebetween. Charge is stored in the opposing region of lower electrode layer 313 and upper electrode layer 317 sandwiching capacitor dielectric film 315.

An interlayer insulation film 301 is formed all over the entire surface of silicon substrate 331 so as to cover capacitor 320. A contact hole 301a is formed in interlayer insulation film 301.

Contact hole 301a reaches one of the pair of source/drain regions 325. A bit line 337 is formed on interlayer insulation film 301, so as to form contact with source/drain region 325 via contact hole 301a.

Bit line 337 includes a polycrystalline silicon layer 337a and a tungsten silicide layer 337b.

More specifically, bit line 337 is formed by sequentially stacking polycrystalline silicon layer 337a and tungsten silicide layer 337b. An insulation film 319 is formed so as to cover bit line 337.

A memory cell having a stacked type capacitor as shown in FIG. 77 is suitable for increasing the integration density due to the above-described structure.

The size of a memory cell must be reduced in order to scale a DRAM to higher density. Such a reduction in the memory cell size renders the planar occupying area of a capacitor to be reduced.

As the planar occupying area is reduced, the surface area of lower electrode layer 313 is reduced substantially in proportion to the reduced rate, whereby the electrode opposing area of capacitor 320 is also reduced. This means that the amount of charge stored in the capacitor (the amount of charge stored in a memory cell of 1 bit) is reduced.

If the amount of charge stored in a memory cell of 1 bit becomes lower than a predetermined value, the operation of the DRAM as a storage region becomes unstable to degrade reliability thereof.

It is necessary to increase the capacitance of a capacitor in a limited planar occupying area in order to prevent unstable operation of a DRAM.

There are various approaches for increasing the capacitor capacitance, including:

i) reducing the thickness of the capacitor dielectric film;
ii) increasing the dielectric constant of the capacitor dielectric film.

The approach of i) has come to its limitation in the case where an interlayer insulation film is used as a capacitor dielectric film.

In order to increase the capacitance of a capacitor using a capacitor dielectric film of an interlayer insulation film, the capacitor must take a complex configuration such as a cylindrical type or bottle type capacitor.

However a capacitor with such a complex configuration requires a very difficult and tedious manufacturing process.

Recently, there has been intensive efforts in the development of increasing the dielectric constant of a capacitor, i.e. the approach of ii).

One method of increasing the dielectric constant of a capacitor dielectric film is to employ a material having a high dielectric constant such as a relative permitivity of at least 15, the so-called high dielectric constant material, as a capacitor dielectric film.

Such a high dielectric constant material has a dielectric constant several times to several hundred times that of a general interlayer insulation film. It is possible to easily increase the capacitance by using a high dielectric constant material for a capacitor dielectric film while maintaining the simple configuration of a capacitor.

Such a high dielectric constant material includes tantalum oxide ($Ta_2O_5$), lead zirconate titanate (PZT), lead lanthanum zirconate titanate (PLZT), strontium titanate (ST) and barium titanate (BT).

A conventional semiconductor device having a DRAM memory cell structure with a capacitor using such a high dielectric constant material as a capacitor dielectric film will be described hereinafter with reference to FIG. 78 showing a sectional view thereof.

Referring to FIG. 78, a DRAM memory cell is formed in a region isolated from other regions by an isolation oxide film 132 and a channel stopper region 133 of a silicon substrate 131.

This one transistor one-capacitor type memory cell includes a transfer gate transistor 136 and a capacitor 148.

Transfer gate transistor 136 includes a gate oxide film 137, a gate electrode 138, and a pair of source/drain regions 134/135.

On the region sandwiched by source and drain regions 134 and 135, a gate electrode 138 is formed with a gate oxide film 137 thereunder. An insulation film 139 is formed to cover the surface of gate electrode 138.

A bit line 140 is formed extending over insulation film 39 and in contact with one of source/drain regions 134/135.

An interlayer insulation film 141 is formed all over the surface of silicon substrate 131 so as to cover bit line 140 and transfer gate transistor 136.

Bit line 140 is referred to as a buried bit line since the surface thereof is covered by interlayer insulation film 141.

A contact hole 141a is formed in interlayer insulation film 141. Contact hole 141a reaches one of source/drain regions 134/135.

A buried conductive layer 142 is formed so as to fill contact hole 141a. Buried conductive layer 142 includes polycrystalline silicon having impurity implanted (referred to as "doped polysilicon" hereinafter).

The top face of buried conductive layer 142 is lower in level than the top face of interlayer insulation film 141 by a dimension r.

A capacitor 148 is formed to be electrically connected to source/drain region 135 via buried conductive layer 142.

Capacitor 148 includes a lower electrode layer 144, a high dielectric film 145, and an upper electrode layer 146. As described before, high dielectric film 145 of capacitor 148 is formed of a high dielectric constant material. Lower electrode layer 144 is formed of a platinum (Pt) layer.

Lower electrode layer 144 is formed to be electrically connected to buried conductive layer 142 via a barrier layer 143, and to extend over interlayer insulation film 141. Barrier layer 134 serves to prevent impurities in buried conductive layer 142 from diffusing into lower electrode layer 144.

A high dielectric film 145 of a high dielectric constant material is formed so as to cover the surface of lower electrode layer 144. Upper electrode layer 146 is formed so as to cover lower electrode layer 144 with high dielectric film 145 therebetween.

Upper electrode layer 146 is formed of platinum, doped polysilicon, or the like. Insulation film 147 is formed to cover the surface of capacitor 148.

A method of manufacturing the above-described semiconductor device will be described hereinafter with reference to FIGS. 79–83 schematically showing sectional views according to sequential manufacturing steps.

Referring to FIG. 79, isolation oxide film 132 is formed on the surface of silicon substrate 131 by LOCOS or the like. Simultaneously, channel stopper region 133 is formed in the region below isolation oxide film 132.

On the surface of silicon substrate 131, gate electrode 138 is formed with gate oxide film 137 thereunder. Using gate electrode 138 as a mask, ions are implanted to form source and drain regions 134 and 135.

Insulation film 139 is formed to cover gate electrode 138. Thus, transfer gate transistor 136 is formed.

Then, buried bit line 140 is formed so as to come into contact with source/drain region 134 and so as to extend over insulation film 139. Interlayer insulation film 141 is formed by CVD all over the surface of silicon substrate 131 so as to cover buried bit line 140 and transfer gate transistor 136.

Next, a photoresist of a predetermined pattern is formed all over the surface of interlayer insulation film 141. Using this photoresist pattern, etching is carried out to form contact hole 141a communicating with source/drain region 135.

Referring to FIG. 80, doped polysilicon film 142a is deposited all over the surface of interlayer insulation film 141 so as to fill the interior of contact hole 141a.

Referring to FIG. 81, doped polysilicon film 142a is etched back until the surface of interlayer insulation film 141 is exposed. An overetching of approximately 20–30% of the film thickness of doped polysilicon film 142a is carried out to completely remove etching residues (not shown) on the surface of interlayer insulation film 141. The top face of doped polysilicon film 142a recedes from the top face of interlayer insulation film 141 by a considerable amount (dimension r) due to the so-called loading effect in addition to the overetching process.

It is to be noted that interlayer insulation film 141 is hardly etched away during this etchback process since it has a higher etching selectivity with respect to doped polysilicon film 142a. Thus, buried conductive layer 142 is formed in contact hole 141a.

Referring to FIG. 82, barrier layer 143 of Ti/TiN/Ti is formed by a sputtering method on a recess of dimension r on buried conductive layer 142. Then, a lower electrode layer 144 of platinum is layered thereon, which are patterned to a predetermined configuration.

Referring to FIG. 83, high dielectric film 145 of PZT, for example, is formed so as to cover the surface of lower electrode layer 144 by sputtering.

Then, upper electrode layer 146 of platinum, for example, is formed by a sputtering method on high dielectric film 145. Thus, capacitor 148 including lower electrode layer 144, high dielectric film 145 and upper electrode layer 146 is formed.

Then, insulation film 147 is deposited so as to cover capacitor 148 to result in the semiconductor device shown in FIG. 78.

As described above, a conventional semiconductor device is formed using a high dielectric film as a capacitor dielectric film. The potential of applying such a capacitor in a high integrated memory device, for example a DRAM of 256M, is great since the capacitance of a capacitor can be readily increased while maintaining a simple configuration of the capacitor.

The above-described conventional semiconductor device and manufacturing method thereof had problems set forth in the following.

There was the problem that the anti-leak characteristic and breakdown voltage characteristic between lower electrode layer 144 and upper electrode layer 145 forming capacitor 148 are degraded.

In the etchback process of doped polysilicon film 142a of FIGS. 80 and 81, doped polysilicon film 142a is subjected to overetching in order to completely remove etching residues on the upper surface of other portions (not shown) of interlayer insulation film 141.

When this etchback process of doped polysilicon film 142a proceeds to expose the upper surface of interlayer insulation film 141, the only exposed area of doped polysilicon film 142a will be that remaining in contact hole 141a.

When the exposed area of a film to be etched (in this case, doped polysilicon film 142a) is rapidly reduced, the etching rate of the film to be etched will be increased by the so-called loading effect.

By a synergistic effect of an overetching process and a loading effect of doped polysilicon film 142a, the top face of buried conductive layer 142 is recessed in contact hole 141a. In other words, a recess portion (a concave) is seen in contact hole 141a.

When lower electrode layer 143 formed of platinum and capacitor dielectric film 144 formed of a high dielectric constant material are provided by a sputtering method which is poor in step coverage in this state where a recess portion exists, the portion of capacitor dielectric film 144 over the stepped portion of lower electrode layer 143 will be reduced in thickness.

FIG. 84 is a partial enlarged sectional view of the recess (p portion) shown in FIG. 78.

Referring to FIG. 84, high dielectric film 145 is reduced in thickness at the lower portion (R portion) of the recess. In the worst case, the film becomes so thin that it is terminated.

Such a reduction in film thickness of high dielectric film 145 will increase leakage current between lower electrode layer 144 and upper electrode layer 146. It is therefore difficult to ensure a predetermined breakdown voltage. In other words, satisfactory breakdown voltage and anti-leak characteristics cannot be obtained.

Furthermore, if high dielectric film 145 is not fully formed, lower electrode layer 144 will be directly in contact with upper electrode layer 146 to flaw the function of a capacitor.

SUMMARY OF THE INVENTION

An object of the present invention is to provide a semiconductor device achieving satisfactory breakdown voltage and anti-leak characteristics between a lower electrode layer and an upper electrode layer of a capacitor, and a method of manufacturing thereof.

To achieve the above object, a semiconductor device according to an aspect of the present invention includes; a semiconductor substrate having a main surface; an impurity region formed on the main surface of the semiconductor substrate; an interlayer insulation film formed on the main surface of the semiconductor substrate so as to cover the impurity region, and having a contact hole reaching the impurity region; a buried conductive layer filling the contact hole, in contact with the impurity region, and having a top face lower in level than the top face of the interlayer insulation film; a sidewall spacer formed at the sidewall of the contact hole from the top face corner of the interlayer insulation film to the upper face of the buried conductive layer, in a recess defined by the sidewall of the contact hole and the top face of the buried conductive layer; a lower electrode layer formed on the interlayer insulation film and the sidewall spacer so as to come into contact with the upper face of the buried conductive layer; a high dielectric film of a high dielectric constant material formed so as to cover the lower electrode layer; and an upper electrode layer formed to cover the high dielectric film.

According to this semiconductor device, a sidewall spacer is formed at the sidewall of the contact hole in the recess defined by the sidewall of the contact hole and the surface of the buried conductive layer, from the top face corner of the interlayer insulation film to the surface of the buried conductive layer.

In the recess portion, an abrupt sidewall is not seen, and a stepped portion will not be generated in the lower electrode layer as in a conventional case. Therefore, the high dielectric film formed on the lower electrode layer will not be reduced in thickness in the recess portion. Thus, there will be no portion between the lower electrode layer and the upper electrode layer in which the thickness is reduced as in the conventional case when the upper electrode layer is formed on the high dielectric film. Thus, the breakdown and anti-leak characteristics of a capacitor will not be degraded.

To achieve the above object, a semiconductor device according to another aspect of the present invention includes: a semiconductor substrate having a main surface; an impurity region formed on the main surface of the semiconductor substrate; an interlayer insulation film formed on the main surface of the semiconductor substrate to cover the impurity region, and having a contact hole reaching the impurity region; a buried conductive layer filled in the contact hole, in contact with the impurity region, and having a top face lower in level than the top face of the interlayer insulation film; a lower electrode layer formed on the interlayer insulation film to come into contact with the buried conductive layer; a first sidewall spacer extending from the top face corner of the lower electrode layer to the top face of the interlayer insulation film; a second sidewall spacer from the top face corner of the lower electrode layer on the interlayer insulation film to the surface of the lower electrode on the buried conductive layer, on the surface of the lower electrode layer in a recess portion defined by the sidewall of the contact hole and the top face of the buried conductive layer; a high dielectric film of a high dielectric constant material formed to cover the lower electrode layer, the first sidewall spacer, and the second sidewall spacer; and an upper electrode layer formed to cover the high dielectric film.

According to this semiconductor device, a second sidewall spacer is formed extending from the top face corner of the lower electrode layer on the interlayer insulation film to the surface of the lower electrode layer on the buried conductive layer, on the lower electrode layer formed in the recess portion defined by the sidewall of the contact hole and the surface of the buried conductive layer.

Therefore, an abrupt stepped portion is not formed on the lower electrode layer of the recess portion, whereby the high dielectric film formed on the lower electrode layer is not reduced in thickness in the recess portion. The portion between the lower electrode layer and the upper electrode layer will not be reduced in thickness as in a conventional case when the upper electrode layer is formed on the high dielectric film. Thus, breakdown voltage and anti-leak characteristics of a capacitor are not degraded.

Furthermore, a first sidewall spacer is formed at the edge face portion of the lower electrode layer from the top face corner of the lower electrode layer to the surface of the interlayer insulation film.

This reduces the level of a stepped-portion at the edge face of the lower electrode layer. The high dielectric film formed on the lower electrode layer is not reduced in thickness at this stepped portion. Therefore, when the upper electrode layer is formed on the high dielectric film, the portion between the lower electrode layer and the upper electrode layer will not be reduced in thickness as in a conventional case. Thus, breakdown voltage and anti-leak characteristics of a capacitor are not degraded.

To achieve the above object, a semiconductor device according to a further aspect of the present invention includes: a semiconductor substrate having a main surface; an impurity region formed on the main surface of the semiconductor substrate; an interlayer insulation filmformed on the main surface of the semiconductor substrate to cover the impurity region, and having a contact hole reaching the impurity region; a buried conductive layer filled in the contact hole, in contact with the impurity region, and having a top face higher in level than the top face of the interlayer insulation film; a sidewall spacer formed at the sidewall of the buried conductive layer, from the top face corner of the buried conductive layer to the surface of the interlayer insulation film; a lower electrode layer formed on the interlayer insulation film and the sidewall spacer to come into contact with the buried conductive layer; a high dielectric film of a high dielectric constant material formed to cover the lower electrode layer; and an upper electrode layer formed to cover the high dielectric film.

According to this semiconductor device, a buried conductive layer having a top face higher in level than the top face of the interlayer insulation film, and a sidewall spacer provided at the sidewall of the buried conductive layer, and having the film thickness increased gradually from the top face corner of the buried conductive layer to the surface of the interlayer insulation film are provided.

Therefore, a stepped portion is not generated in the lower electrode layer when the lower electrode layer is formed on the buried conductive layer. As a result, the high dielectric film formed on the lower electrode layer is not reduced in thickness at the stepped portion. The portion between the lower electrode layer and the upper electrode layer is not reduced in thickness as in a conventional case when the upper electrode layer is formed on the high dielectric film. Thus, breakdown voltage and anti-leak characteristics of a capacitor are not degraded.

To achieve the above object, a semiconductor device according to still another aspect of the present invention includes: a semiconductor substrate having a main surface; an impurity region formed on the main surface of the semiconductor substrate; an interlayer insulation film formed on the main surface of the semiconductor substrate to cover the impurity region, and having a contact hole reaching the impurity region; a buried conductive layer filled in the contact hole, in contact with the impurity region, and having a top face higher in level than the top face of the interlayer insulation film; a lower electrode layer formed on the interlayer insulation film to come into contact with the buried conductive layer; a first sidewall spacer formed at the sidewall portion of the lower electrode, from the top face corner of the lower electrode layer to the surface of the interlayer insulation film; a second sidewall spacer formed from the top face corner of the lower electrode layer located on interlayer insulation film to the surface of the lower electrode located on the buried conductive layer, in a recess portion of the lower electrode layer formed along the interlayer insulation film; a high dielectric film of a high dielectric constant material formed to cover the lower electrode layer, the first sidewall spacer, and the second sidewall spacer; and an upper electrode layer formed to cover the high dielectric film.

According to this semiconductor device, there are provided a buried conductive layer having a top face higher in level than the top face of the interlayer insulation film, a lower electrode layer formed on the interlayer insulation film to come into contact with the buried conductive layer, and a second sidewall spacer in the recess portion of the lower electrode layer, increased in film thickness from the surface of the lower electrode layer located on the interlayer insulation film to the surface of the lower electrode layer located on the buried conductive layer.

This reduces the level of a stepped portion generated at the lower electrode layer on the buried conductive layer. The high dielectric film formed on this lower electrode layer is not reduced in film thickness at the stepped portion. As a result, the portion between the lower electrode layer and the upper electrode layer is not reduced in thickness as in a conventional case when the upper electrode layer is formed on the high dielectric film. Thus, breakdown voltage and anti-leak characteristics of a capacitor are not degraded.

Furthermore, the first sidewall spacer is provided at the edge face portion of the lower electrode layer, having a film thickness gradually increasing from the top face corner of the lower electrode layer to the surface of the interlayer insulation film.

This reduces the level of a stepped portion seen at the sidewall of the lower electrode layer. The high dielectric film formed on this lower electrode layer is not reduced in film thickness at this stepped portion. Therefore, the portion between the lower electrode layer and the upper electrode layer is not reduced in thickness as in a conventional case when the lower electrode layer is formed on the high dielectric film. Thus, breakdown voltage and anti-leak characteristics of a capacitor are not degraded.

To achieve the above object, a semiconductor device according to yet a further aspect of the present invention includes: a semiconductor substrate having a main surface; an impurity region formed on the main surface of the semiconductor substrate; an interlayer insulation film formed on the main surface of the semiconductor substrate to cover the impurity region, having a first contact hole of a first diameter reaching the impurity region and a second contact hole of a second diameter greater than the first diameter, above the first contact hole in communication thereto; a buried conductive layer filled in the first contact hole, and in contact with the impurity region; a lower electrode layer filled in the second contact hole, in contact with the buried conductive layer, and having a top face substantially flush with the top face of the interlayer insulation film; a high dielectric film of a high dielectric constant material formed on the interlayer insulation film to come into contact with the lower electrode layer; and an upper electrode layer formed on the high dielectric film.

According to this semiconductor device, there are provided an interlayer insulation film having a first contact hole of a first diameter and a second contact hole of a second diameter greater than the first diameter, above the first contact hole in communication therewith; a buried conductive layer filled in the first contact hole, and in contact partially with the surface of the impurity region, and a lower electrode filled in the second contact hole, in contact with the buried conductive layer, and having a top face substantially flush with the top face of the interlayer insulation film.

Therefore, the lower electrode layer can be formed in the second contact hole impervious to the low step coverage of a sputtering method. Because the top face of the lower electrode layer is formed so as to be substantially flush with the top face of the interlayer insulation film, the high dielectric film formed on the interlayer insulation film is not reduced in thickness at the stepped portion as in a conventional case. The portion between the lower and upper electrode layers is not reduced in thickness as in a conventional case when the upper electrode layer is formed on the high dielectric film. Thus, breakdown voltage and anti-leak characteristics of a capacitor are not degraded.

To achieve the above object, a semiconductor device according to yet another aspect of the present invention includes: a semiconductor substrate having a main surface; an impurity region formed on the main surface of the semiconductor substrate; an interlayer insulation film formed on the main surface of the semiconductor substrate to cover the impurity region, and having a contact hole reaching to the impurity region; a buried conductive layer filled in the contact hole, in contact with the impurity region, and having a top face lower in level than the top face of the interlayer insulation film; a lower electrode layer formed on the interlayer insulation film to come into contact with the top face of the buried conductive layer; a high dielectric film of a high dielectric constant material formed to cover the interlayer insulation film with the lower electrode layer thereunder; and an upper electrode layer formed to cover the high dielectric film. The lower electrode layer has a sidewall of the edge face portion thereof gradually inclined towards the interlayer insulation film.

According to this semiconductor substrate, the side face of the lower electrode layer is formed to be gradually inclined towards the surface of the interlayer insulation film. This reduces the level of the stepped portion at the sidewall portion of this lower electrode layer. The high dielectric film formed on this lower electrode layer is not reduced in thickness at this sidewall portion. The portion between the lower electrode layer and the upper electrode layer is not reduced in thickness as in a conventional case when the upper electrode layer is formed on the high dielectric film. Thus, breakdown voltage and anti-leak characteristics of a capacitor are not degraded.

To achieve the above object, a semiconductor device according to yet a still further aspect of the present invention includes: a semiconductor substrate having a main surface; an impurity region formed on the main surface of the semiconductor substrate; an interlayer insulation film formed on the main surface of the semiconductor substrate to cover the impurity region, and having a contact hole reaching the impurity region; a buried conductive layer filling the contact hole, in contact with the impurity region, and having a top face lower in level than the top face of the interlayer insulation film; a lower electrode layer formed extending on the surface of the interlayer insulation film so as to come into contact with the buried conductive layer; a high dielectric film of a high dielectric constant material formed to cover the lower electrode layer; and an upper electrode layer formed to cover the high dielectric film. A gradient portion of a predetermined configuration is formed at the intersection position of the sidewall of the contact hole and the top face of the interlayer insulation film.

According to this semiconductor device, a stepped portion will not be generated at the lower electrode layer as in a conventional case when the lower electrode layer is formed on the buried conductive layer because a gradient portion of a predetermined configuration is provided at the intersection of the sidewall of the contact hole and the upper face of the interlayer insulation film.

Therefore, the high dielectric film formed on the lower electrode layer is not reduced in thickness at the stepped portion. The portion between the lower electrode layer and the upper electrode layer is not reduced in thickness as in a conventional case when the upper electrode layer is formed on the high dielectric film. Thus, breakdown voltage and anti-leak characteristics of a capacitor are not degraded.

To achieve the above object, a semiconductor device according to yet a still further aspect of the present invention includes: a semiconductor substrate having a main surface; an impurity region formed on the main surface of the semiconductor substrate; an interlayer insulation film formed on the main surface of the semiconductor substrate to cover the impurity region, and having a contact hole reaching the impurity region; a buried conductive layer filled in the contact hole, in contact with the impurity region, and having a top face lower in level than the top face of the interlayer insulation film; a deposited conductive layer formed on the surface of the interlayer insulation film in contact with the buried conductive layer; a lower electrode layer formed extending on the deposited conductive layer; a high dielectric film of a high dielectric constant material formed to cover the deposited conductive layer and the lower electrode layer; and an upper electrode layer formed to cover the high dielectric film.

According to this semiconductor device, the stepped portion on the buried conductive layer can be rounded in configuration due to the provision of a deposited conductive layer grown by CVD between the buried conductive layer and the lower electrode layer. Therefore, a stepped portion is not generated in the lower electrode layer as in a conventional case when the lower electrode layer is formed on the buried conductive layer.

The high dielectric film formed on the lower electrode layer is not reduced in thickness at the stepped portion. Therefore, the portion between the lower and upper electrode layers is not reduced in thickness as in a conventional case when the upper electrode layer is formed on the high dielectric layer. Thus, breakdown voltage and anti-leak characteristics of a capacitor are not degraded.

To achieve the above object, a method of manufacturing a semiconductor device according to an aspect of the present invention includes the following steps.

First, an impurity region is formed on a main surface of a semiconductor substrate. Then, an interlayer insulation film is formed on the main surface of the semiconductor substrate to cover the impurity region.

Next, a contact hole reaching the impurity region is formed in the interlayer insulation film. A buried conductive layer is formed, filling the contact hole, in contact with the impurity region, and having a top face lower than the top face of the interlayer insulation film.

In a recess portion defined by the sidewall of the contact hole and the surface of the buried conductive layer, a sidewall spacer is formed at the sidewall in the contact hole from the top face corner of the interlayer insulation film to the surface of the buried conductive layer. Then, a lower electrode layer is formed on the interlayer insulation film and the sidewall spacer so as to be in contact with the buried conductive layer.

Then, a high dielectric film of a high dielectric constant material is formed to cover the lower electrode layer. Then, an upper electrode layer is formed to cover the high dielectric film.

According to this method of manufacturing a semiconductor device, a sidewall spacer is formed from the top face corner of the interlayer insulation film to the surface of the buried conductive layer, at the sidewall of contact hole, in the recess portion defined by the sidewall of the contact hole and the surface of the buried conductive layer.

Therefore, there is no abrupt wall face in the recess portion. A stepped portion as in a conventional case will not be generated in the lower electrode layer. As a result, the high dielectric film formed on the lower electrode layer is not reduced in thickness in the recess portion. The portion between the lower electrode layer and the upper electrode layer is not reduced in thickness when the upper electrode layer is formed on the high dielectric film as in a conventional case. Thus, breakdown voltage and anti-leak characteristics of a capacitor are not degraded.

To achieve the above object, a method of manufacturing a semiconductor device according to another aspect of the present invention includes the following steps.

First, an impurity region is formed on a main surface of a semiconductor substrate. An interlayer insulation film is formed on the main surface of the semiconductor substrate to cover the impurity region.

A contact hole communicating with the impurity region is formed in the interlayer insulation film. A buried conductive layer is formed to fill the contact hole, in contact with the impurity layer, and having a top face lower in level than the top face of the interlayer insulation film.

Next, a lower electrode is formed on the surface of the interlayer insulation film so as to be in contact with the buried conductive layer. At the edge face of the lower electrode layer, a first sidewall spacer is formed from the top face corner of the lower electrode layer to the surface of the interlayer insulation film.

On the surface of the lower electrode layer in a recess portion defined by the sidewall of the contact hole and the surface of the buried conductive layer, a second sidewall spacer is formed from the top face corner of the lower electrode layer located on the interlayer insulation film to the surface of the lower electrode layer located on the buried conductive layer.

Then, a high dielectric film of a high dielectric constant material is formed to cover the lower electrode layer, the first sidewall spacer, and the second sidewall spacer. Then, an upper electrode layer is formed to cover the high dielectric film.

According to this manufacturing method of a semiconductor device, a second sidewall spacer is provided from the top face corner of the lower electrode layer on the surface of the interlayer insulation film to the lower electrode layer on the buried conductive layer, on the surface of the lower electrode layer formed in the recess portion defined by the sidewall of the contact hole and the surface of the buried conductive layer.

Therefore, there is no abrupt stepped portion on the surface of the lower electrode layer in the recess portion. The high dielectric film formed on the lower electrode layer is not reduced in thickness in the recess portion. The portion between the lower electrode layer and the upper electrode layer is not reduced in thickness as in a conventional case when the upper electrode layer is formed on the high dielectric film. Thus, breakdown voltage and anti-leak characteristics of a capacitor are not degraded.

Furthermore, the first sidewall spacer is provided from the top face corner of the lower electrode layer to the surface of the interlayer insulation film also at the edge face portion of the lower electrode layer.

This reduces the level of the stepped portion at the edge face portion of the lower electrode layer. The high dielectric film formed on the lower electrode layer is not reduced in thickness at this stepped portion. The portion between the lower and upper electrode layers is not reduced in thickness as in a conventional case when the upper electrode layer is formed on the high dielectric film. Thus, breakdown voltage and anti-leak characteristics of a capacitor are not degraded.

To achieve the above object, a method of manufacturing a semiconductor device according to a further aspect of the present invention includes the following steps.

First, an impurity region is formed on the main surface of a semiconductor substrate. An interlayer insulation film is formed on the main surface of the semiconductor substrate so as to cover the impurity region.

A contact hole communicating with the impurity region is formed in the interlayer insulation film. Then, a buried conductive layer is formed, filling the contact hole, in contact with the impurity region, having a top face higher in level than the top face of the interlayer insulation film.

A sidewall spacer is formed at the sidewall of the buried conductive layer, from the top face of the buried conductive layer to the surface of the interlayer insulation film. A lower electrode layer is formed on the interlayer insulation film and the sidewall spacer so as to come into contact with the buried conductive layer.

A high dielectric film of a high dielectric constant material is formed so as to cover the lower electrode layer. Then, an upper electrode layer is formed so as to cover the high dielectric film.

According to this method of manufacturing a semiconductor device, there are provided a buried conductive layer having a top face higher in level than the top face of the interlayer insulation film, and a sidewall spacer at the sidewall of the buried conductive layer, having a film thickness gradually increasing from the top face corner of the buried conductive layer to the surface of the interlayer insulation film.

Therefore, a stepped portion is not generated in the lower electrode layer when the lower electrode layer is formed on the buried conductive layer. The high dielectric film formed on the lower electrode layer is not reduced in thickness at the stepped portion. The portion between the lower and upper electrode layers is not reduced in thickness as in a conventional case when the upper electrode layer is formed on the high dielectric film. Thus, breakdown voltage and anti-leak characteristics of a capacitor are not degraded.

To achieve the above object, a method of manufacturing a semiconductor device according to still another aspect of the present invention includes the following steps.

First, an impurity region is formed on a main surface of a semiconductor substrate. An interlayer insulation film is formed on the main surface of the semiconductor substrate so as to cover the impurity region.

A contact hole communicating with the impurity region is formed on the interlayer insulation film. A buried conductive layer filling the contact hole and in contact with the impurity region is formed having a top face higher in level than the top face of the interlayer insulation film.

A lower electrode is formed on the interlayer insulation film so as to come into contact with the buried conductive layer. A first sidewall spacer is formed at the edge face portion of the lower electrode layer, from the top face of the lower electrode layer to the surface of the interlayer insulation film.

In a recess portion of the lower electrode layer formed along the interlayer insulation film, a second sidewall spacer is formed from the top face corner of the lower electrode located on the interlayer insulation film to the surface of the lower electrode layer located on the buried conductive layer.

Then, a high dielectric film of a high dielectric constant material is formed so as to cover the lower electrode layer, the first sidewall spacer, and the second sidewall spacer. Next, an upper electrode layer is formed so as to cover the high dielectric film.

According to this manufacturing method of a semiconductor device, there are provided a buried conductive layer having a top face higher in level than the top face of the interlayer insulation film, a lower electrode layer formed on the interlayer insulation film so as to come into contact with the buried conductive layer, and the second sidewall spacer in the recess portion of the lower electrode, having a film thickness gradually increasing from the top face corner of the lower electrode layer on the interlayer insulation film to the surface of the lower electrode on the buried conductive layer.

This reduces the level of a stepped portion generated in the lower electrode layer formed on the buried conductive layer, whereby the high dielectric film formed on this lower electrode layer is not reduced in thickness at the stepped portion. As a result, the portion between the lower electrode layer and the upper electrode layer is not reduced in thickness as in the conventional case when the upper electrode layer is formed on the high dielectric film. Thus, breakdown voltage and anti-leak characteristics of a capacitor are not degraded.

The first sidewall spacer is provided at the edge face portion of the lower electrode layer, having a film thickness gradually increasing from the top face corner of the lower electrode layer to the surface of the interlayer insulation film.

This reduces the level of a stepped portion at the edge face of the lower electrode layer. The high dielectric film formed on this lower electrode layer is not reduced in thickness at the stepped portion. The portion between the upper and lower electrode layers is not reduced in thickness as in a conventional case when the upper electrode layer is formed on the high dielectric film. Thus, breakdown voltage and leak characteristics of a capacitor are not degraded.

To achieve the above object, a method of manufacturing a semiconductor device according to still another aspect of the present invention includes the following steps.

First, an impurity region is formed on a main surface of the semiconductor substrate. An interlayer insulation film including a first contact hole of a first diameter reaching the impurity region and a second contact hole of a second diameter greater than the first diameter, above the first contact hole and communicating therewith is formed on the main surface of the semiconductor substrate to cover the impurity region.

Then, a buried conductive layer filled in the first contact hole, and in contact partially with a surface of the impurity region is formed. Next, a lower electrode layer filled in the second contact hole, in contact with the buried conductive layer, and having a top face substantially flush with the upper face of the interlayer insulation film is formed.

A high dielectric film of a high dielectric constant material is formed on the surface of the interlayer insulation film so as to come into contact with the lower electrode layer. An upper electrode layer is formed on the high dielectric film.

According to this manufacturing method of a semiconductor device, there are provided an interlayer insulation film having a first contact hole of a first diameter, and a second contact hole of a second diameter greater than the first diameter, formed above the first contact hole in communication therewith, a buried conductive layer filling the first contact hole and partially in contact with the impurity region, and a lower electrode layer filling the second contact hole, in contact with the buried conductive layer, and having a top substantially flush with the top face of the interlayer insulation film.

Therefore, the lower electrode layer can be formed in the second contact hole impervious to the poor step coverage by a sputtering method. The high dielectric formed on the interlayer insulation film is not reduced in film thickness in the stepped portion as in a conventional case since the surface of the lower electrode layer is substantially flush with the upper face of the interlayer insulation film. The portion between the upper and lower electrode layers is not reduced in thickness as in a conventional case when the upper electrode layer is formed on the high dielectric film. Thus, breakdown voltage and anti-leak characteristics of a capacitor are not degraded.

To achieve the above object, a method of manufacturing a semiconductor device according to yet a further aspect of the present invention includes the following steps.

First an impurity region is formed on a main surface of a semiconductor substrate. An interlayer insulation film is formed on the main surface of the semiconductor substrate so as to cover the impurity region.

A contact hole communicating with the impurity region is formed in the interlayer insulation film. A buried conductive layer is formed filling the contact hole, in contact with the impurity region, and having a top face lower in level than the top face of the interlayer insulation film.

Then, a lower electrode layer is formed on the interlayer insulation film so as to come into contact with the buried conductive layer. A high dielectric film of a high dielectric constant material is formed so as to cover the interlayer insulation film with the lower electrode layer thereunder. An upper electrode layer is formed so as to cover the high dielectric film. In the step of forming the lower electrode layer, the side face of the edge face portion thereof is formed to gradually incline towards the surface of the interlayer insulation film.

According to this manufacturing method of a semiconductor device, the side face of the lower electrode layer is formed to be gradually inclined towards the surface of the interlayer insulation film. This reduces the level of the stepped portion at the edge face of the lower electrode layer. The high dielectric formed on this lower electrode layer is not reduced in film thickness at the edge face portion. The portion between the lower and upper electrode layers is not reduced in film thickness as in a conventional case when the upper electrode layer is formed on the high dielectric film. Thus, breakdown voltage and anti-leak characteristics of a capacitor are not degraded.

To achieve the above object, a method of manufacturing a semiconductor device according to yet another aspect of the present invention includes the following steps.

First an impurity region is formed on a main surface of the semiconductor substrate. An interlayer insulation film is formed on the main surface of the semiconductor substrate so as to cover the impurity region, and has a contact hole reaching the impurity region.

A buried conductive layer filled in the contact hole, in contact with the impurity region, and having a top face lower in level than the top face of the interlayer insulation film is formed. Then, a lower electrode layer in contact with the buried conductive layer, and extending over the interlayer insulation film is formed. A high dielectric film of a high dielectric constant material is formed so as to cover the lower electrode layer.

An upper electrode layer is formed so as to cover the high dielectric film. In the step of forming the interlayer insulation film, a gradient portion of a predetermined configuration is formed at the intersection of the sidewall of the contact hole and the top face of the interlayer insulation film.

According to this manufacturing method of a semiconductor device, a stepped portion is not generated in the lower electrode layer as in a conventional case when the lower electrode layer is formed on the buried conductive layer since a gradient portion of a predetermined configuration is formed at the intersection of the sidewall of the contact hole and the upper face of the interlayer insulation film.

Therefore, the high dielectric film formed on the lower electrode layer is not reduced in thickness at the stepped portion. The portion between the lower electrode layer and the upper electrode layer is not reduced in thickness as in a conventional case when the upper electrode layer is formed on the high dielectric film. Thus, breakdown voltage and anti-leak characteristics of a capacitor are not degraded.

To achieve the above object, a method of manufacturing a semiconductor device according to yet another aspect of the present invention includes a following steps.

First an impurity region is formed on a main surface of a semiconductor substrate. An interlayer insulation film is formed on the main surface of the semiconductor substrate to cover the impurity region, and has a contact hole reaching the impurity region.

A buried conductive layer filled in the contact hole, in contact with the impurity region, and having a top face lower in level than the top face of the interlayer insulation film is formed. A deposited conductive layer is formed on the surface of the interlayer insulation film by CVD in contact with the upper face of the buried conductive layer.

A lower electrode layer is formed on the deposited conductive layer. A high dielectric film of a high dielectric constant material is formed so as to cover the deposited conductive layer and the lower electrode layer.

Then, an upper electrode layer is formed so as to cover the high dielectric film.

According to this method of manufacturing a semiconductor device, the stepped portion on the buried conductive layer can be rounded in configuration since a deposited conductive layer is formed by CVD between the buried conductive layer and the lower electrode layer. Therefore, a stepped portion is not generated in the lower electrode layer as in a conventional case when the lower electrode layer is formed on the buried conductive layer.

The high dielectric film formed on this lower electrode layer is not reduced in thickness at the stepped portion. The portion between the upper and lower electrode layers is not reduced in thickness as in a conventional case when the upper electrode layer is formed on the high dielectric film. Thus, breakdown voltage and anti-leak characteristics of a capacitor are not degraded.

To achieve the above object, a method of manufacturing a semiconductor device according to yet a still further aspect of the present invention includes the following steps.

First, an impurity region is formed on a main surface of the semiconductor substrate. An interlayer insulation film is formed on the main surface of the semiconductor substrate so as to cover the impurity region.

A contact hole communicating with the impurity region is formed on the interlayer insulation film. A buried conductive layer filled in the contact hole, in contact with the impurity region, and having a top face lower in level than the top face of the interlayer insulation film is formed.

A lower electrode layer is formed on the surface of the interlayer insulation film so as to come into contact with the buried conductive layer. A high dielectric film of a high dielectric constant material is formed so as to cover the interlayer insulation film with the lower electrode layer therebetween. The surface of the high dielectric is planarized by a chemical-mechanical polishing method.

An upper electrode layer is formed so as to cover the high dielectric film.

According to this manufacturing method of a semiconductor device, the high dielectric film is deposited so as to cover the interlayer insulation film with the lower electrode layer thereunder. The surface of this high dielectric film is planarized by a chemical-mechanical polishing method. This planarization of the high dielectric film prevents generation of a stepped portion. The portion between the upper and lower electrode layers is not reduced in thickness when the upper electrode layer is formed on the high dielectric film. Thus, breakdown voltage and anti-leak characteristics of a capacitor are not degraded.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment according to the present invention will be described hereinafter with reference to the drawings.

Figure 1:
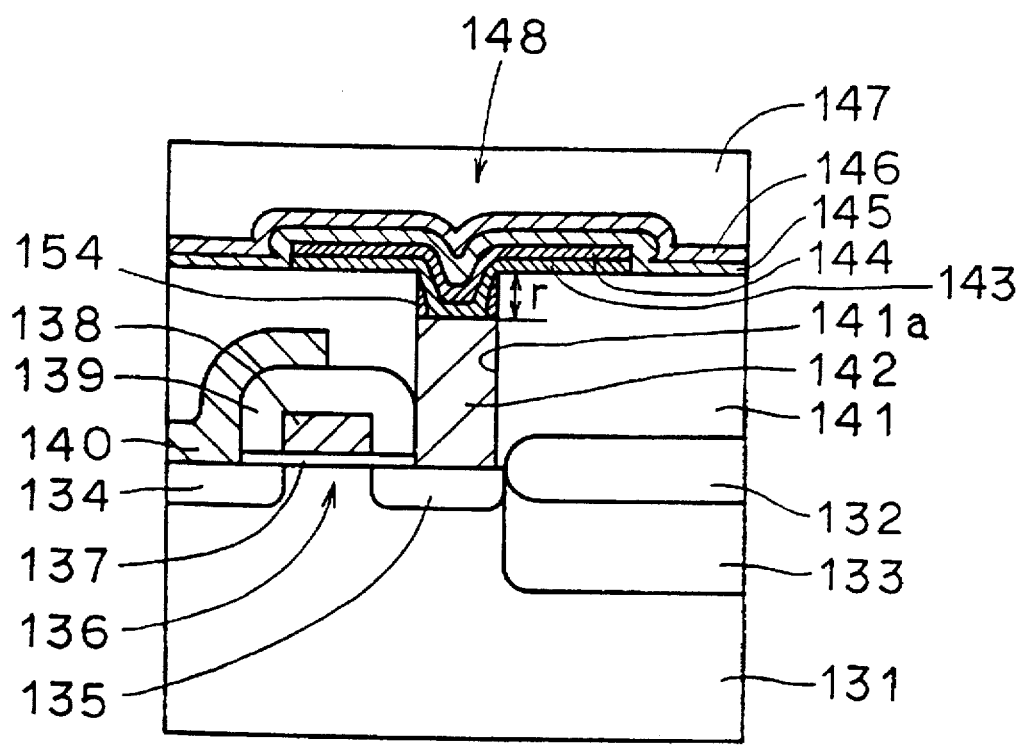
FIG. 1 is a sectional structural view of a semiconductor device according to a first embodiment of the present invention.

FIG. 1 is a sectional view of a structure of a semiconductor device according to a first embodiment.

Referring to FIG. 1, a DRAM memory cell is formed in a region isolated from other region on the chip by an isolation oxide film 132 and a channel stopper region 133 of a silicon substrate 131. This memory cell is a one transistor one capacitor type memory cell including a transfer gate transistor 136 and a capacitor 148.

Transfer gate transistor 136 includes a gate oxide film 137, a gate electrode 138, and a pair of source/drain regions 134/135.

On the region sandwiched by source/drain regions 134/135, gate electrode 138 is formed with gate oxide film 137 thereunder. An insulation film 139 is formed so as to cover the surface of gate electrode 138.

A bit line 140 is formed extending over insulation film 139 so as to cone into contact with one of source/drain regions 134/135 forming transfer gate transistor 136. An interlayer insulation film 141 is formed all over the surface of silicon substrate 131 so as to cover bit line 140 and transfer gate transistor 136.

Bit line 140 is a buried bit line having the surface covered by interlayer insulation film 141.

A contact hole 141a is formed in interlayer insulation film 141. Contact hole 141a reaches the surface of the other of source/drain regions 134/135.

A buried conductive layer 142 is formed so as to fill contact hole 141a. Buried conductive layer 142 is formed of doped polycrystalline silicon, tungsten, titanium nitride or the like.

The top face of buried conductive layer 142 is lower in level than the top face of interlayer insulation fill 141 by a dimension r due to reasons described in the section of the prior art. Therefore, a recess of a dimension r is formed at the surface of interlayer insulation film 121.

A capacitor 148 is formed to be electrically connected to source/drain region 135 via buried conductive layer 142.

Capacitor 148 includes a lower electrode layer 144, a high dielectric film 145, and an upper electrode layer 146. High dielectric film 145 of capacitor 148 is formed of a high dielectric film similar to a conventional one. Therefore, lower electrode layer 144 is formed of platinum (Pt).

Lower electrode layer 144 is formed to be electrically connected with buried conductive layer 142 via a barrier layer 143, extending over interlayer insulation film 141.

Barrier layer 143 serves to prevent impurities in buried conductive layer 142 from diffusing into lower electrode layer 144, as in prior art.

In the above-described recess, a sidewall spacer 154 is formed at the inner wall of contact hole 141a, gradually increased in film thickness from the top face corner of interlayer insulation film 141 to buried conductive layer 142.

By providing sidewall spacer 145, the step coverage of lower electrode layer 144 at the growth thereof is improved, so that a portion reduced in film thickness is not generated as in a conventional case.

High dielectric film 145 of a high dielectric constant material is formed on the surface of lower electrode layer 144. Upper electrode layer 146 is formed to cover lower electrode layer 144 with high dielectric film 145 therebetween.

Upper electrode layer 146 is formed of platinum or doped polysilicon. An insulation film 147 is formed to cover capacitor 148.

A method of manufacturing the above semiconductor device will be described hereinafter with reference to FIGS. 2–8 showing sectional views of the semiconductor device of the first embodiment with sequential manufacturing steps.

Figure 2:
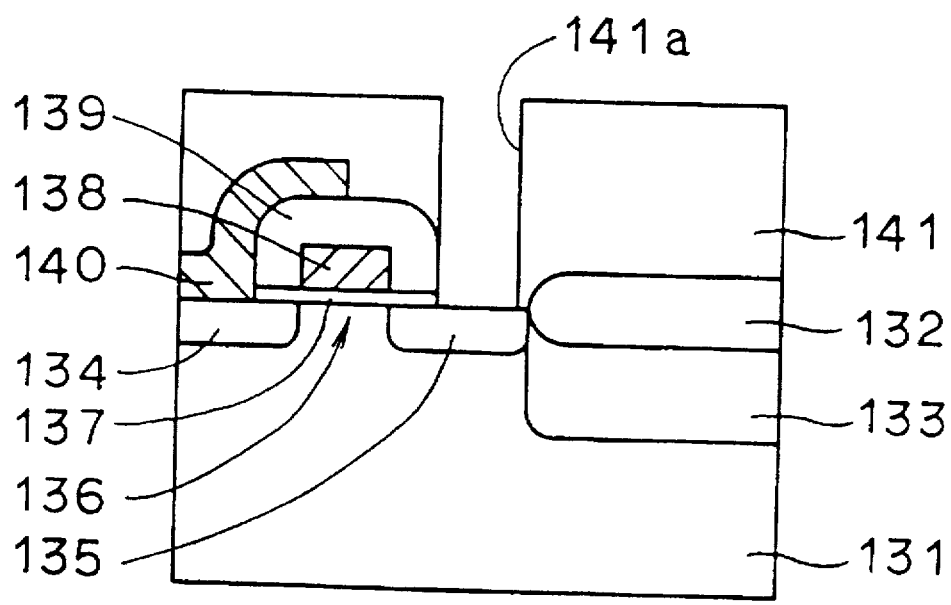
FIGS. 2–8 are sectional views of the semiconductor device of the first embodiment showing 1–7th steps of the manufacturing method thereof.

Referring to FIG. 2, isolation oxide film 132 is formed on the surface of silicon substrate 131 by LOCUS. Simultaneously, channel stopper region 133 is formed at a region beneath isolation oxide film 132.

Then, gate electrode 138 is formed on the surface of silicon substrate 131 with gate oxide film 137 therebetween. Using gate electrode 138 as a mask, source/drain regions 134/135 are formed by implanting ions.

Then, insulation film 139 is formed so as to cover gate electrode 138. Thus, transfer gate transistor 136 is formed.

Buried bit line 140 is formed extending over insulation film 139 and in contact with source/drain region 134. Interlayer insulation film 141 is formed all over the surface of silicon substrate 131 by CVD so as to cover buried bit line 140 and transfer gate transistor 136.

Then, a photoresist having a predetermined pattern is formed all over the surface of interlayer insulation film 141. Using this photoresist pattern, an etching process is carried out to form contact hole 141a communicating with source/drain region 135.

Figure 3:
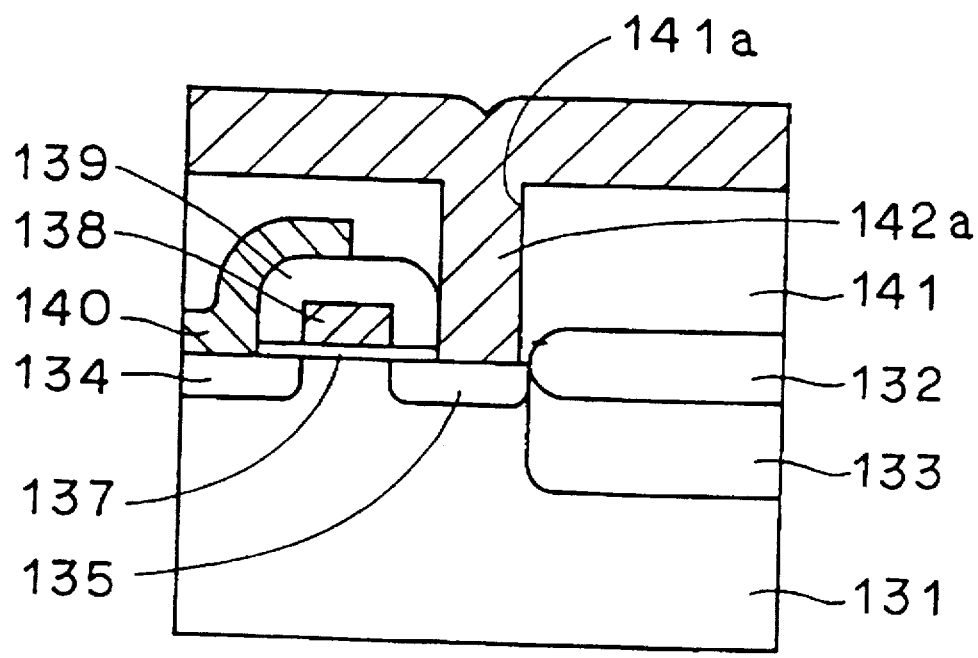

Referring to FIG. 3, doped polycrystalline silicon film 142a, for example, is deposited to a predetermined thickness on interlayer insulation film 141, filling contact hole 141a.

Figure 4:
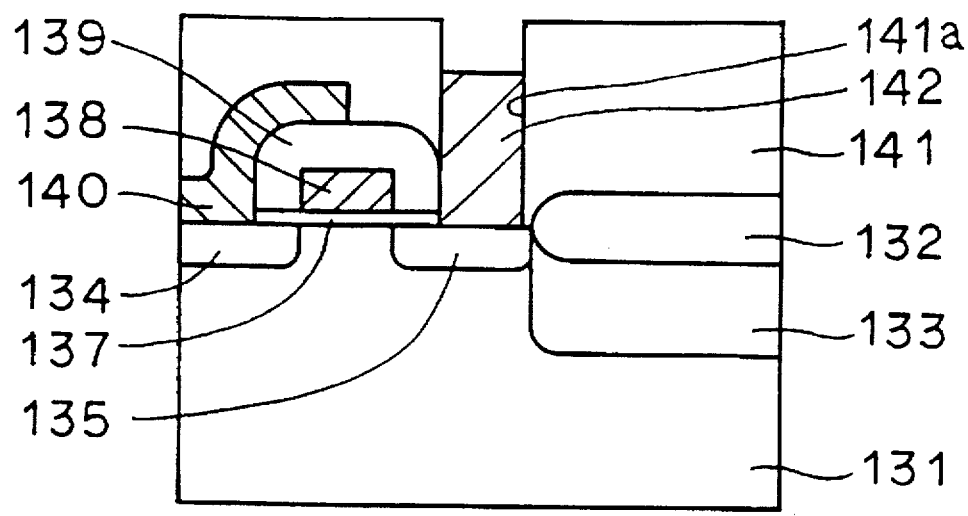

Referring to FIG. 4, doped polysilicon film 142a is etched back until the surface of interlayer insulation film 141 is exposed. An overetching process of approximately 20–30% of the film thickness of doped polysilicon film 142a is carried out to completely remove etching residues of other portions not shown on the surface of interlayer insulation film 141.

This results in buried conductive layer 142 in contact hole 141a.

Figure 5:
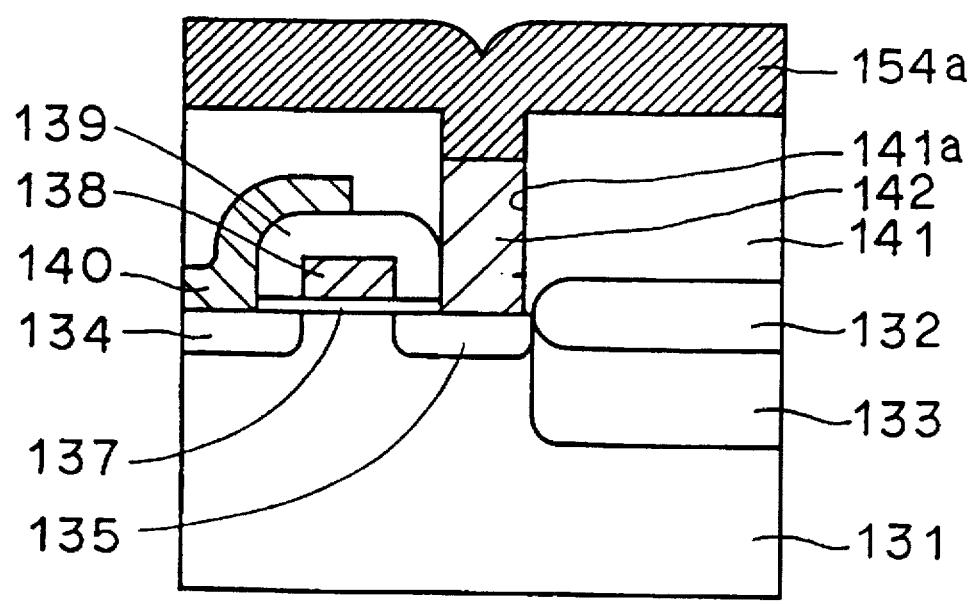

Referring to FIG. 5, an SiO$_2$ film 154a is formed to a thickness of 800–1200 Å all over the surface of interlayer insulation film 141.

Figure 6:
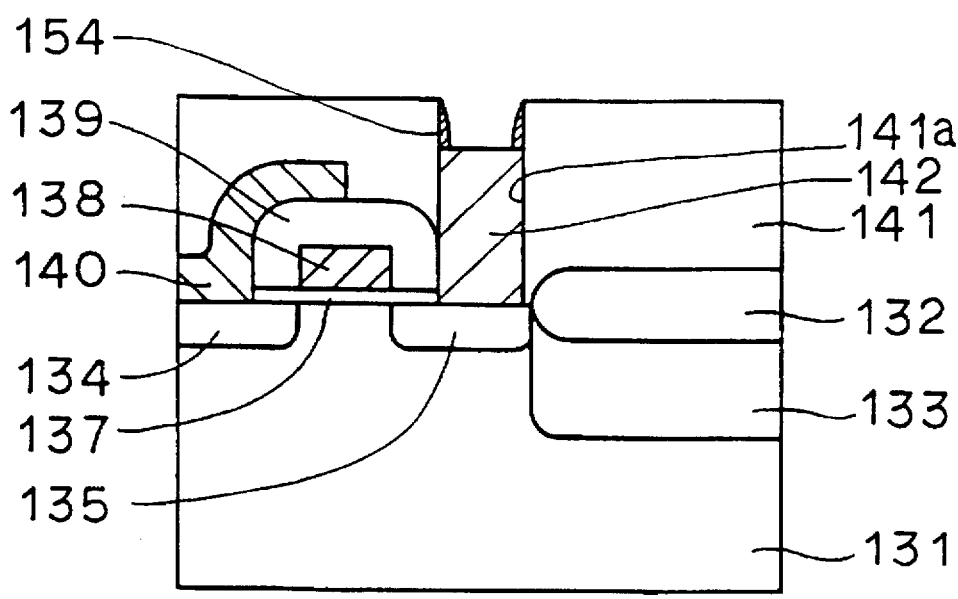

Referring to FIG. 6, SiO$_2$ film 154a is subjected to a dry etching anisotropically to form sidewall spacer 145 at the sidewall of contact hole 141a in the recess defined by the sidewall of contact hole 141a and buried conductive layer 142.

The present embodiment is not limited to the present embodiment in which buried conductive layer 142 employs a doped polysilicon film and sidewall spacer 154 employs an SiO$_2$ film. Tungsten and titanium nitride may be used for the buried conductive layer.

Figure 7:
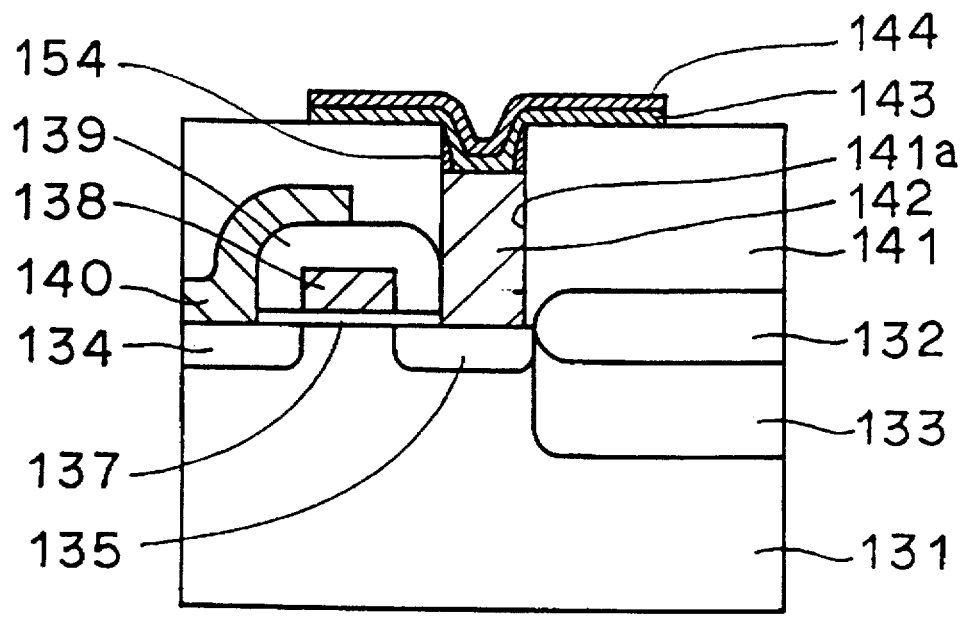

Referring to FIG. 7, barrier layer 143 of Ti/TiN/Ti is formed by a sputtering method on the surface of interlayer insulation film 141 and contact hole 141a. Then lower electrode layer 144 of platinum is formed thereon, followed by a patterning step of a predetermined configuration.

By providing sidewall spacer 154, the step coverage of lower electrode layer 144 is improved in film growth. Therefore, lower electrode layer 144 is not reduced in film thickness as in a conventional case.

Figure 8:
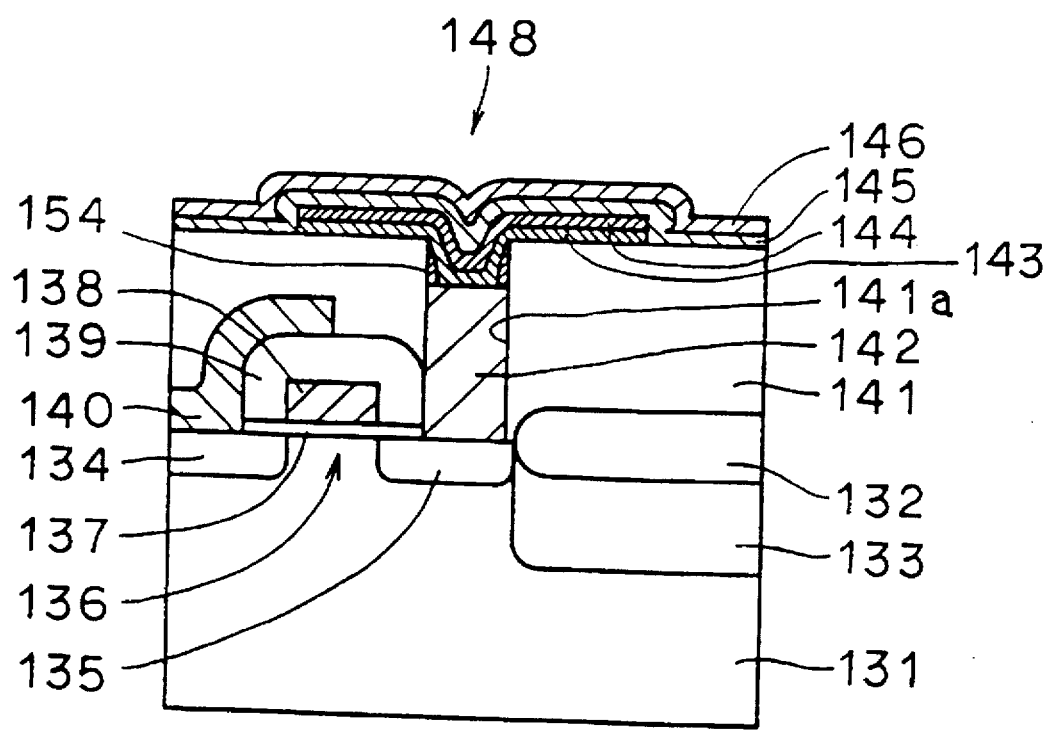

Referring to FIG. 8, high dielectric film 145 of a high dielectric constant material such as PZT is formed by a sputtering method to cover lower electrode layer 144.

On high dielectric film 145, upper electrode layer 146 of, for example, platinum, is formed by sputtering. Thus, a capacitor 148 is formed including lower electrode layer 144, high dielectric 145 and upper electrode layer 146.

By depositing insulation film 147 to cover capacitor 148, the semiconductor device shown in FIG. 1 is completed.

According to the first embodiment, a sidewall spacer 154 is formed at the inner wall of contact hole 141a in a recess portion defined by the sidewall of contact hole 141a and the top face of buried conductive layer 142. The film thickness of sidewall spacer 154 is gradually increased from the top face corner of interlayer insulation film 141 to buried conductive layer 142.

Therefore, there is no abrupt wall face at the recess, so that the step coverage of lower electrode layer 144 is improved. Therefore, high dielectric film 145 formed on lower electrode layer 144 is not reduced in film thickness at the stepped portion. There will be no portion between lower and upper electrode layers 144 and 146 that is reduced in thickness as in a conventional case when upper electrode layer 146 is formed on high dielectric film 145. Thus, breakdown voltage and anti-leak characteristics of a capacitor are not degraded.

A second embodiment of the present invention will be described hereinafter with reference to the drawings.

Figure 9:
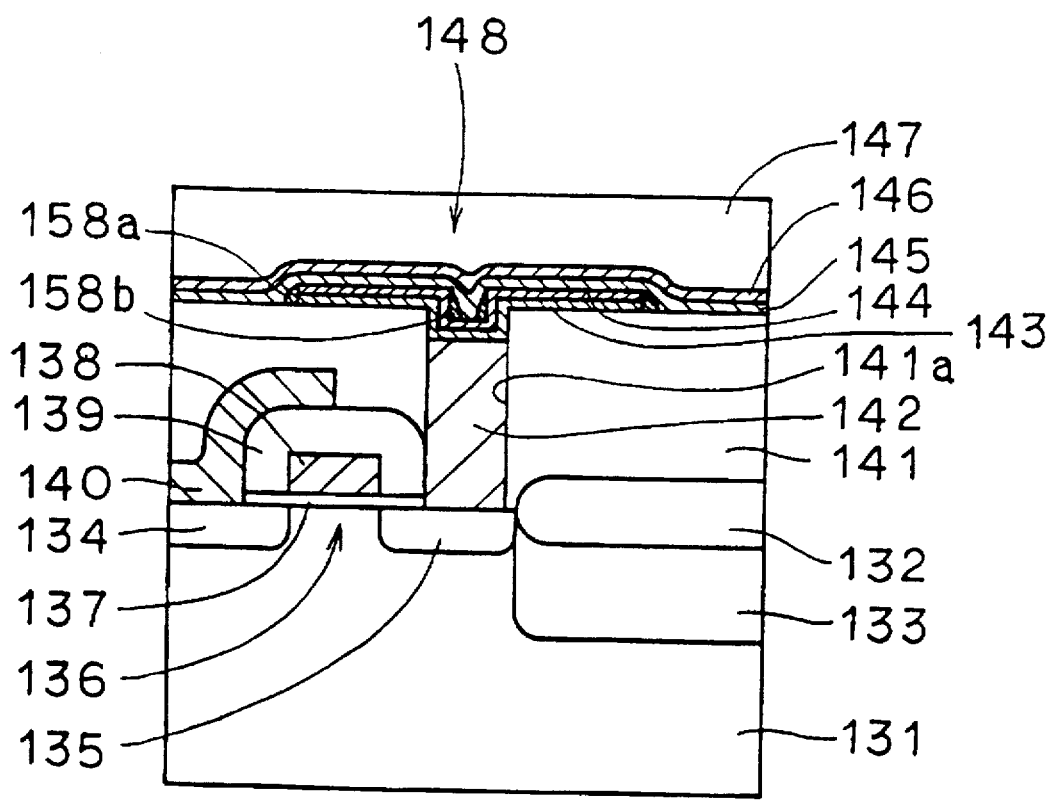
FIG. 9 is a sectional structural view of a semiconductor device according to a second embodiment of the present invention.

FIG. 9 is a sectional view schematically showing a semiconductor device of the second embodiment. The structures of transfer gate transistor 136, contact hole 141a, and buried conductive layer 142 of the second embodiment are similar to those of the first embodiment shown in FIG. 1, and their description will not be repeated.

Referring to FIG. 9, capacitor 148 is formed to be electrically connected to source/drain region 135 via buried conductive layer 142.

Capacitor 148 includes lower electrode layer 144, high dielectric film 145, and upper electrode layer 146. High dielectric film 145 of capacitor 148 employs a high dielectric constant material such as PZT. Therefore, a platinum layer is used for lower electrode layer 144.

Lower electrode layer 144 is formed to be electrically connected to buried conductive layer 142 via barrier layer 143, and extends over the interlayer insulation film 141.

At the edge face portion of lower electrode layer 144, a first sidewall spacer 158a is provided wherein the film thickness gradually increases towards interlayer insulation film 141 from the top face corner of lower electrode layer 144.

Furthermore, a second sidewall spacer 158b is formed on lower electrode layer 144 in a recess defined by the sidewall of contact hole 141a and the top face of buried conductive layer 142. The film thickness of second sidewall spacer 158b increases gradually towards lower electrode layer 144 located on buried conductive layer 142 from the top face corner of lower electrode layer 144 located on interlayer insulation film 141.

High dielectric film 145 is formed so as to cover lower electrode layer 144, first sidewall spacer 158a, and second sidewall spacer 158b. Upper electrode layer 146 is formed to cover lower electrode layer 144 with high dielectric film 145 therebetween.

Upper electrode layer 146 is formed of platinum, doped polycrystalline silicon, or the like. Insulation film 147 is formed to cover the surface of capacitor 148.

A method of manufacturing the above semiconductor device will be described hereinafter with reference to FIGS. 10–16 sequentially showing manufacturing steps of the semiconductor device of the second embodiment.

The process up to the deposition of interlayer insulation film 141 is similar to that of the first embodiment, and their description will not be repeated.

Figure 10:
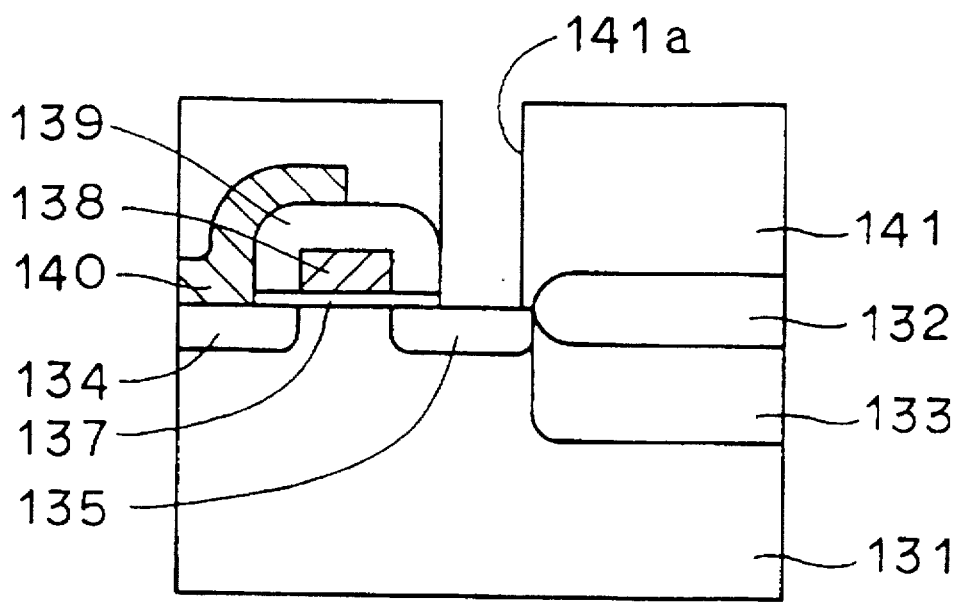
FIGS. 10–16 are sectional views of a semiconductor device of the second embodiment showing 1–7th steps of the manufacturing method thereof.
Figure 11:
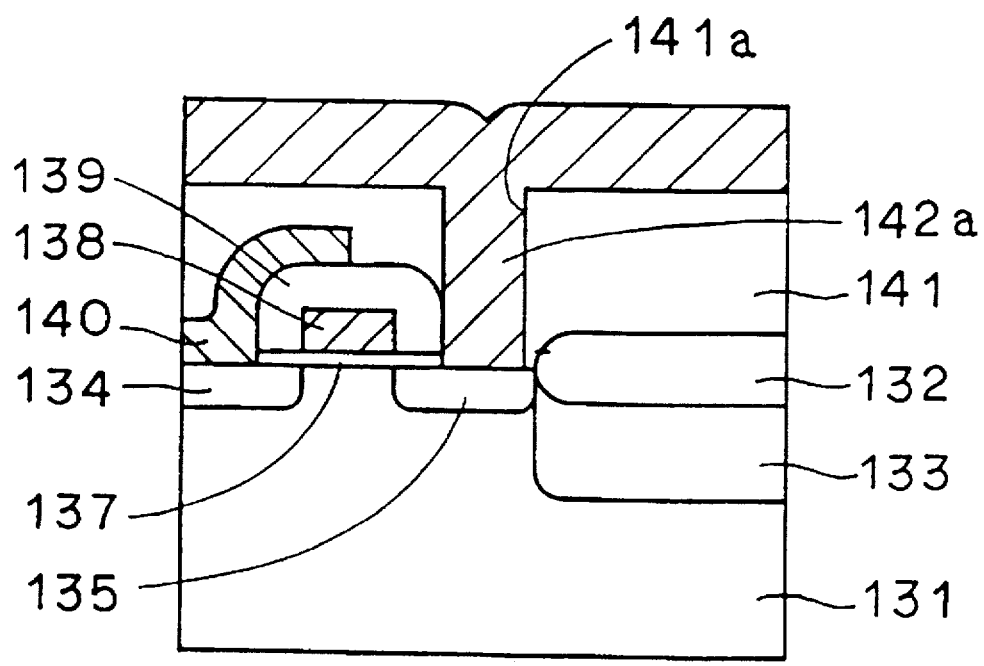

Referring to FIG. 10, a photoresist having a predetermined pattern is formed all over the surface of interlayer insulation film 141. Using this photoresist pattern, an etching step is carried out to form contact hole 141a communicating with source/drain region 135.

Then, doped polysilicon film 142a is deposited all over the surface of interlayer insulation film 141 until contact hole 141a is filled.

Figure 12:
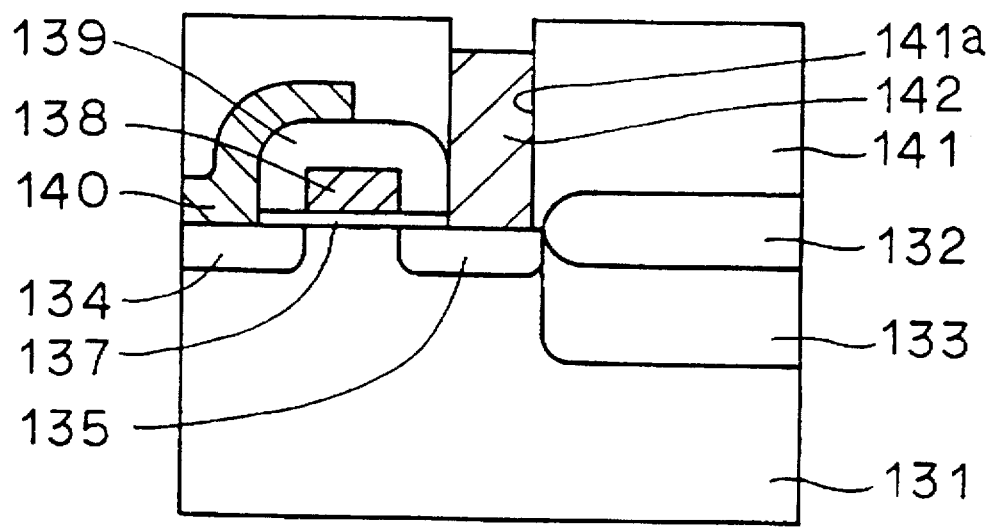

Referring to FIG. 12, doped polysilicon film 142a is etched back until the surface of interlayer insulation film 141 is exposed. Similar to the first embodiment, an overetching step of approximately 20–30% the film thickness of doped polysilicon film 142a is carried out to completely remove etching residues on the surface of interlayer insulation film 141.

Figure 13:
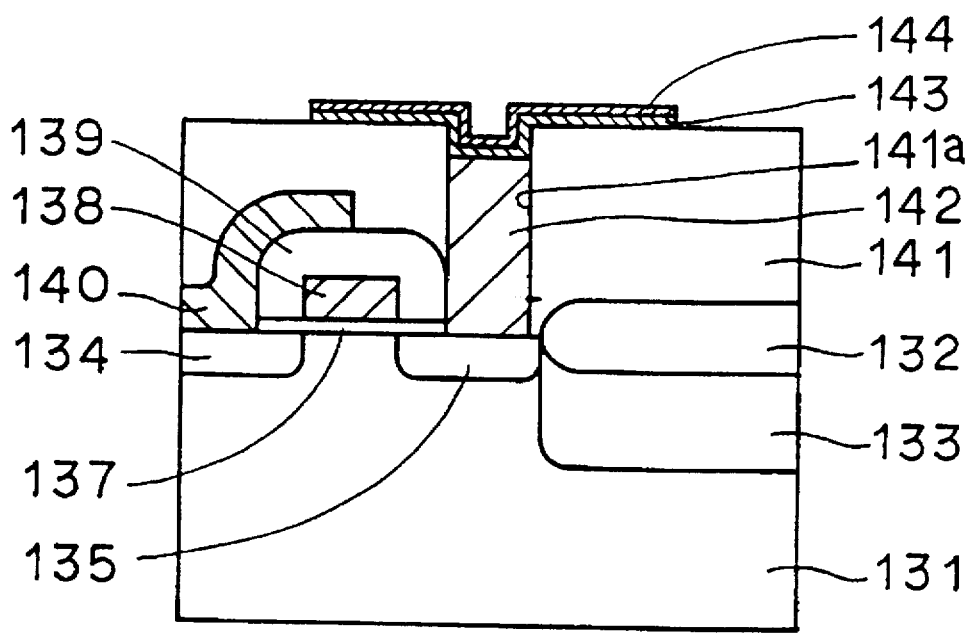

Referring to FIG. 13, barrier layer 143 of Ti/TiN/Ti and lower electrode layer 144 of platinum are sequentially layered by a sputtering method on the surface of interlayer insulation film 141 so as to come into contact with the surface of buried conductive layer 142, followed by a patterning process of a predetermined configuration.

Figure 14:
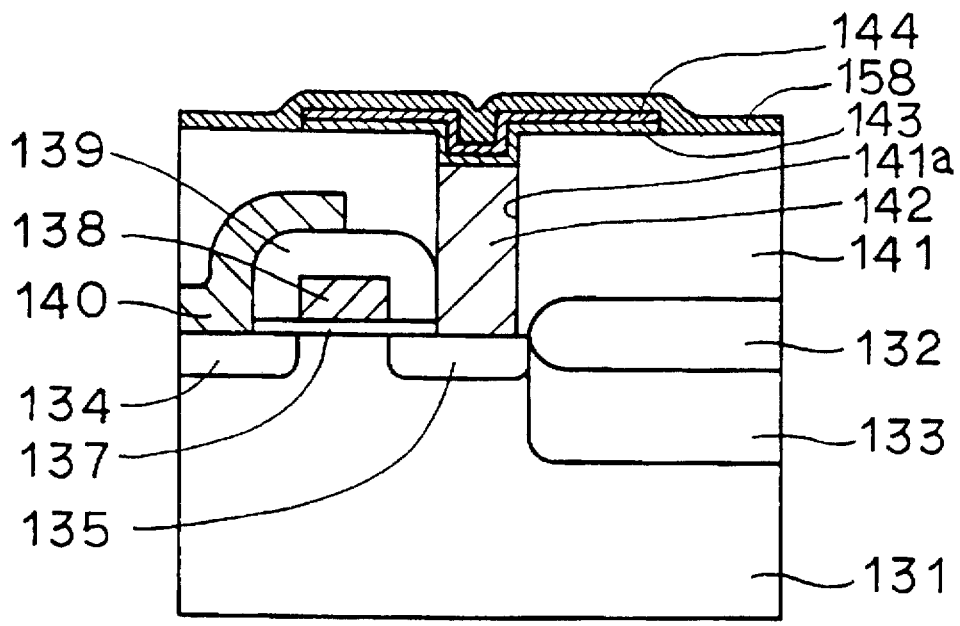

Referring to FIG. 14, SiO₂ film 158 of approximately 800–1200 Å in thickness is formed so as to cover lower electrode layer 144.

Figure 15:
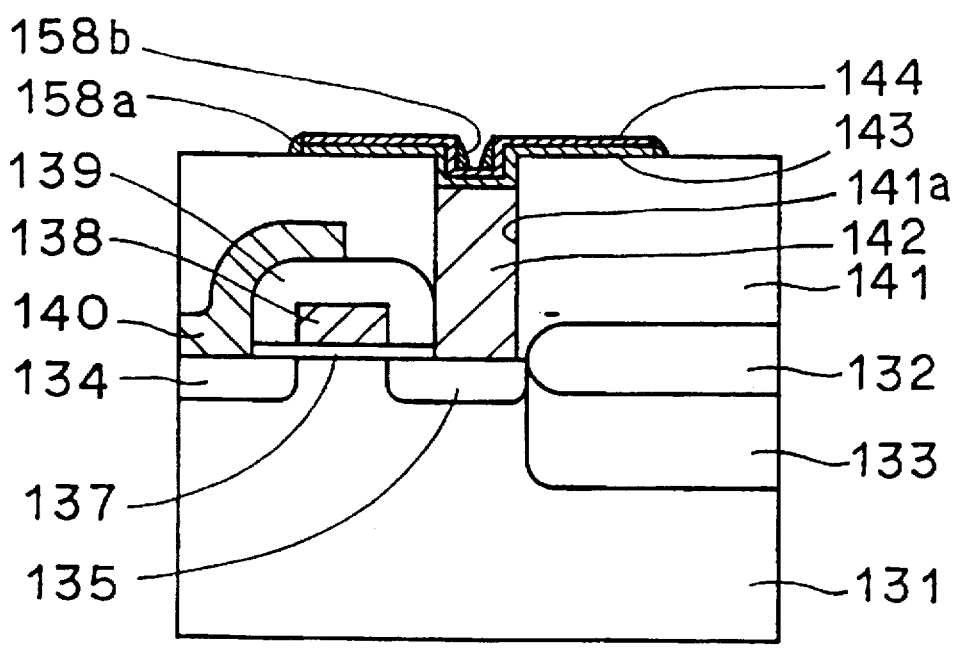

Referring to FIG. 15, SiO₂ film 158 is etched anisotropically to result in a first sidewall spacer 158a and a second sidewall spacer 158b at the edge face portion of lower electrode layer 144 and the recess portion of lower electrode layer 144, respectively.

Figure 16:
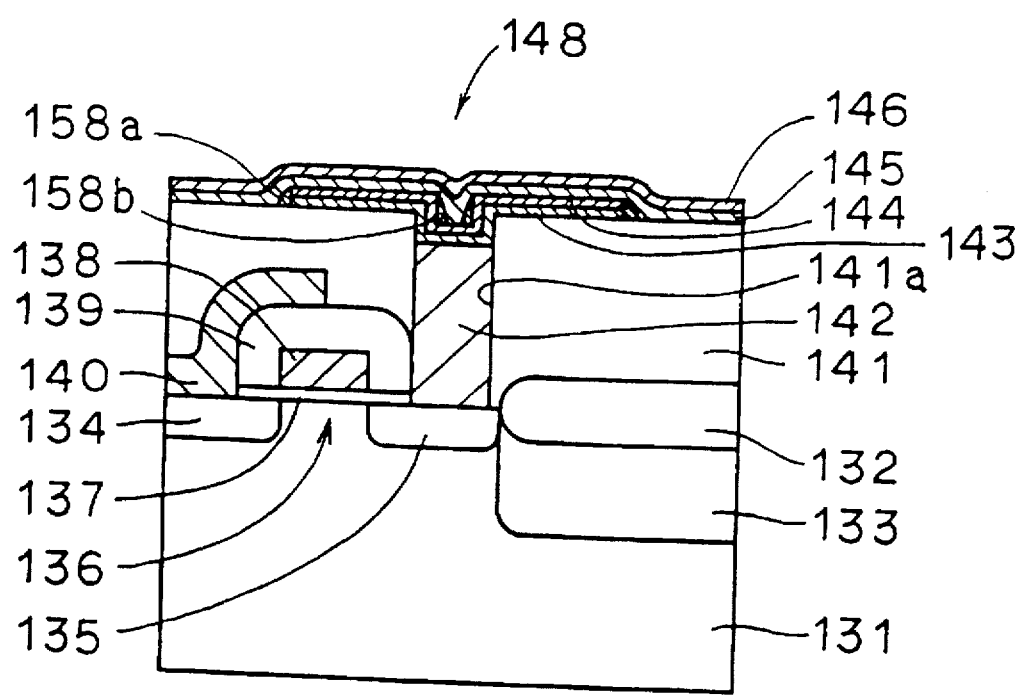

Referring to FIG. 16, high dielectric film 145 of a high dielectric constant material such as PZT is formed by a sputtering method so as to cover lower electrode layer 144 and first and second sidewall spacers 158a and 158b. The film thickness of high dielectric film 145 is not reduced at the stepped portions of lower electrode layer 144 since first and second sidewall spacers 158a and 158b are provided.

Then, upper electrode layer 146 of platinum, for example, is formed on high dielectric film 145 by a sputtering method. As a result, capacitor 148 of lower electrode layer 144, high dielectric film 145, and upper electrode layer 146 is formed. Then, insulation film 147 is deposited so as to cover capacitor 148. Thus, the semiconductor device of the second embodiment shown in FIG. 9 is completed.

According to the second embodiment, a second sidewall spacer 158b gradually increased in film thickness towards lower electrode layer 144 on buried conductive layer 142 from the top face corner of lower electrode layer 144 on interlayer insulation film 141 is provided on upper electrode layer 144 in the recess portion defined by the sidewall of contact hole 141a and the surface of buried conductive layer 142.

Therefore, an abrupt stepped portion is not generated at the surface of lower electrode layer 144 in the recess portion. High dielectric film 145 formed on lower electrode layer 144 is not reduced in film thickness at the stepped portion.

Therefore, the portion between lower electrode layer 144 and upper electrode layer 146 is not reduced in thickness as in a conventional case when upper electrode layer 146 is formed on high dielectric film 145. Thus, breakdown characteristics and anti-leak characteristics of a capacitor are not degraded.

A first sidewall spacer 158a having the film thickness gradually increased towards interlayer insulation film 142 from the top face corner of lower electrode layer 144 is provided also at the edge face portion of lower electrode layer 144.

Therefore, the stepped portion at the edge face portion of lower electrode layer 144 is reduced. High dielectric film 145 formed on lower electrode layer 144 is not reduced in film thickness at this stepped portion.

There will be no portion between the lower electrode layer 144 and upper electrode layer 146 that is reduced in thickness as in a conventional case when upper electrode layer 146 is formed on high dielectric film 145. Thus, breakdown voltage and anti-leak characteristics of a capacitor are not degraded.

Figure 17:
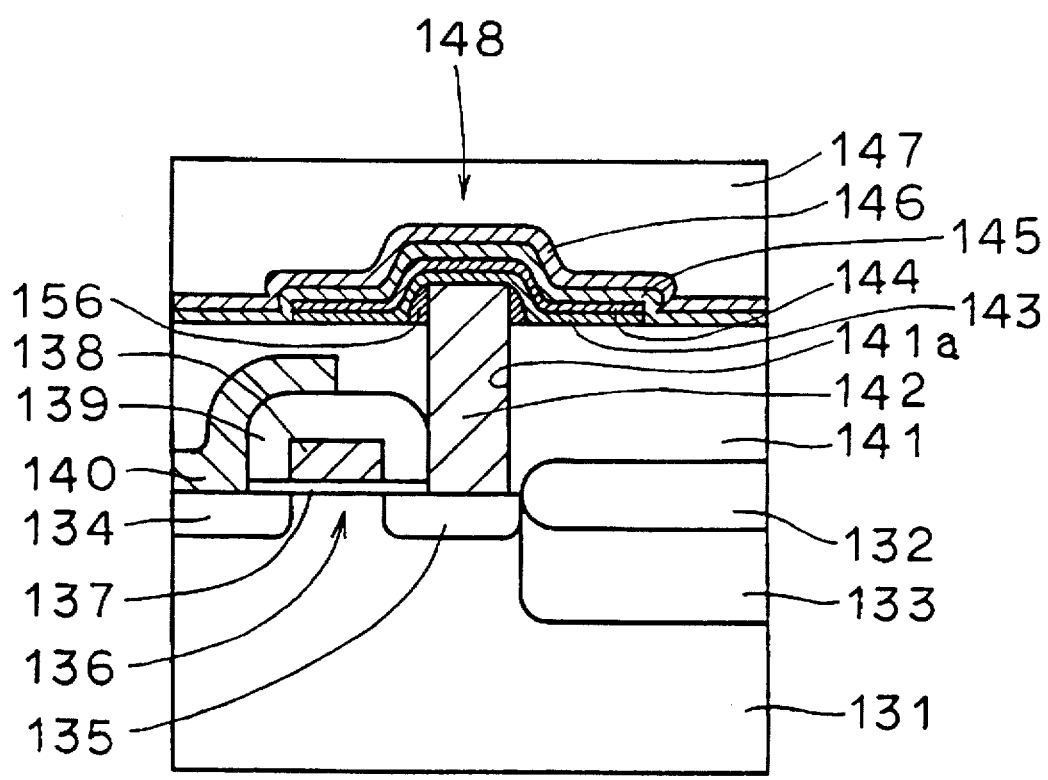
FIG. 17 is a sectional structural view of a semiconductor device according to a third embodiment of the present invention.

A third embodiment of the present invention will be described hereinafter with reference to FIG. 17 schematically showing a structure of a semiconductor device thereof. The structure of transfer gate transistor 136 of the third embodiment is similar to that of the first embodiment shown in FIG. 1, and their description will not be repeated.

Referring to FIG. 17, a buried conductive layer 142 is formed, filling contact hole 141a and in contact with the surface of a source/drain region 135. The top face of buried conductive layer 142 is higher in level than the top face of interlayer insulation film 141.

A sidewall spacer 156 is formed at the sidewall of buried conductive layer 142. The film thickness of sidewall spacer 156 generally increases towards the surface of interlayer insulation film 141 from the top face corner of buried conductive layer 142.

Capacitor 148 is formed to be electrically connected to source/drain region 135 through buried conductive layer 142. Capacitor 148 includes lower electrode layer 144, high dielectric film 145, and upper electrode layer 146.

Similar to the above described first and second embodiments, high dielectric film 145 of capacitor 148 employs a high dielectric constant material such as PZT. Therefore, a platinum (Pt) layer is used for lower electrode layer 144.

Lower electrode layer 144 is formed to be electrically connected with buried conductive layer 142 via barrier layer 143, and extends over interlayer insulation film 141.

Similar to the first and second embodiments, barrier layer 143 serves to prevent impurities of buried conductive layer 142 from diffusing into lower electrode layer 144.

Then, a high dielectric film 145 of a high dielectric constant material is formed so as to cover the surface of lower electrode layer 144. An upper electrode layer 146 is formed to cover lower electrode layer 144 with high dielectric film 145 thereunder. Therefore, upper electrode layer 146 is formed of platinum or doped polysilicon.

An insulation film 147 is formed so as to cover capacitor 148.

A method of manufacturing the above semiconductor device will be described hereinafter.

FIGS. 18–28 are sectional views of the semiconductor device of the third embodiment showing sequential manufacturing steps thereof. The manufacturing process up to deposition of interlayer insulation film 141 is similar to that of the first embodiment, and their description will not be repeated.

Figure 18:
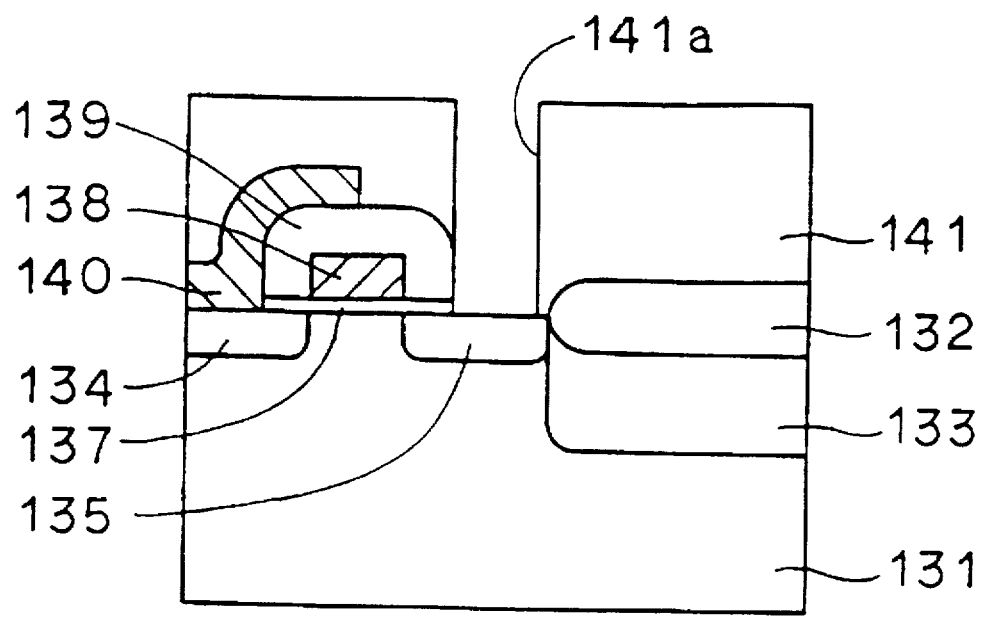
FIGS. 18–25 are sectional views of the semiconductor device of third embodiment showing 1–8th steps of the manufacturing method thereof.

Referring to FIG. 18, a photoresist of a predetermined pattern is formed all over the surface of interlayer insulation film 141. Using this photoresist pattern, an etching step is carried out to form contact hole 141a communicating with source/drain region 135.

Figure 19:
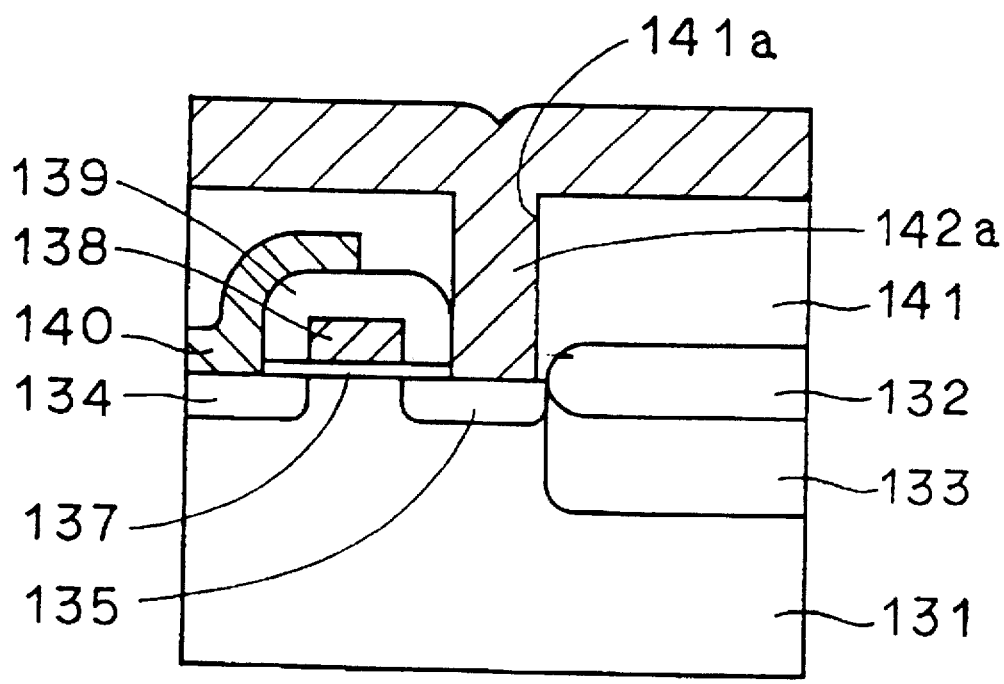

Referring to FIG. 19, doped polysilicon film 142a is deposited all over the surface of interlayer insulation film 141 so as to fill the interior of contact hole 141a.

Figure 20:
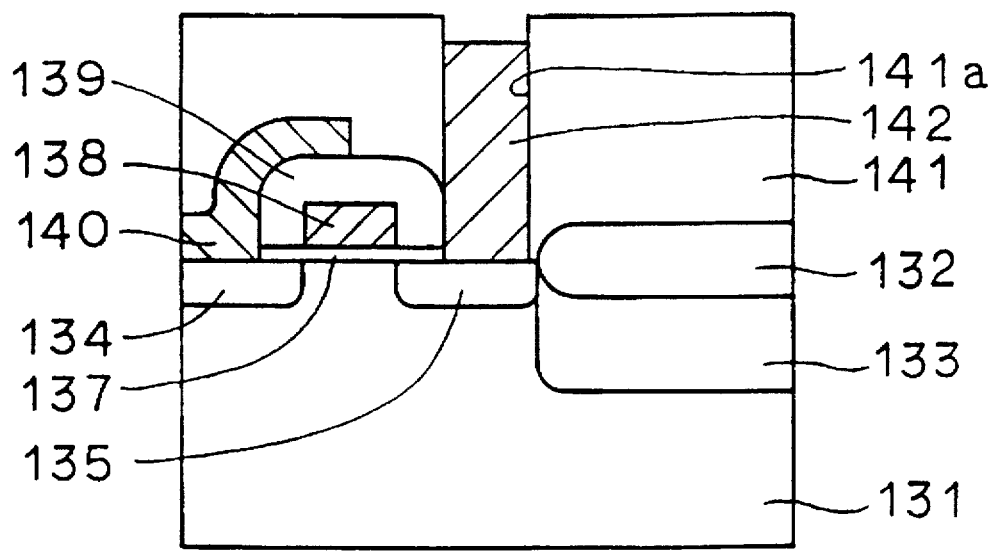

Referring to FIG. 20, doped polysilicon film 142a is etched back until the surface of interlayer insulation film 141 is exposed. An overetching of approximately 20–30% of the film thickness of doped polysilicon film 142a is carried out to completely remove the etching stepped-portion on the surface of interlayer insulation film 141.

Figure 21:
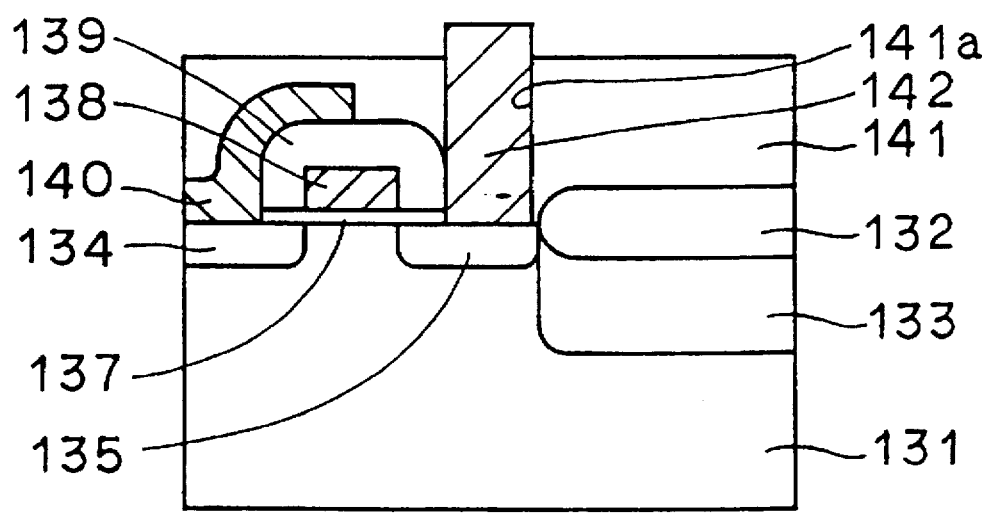

Referring to FIG. 21, interlayer insulation film is dry-etched anisotropically so that the top face of buried conductive layer 142 is exposed by approximately 800–1000 Å.

Figure 22:
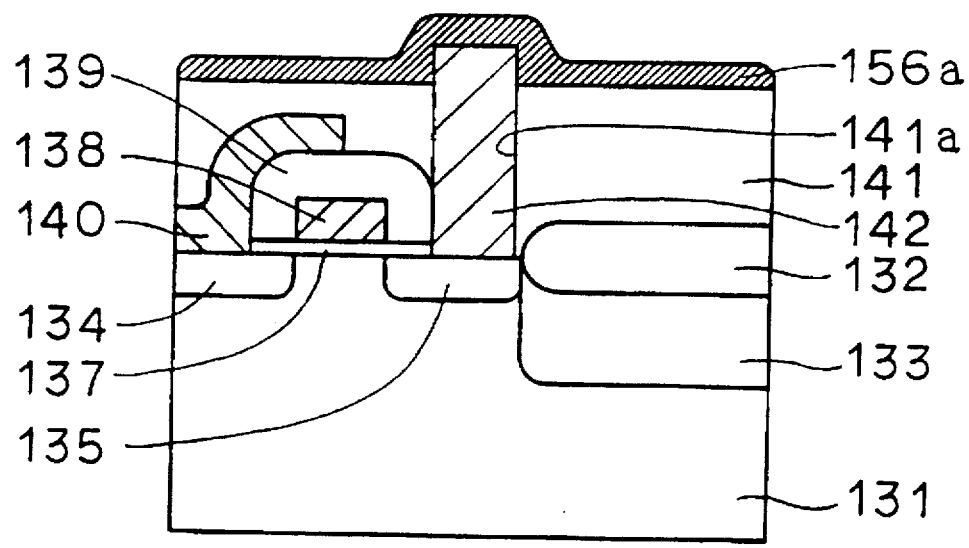

Referring to FIG. 22, SiO$_2$ film 156a of approximately 800–1200 Å in thickness is deposited by CVD on the surface of buried conductive layer 142 and interlayer insulation film 141.

Figure 23:
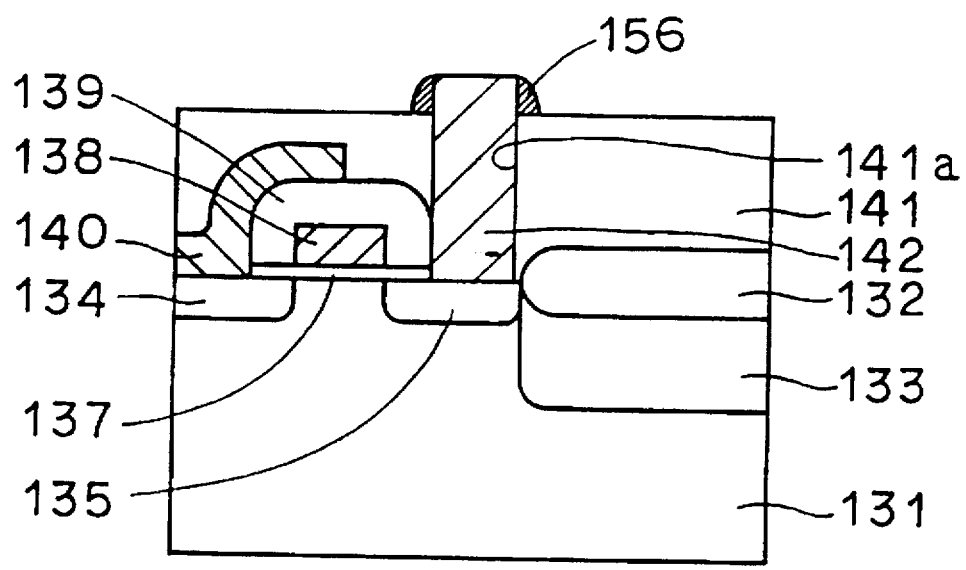

Referring to FIG. 23, anisotropic dry etching is applied on SiO$_2$ film 156 to form a sidewall spacer 156 at the sidewall of buried conductive layer 142.

Figure 24:
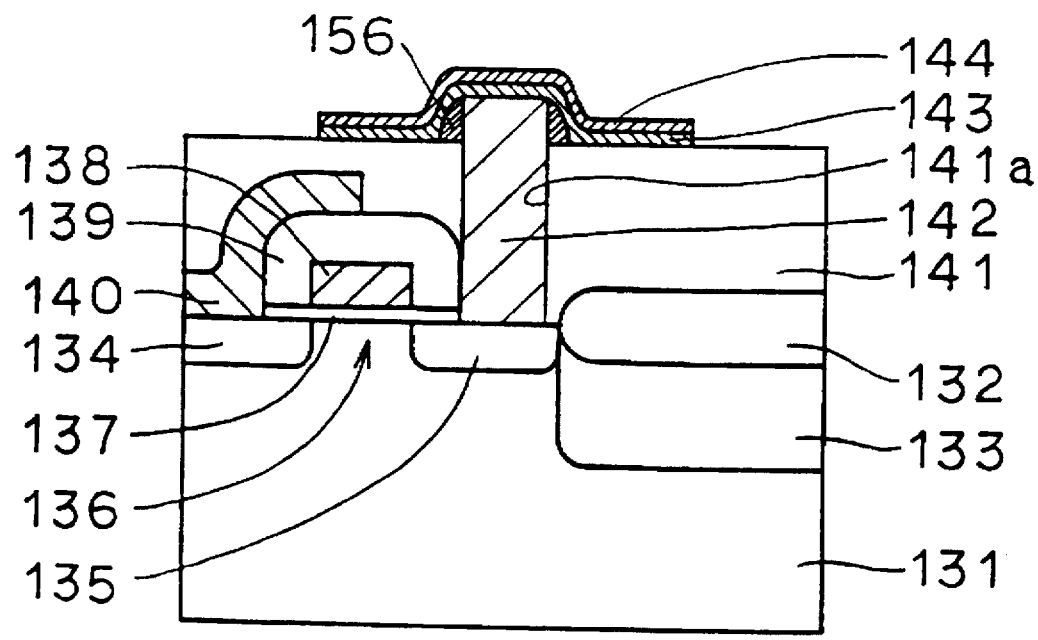

Referring to FIG. 24, barrier layer 143 of Ti/TiN/Ti is formed by a sputtering method on sidewall spacer 156, buried conductive layer 142, and interlayer insulation film 141. Then, lower electrode layer 144 of platinum is formed thereon, which are patterned to a predetermined configuration.

Figure 25:
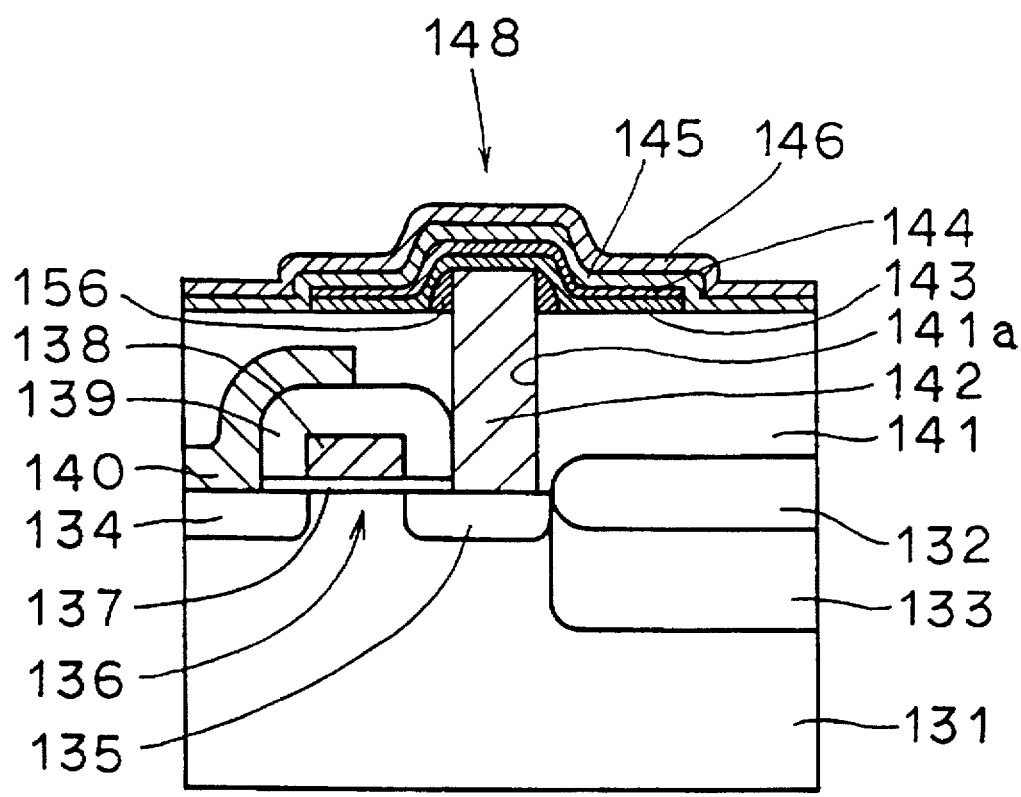

Referring to FIG. 25, high dielectric film 145 of a high dielectric constant material such as PZT is formed by sputtering so as to cover the surface of lower electrode layer 144.

Then, upper electrode layer 146 of platinum is formed by a sputtering method on high dielectric film 145. Thus, capacitor 148 of lower electrode layer 144, high dielectric film 145, and upper electrode layer 146 is formed.

Then, insulation film 147 is deposited so as to cover capacitor 148. As a result, the semiconductor device shown in FIG. 17 is completed.

According to the semiconductor device of the third embodiment, there are provided a buried conductive layer 142 having a top face higher in level than the top face of interlayer insulation film 141, and a sidewall spacer 156 formed at the sidewall of buried conductive layer 142, having a film thickness gradually increased towards the surface of interlayer insulation film 141 from the top face corner of buried conductive layer 142.

There is no stepped portion in lower electrode layer 144 as in a conventional case when lower electrode layer 144 is formed on buried conductive layer 142. High dielectric film 145 formed on lower electrode layer 144 is not reduced in film thickness at the stepped portion. There is no portion between lower electrode layer 144 and upper electrode layer 146 reduced in film thickness as in a conventional case when upper electrode layer 146 is formed on high dielectric film 145. Thus, breakdown voltage and anti-leak characteristics of a capacitor are not degraded.

Figure 26:
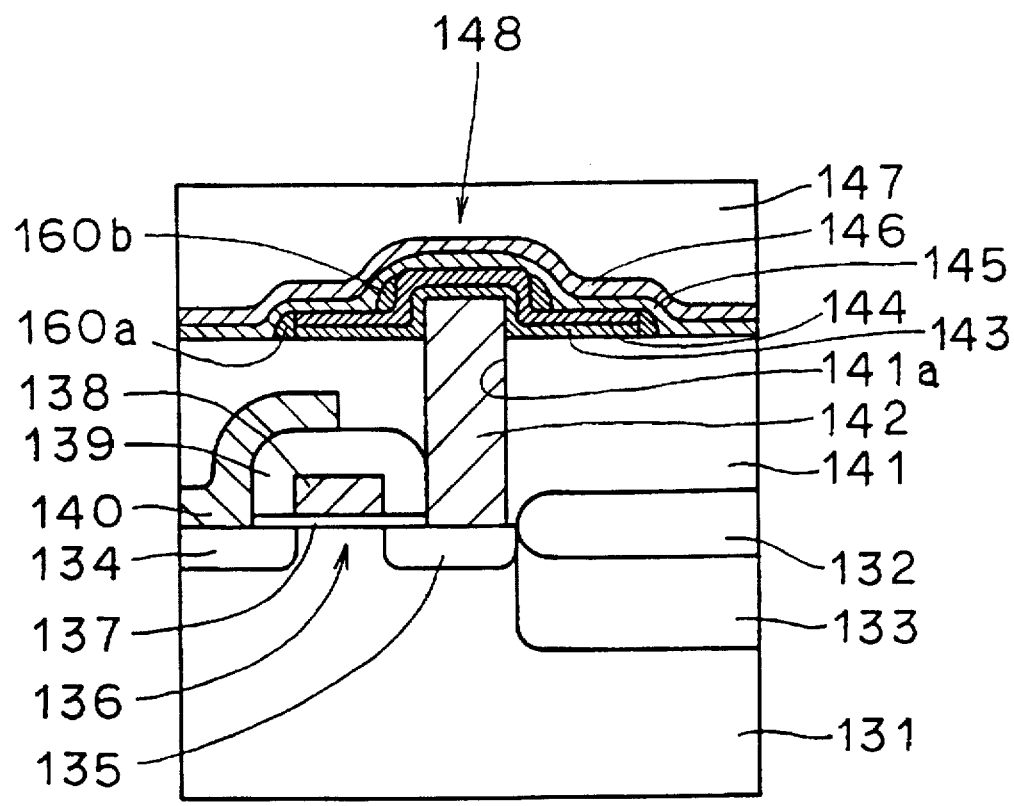
FIG. 26 is a sectional structural view of a semiconductor device according to a fourth embodiment of the present invention.

A fourth embodiment of the present invention will be described hereinafter with reference to FIG. 26 schematically showing a sectional view of a semiconductor device of the fourth embodiment.

Because the structure of transfer gate transistor 136 of the fourth embodiment is similar to that of the first embodiment shown in FIG. 1, their description will not be repeated.

Referring to FIG. 26, a buried conductive layer 142 is formed filling a contact hole 141a, and in contact with source/drain region 135. The top face of buried conductive layer 142 is higher in level than the top face of interlayer insulation film 141.

A capacitor 148 is formed to be electrically connected to source/drain region 135 through buried conductive layer 142.

Capacitor 148 includes a lower electrode layer 144, a high dielectric film 145, and an upper electrode layer 146. High dielectric film 145 of capacitor 148 employs a dielectric constant material such as PZT. Therefore, lower electrode layer 144 employs a platinum (Pt) layer.

Lower electrode layer 144 is formed to be electrically connected to buried conductive layer 142 via barrier layer 142, and so as to extend over the surface of interlayer insulation film 141. Barrier layer 143 serves to prevent impurities in buried conductive layer 142 from diffusing into lower electrode layer 144.

At the edge face portion of lower electrode layer 144, a first sidewall spacer 160a is formed having a film thickness gradually increasing towards the surface of interlayer insulation film 141 from the top face corner of lower electrode layer 144.

In a recess portion of lower electrode layer 144 formed along interlayer insulation film 141, a second sidewall spacer 160b is provided having a film thickness gradually increasing towards the surface of lower electrode layer 144 located on interlayer insulation film 141 from the top face corner of lower electrode layer 144 located on buried conductive layer 141.

The provision of first and second sidewall spacers 160a and 160b yields the advantage of reducing the abrupt stepped portion formed in lower electrode layer 144.

A high dielectric film 145 of a high dielectric constant material is formed so as to cover the surface of lower electrode layer 144, and first and second sidewall spacers 160a and 160b.

An upper electrode layer 146 is formed so as to cover lower electrode layer 144 with high dielectric film 145 therebetween. Upper electrode layer 146 is formed of platinum, doped polysilicon, or the like. An insulation film 147 is formed so as to cover capacitor 148.

A method of manufacturing the above semiconductor device will be described hereinafter.

FIGS. 27–34 are sectional views of the semiconductor device of the fourth embodiment showing sequential manufacturing steps. The manufacturing process up to the deposition of interlayer insulation film 141 is similar to that of the first embodiment, and their description will not be repeated.

Figure 27:
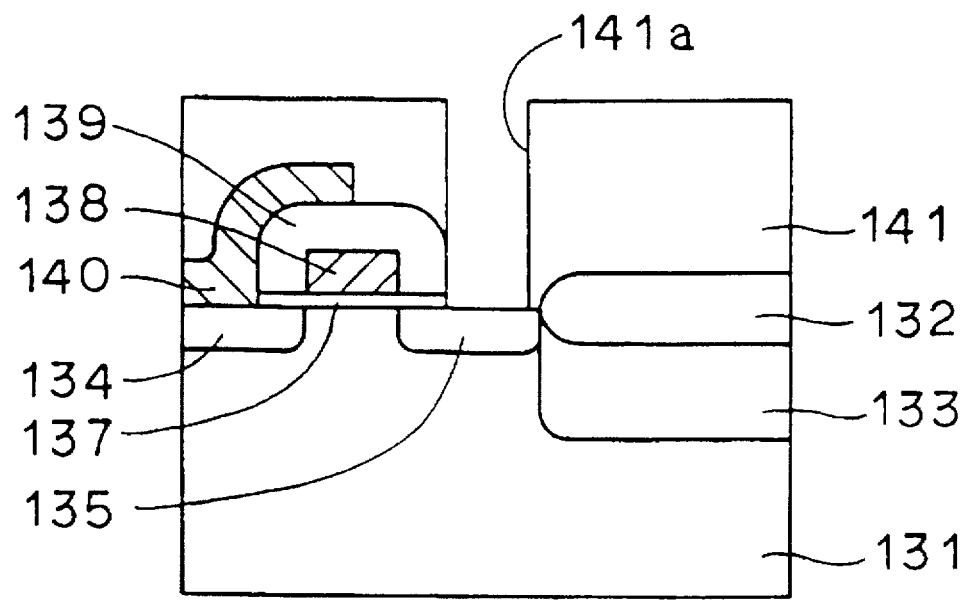
FIGS. 27–34 are sectional views of the semiconductor device of the fourth embodiment showing 1–8th steps of the manufacturing method thereof.

Referring to FIG. 27, a resist film of a predetermined pattern is formed all over the surface of interlayer insulation film 141. Using this photoresist pattern, an etching process is carried out to form contact hole 141a communicating source/drain region 135.

Figure 28:
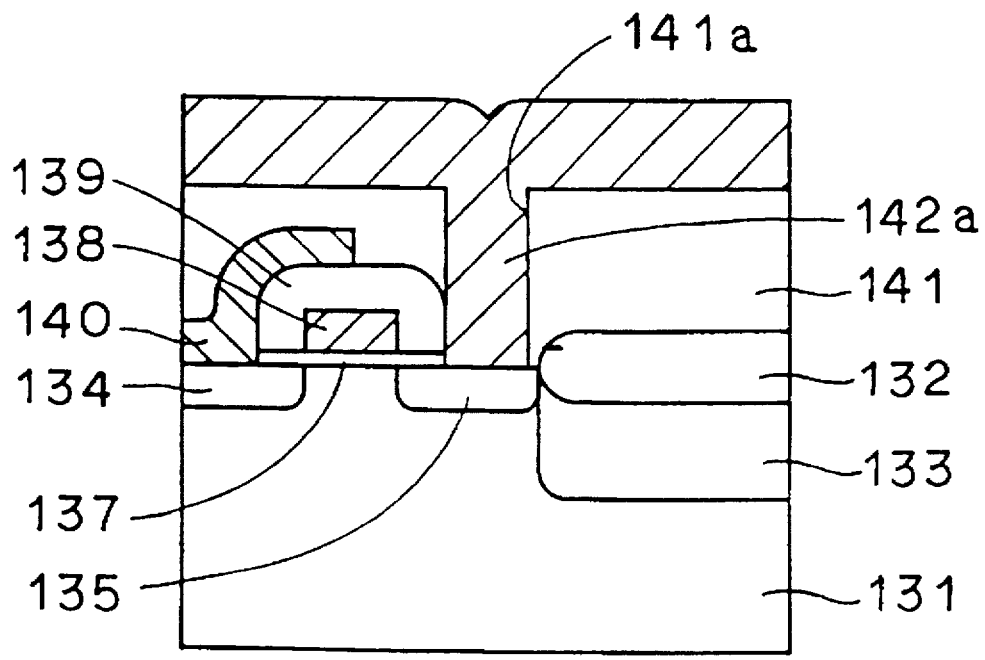

Referring to FIG. 28, doped polysilicon film 142a is deposited all over the surface of silicon 141 to fill the interior of contact hole 141a.

Figure 29:
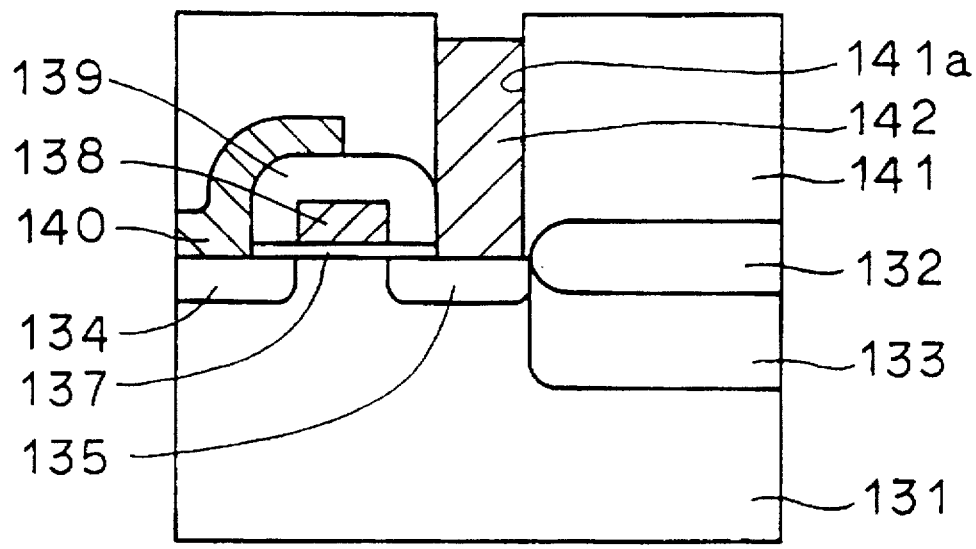

Referring to FIG. 29, doped polysilicon film 142a is etched back until the surface of interlayer insulation film 141 is exposed. An overetching of approximately 20–30% of the film thickness of doped polysilicon film 142a is carried out to completely remove etching residues on the surface of interlayer insulation film 141.

Figure 30:
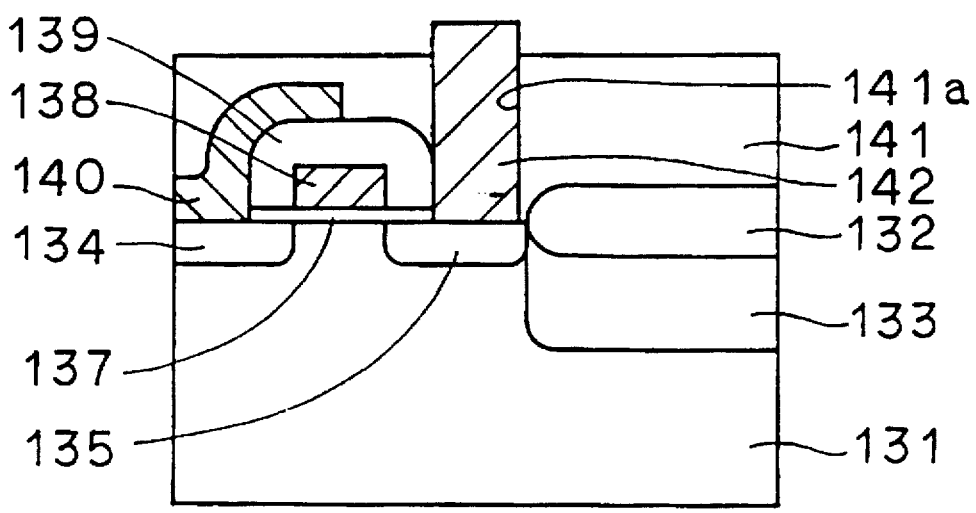

Referring to FIG. 30, anisotropic dry etching is carried out to etch only interlayer insulation film 141, whereby the top face of buried conductive layer 142 is higher in level than the top face of interlayer insulation film 141 by 800–1000 Å, similar to that of the third embodiment.

Figure 31:
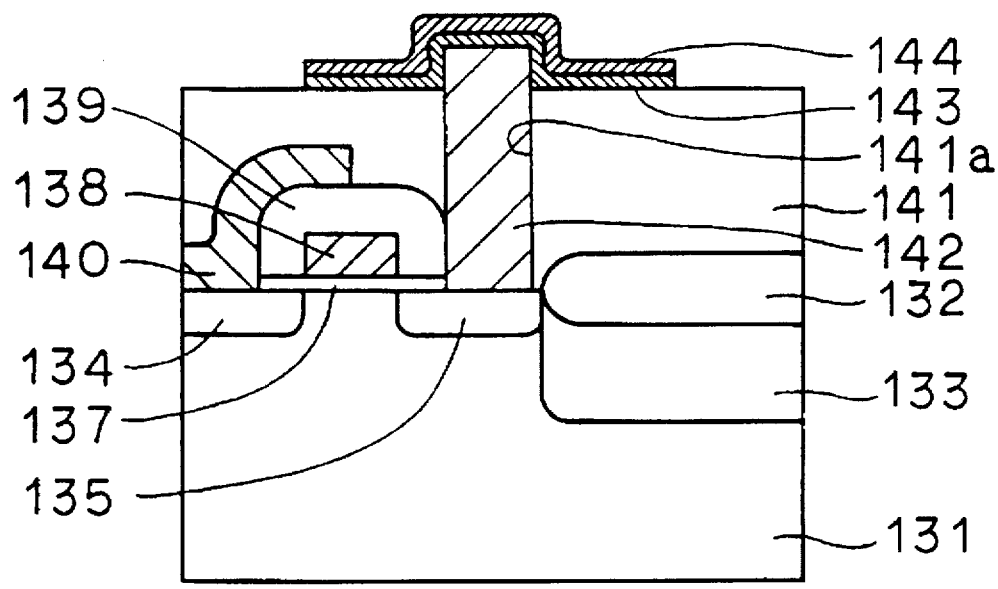

Referring to FIG. 31, barrier layer 143 of Ti/TiN/Ti and then lower electrode layer 144 of platinum are sequentially formed by sputtering to come into contact with buried conductive layer 142, to be subjected to a patterning process of a predetermined configuration.

Figure 32:
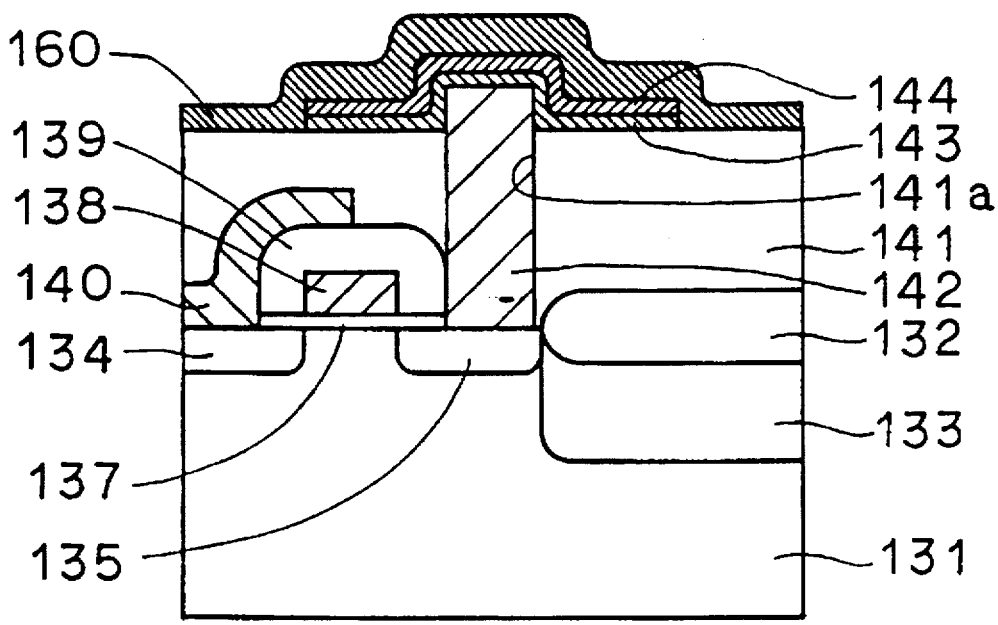

Referring to FIG. 32, $SiO_2$ film 160 is deposited by approximately 800–1200 Å in thickness all over the surface of lower electrode layer 144 and interlayer insulation film 141.

Figure 33:
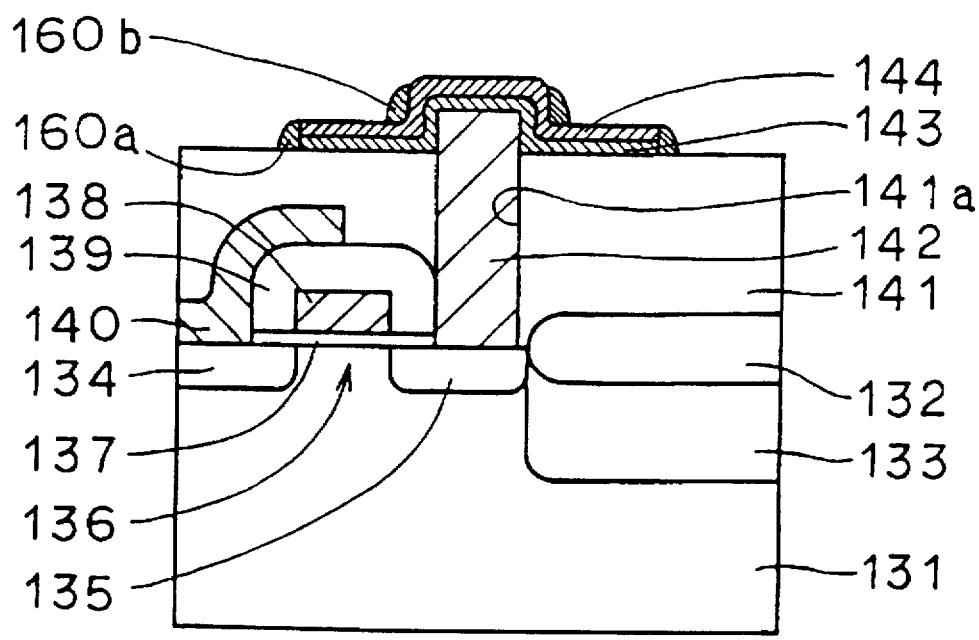

Referring to FIG. 33, $SiO_2$ film 160 is etched anisotropically, resulting in first sidewall spacer 160a at the edge face portion of lower electrode layer 144 and a second sidewall spacer in the recess portion of lower electrode layer 144. The film thickness of first sidewall spacer 160a gradually increases towards the surface of interlayer insulation film 141 from the top face corner of lower electrode layer 144. The film thickness of second sidewall spacer 160b is gradually increased towards the surface of lower electrode layer 144 on interlayer insulation film 141 from the top face corner of lower electrode layer 144 on buried conductive layer 142.

Figure 34:
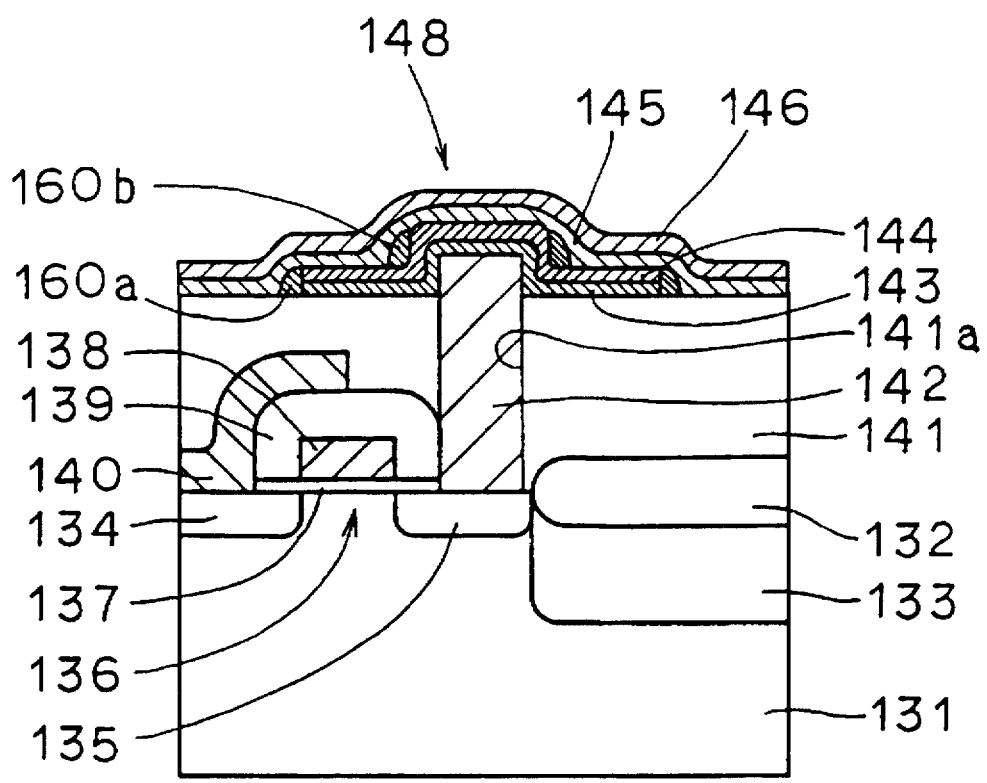

Referring to FIG. 34, high dielectric film 145 of a high dielectric constant material such as PZT is formed so as to cover lower electrode layer 144 and first and second sidewall spacers 160a and 160b by a sputtering method.

Then, upper electrode layer 146 of platinum for example, is formed on high dielectric film 145 by a sputtering method. A capacitor 148 is formed of lower electrode layer 144, high dielectric film 145, and upper electrode layer 146. Then, insulation film 147 is deposited so as to cover capacitor 148. Thus, the semiconductor device shown in FIG. 26 is completed.

According to the fourth embodiment, in the recess portion of lower electrode layer 142 formed along the surface of buried conductive layer 142, second sidewall spacer 160b is provided having film thickness gradually increasing towards the surface of lower electrode layer 144 on interlayer insulation film 141 from the top face corner of lower electrode layer 144 on buried conductive layer 142.

This provides an advantage that a stepped portion such as that in a conventional case is not generated in lower electrode layer 144. Therefore, high dielectric film 145 formed on lower electrode layer 144 is not reduced in film thickness at the stepped portion. There is no portion between lower electrode layer 144 and upper electrode layer 146 that is reduced in thickness as in a conventional case when upper electrode layer 146 is formed on high dielectric film 145. Thus, breakdown voltage and anti-leak characteristics of a capacitor are not degraded.

Furthermore, first sidewall spacer 160a having the film thickness gradually increasing towards the surface of interlayer insulation film 141 from the top face corner of lower electrode layer 144 is provided at the edge face portion of lower electrode layer 144.

Therefore, an abrupt stepped portion is not generated in lower electrode layer 144. High dielectric film 145 formed on lower electrode layer 144 is not reduced in film thickness at this stepped portion. There is no portion between lower and upper electrode layers 144 and 146 that is increased in film thickness as in a conventional case when upper electrode layer 146 is formed on high dielectric film 145. Thus, breakdown voltage and anti-leak characteristics of a capacitor are not degraded.

Figure 35:
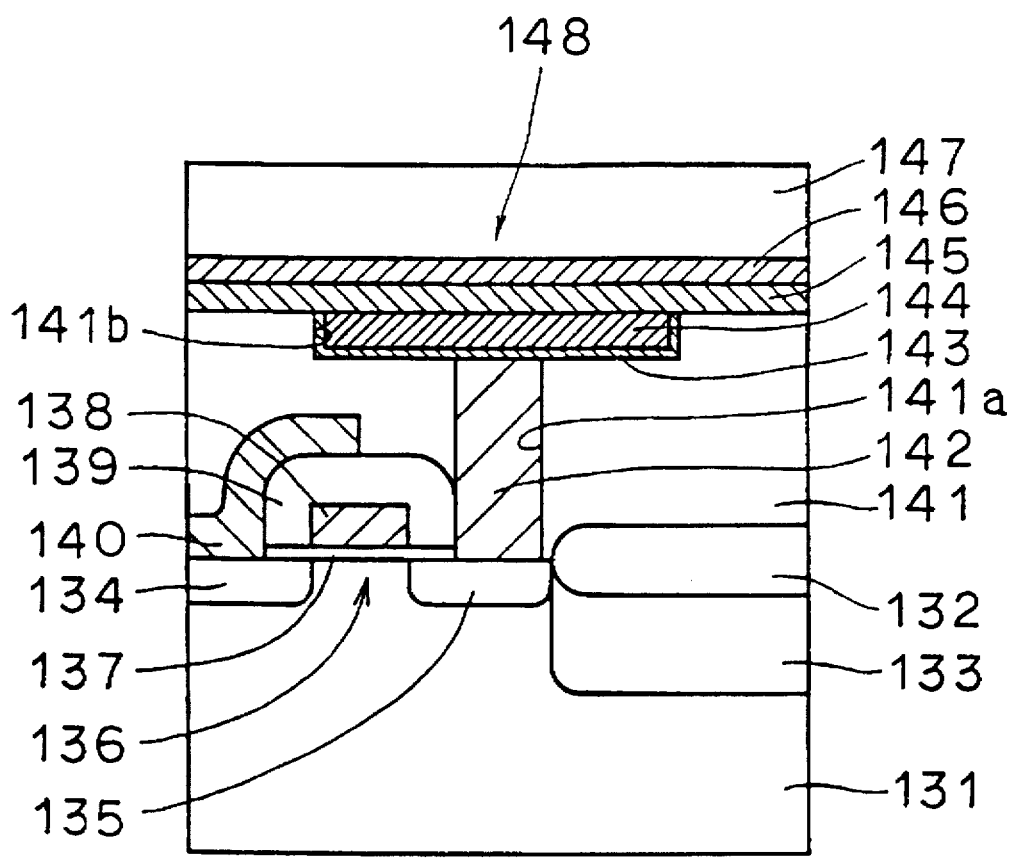
FIG. 35 is a sectional structural view of a semiconductor device according to a fifth embodiment of the present invention.

A fifth embodiment of the present invention will be described hereinafter with reference to FIG. 35 schematically showing a sectional view of a semiconductor device of the fifth embodiment. The structure of transistor gate transistor 136 is similar to that of the first embodiment shown in FIG. 1, and their description will not be repeated.

Referring to FIG. 35, a first contact hole 141a having a first diameter and a second contact hole 141b having a second diameter greater than the first diameter are formed in interlayer insulation film 141. First contact hole 141a reaches a part of source/drain region 135. Second contact hole 141b is provided above first contact hole 141a in communication therewith.

A buried conductive layer 142 of polysilicon or the like is formed in first contact hole 141a.

A lower electrode layer 144 is provided in second contact hole 141b so as to be electrically connected to buried conductive layer 142. The top face of lower electrode layer 144 is substantially flush with the top face of interlayer insulation film 141.

Lower electrode layer 144 is electrically connected to buried conductive layer 142 via a barrier layer 143. Similar to the above embodiments, barrier layer 143 serves to prevent impurities of buried conductive layer 142 to diffuse into lower electrode layer 144.

A high dielectric film 145 of a high dielectric constant material such PZT is formed on the surface of lower electrode layer 144 and interlayer insulation film 141. Therefore, a platinum (Pt) layer is used for lower electrode layer 144.

An upper electrode layer 146 is formed on high dielectric film 145. Upper electrode layer 146 is formed of platinum or doped polysilicon.

As a result, a capacitor 148 is provided including lower electrode layer 144, high dielectric film 145 and upper electrode layer 164, electrically connected to source/drain region 135.

An insulation film 147 is formed to cover the surface of capacitor 148.

A method of manufacturing the above semiconductor device will be described hereinafter.

FIGS. 36–42 are sectional views of the semiconductor device of the fifth embodiment sequentially showing the manufacturing steps thereof. The manufacturing process up to the deposition of interlayer insulation film 141 is similar to that of the first embodiment, and their description will not be repeated.

Figure 36:
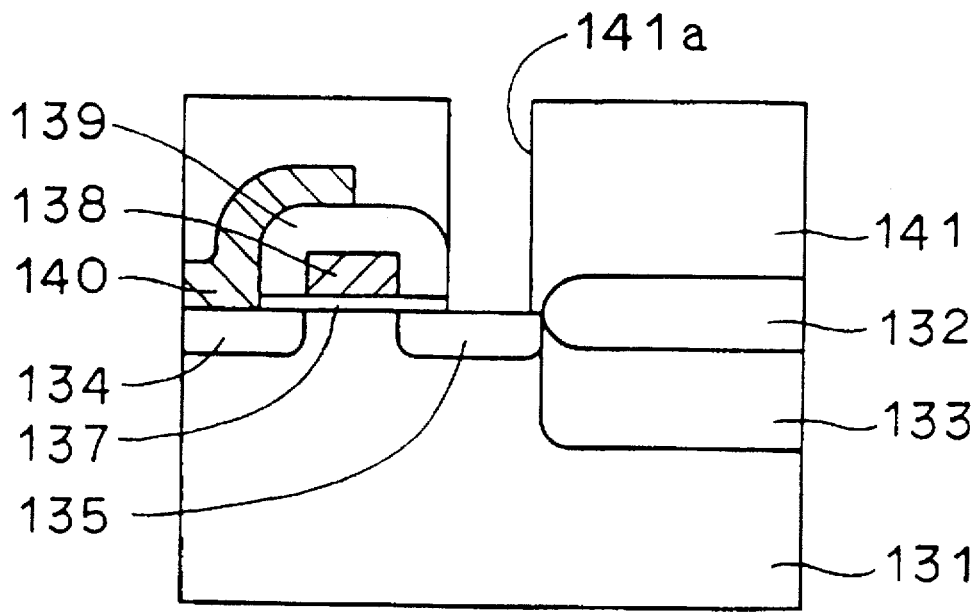
FIGS. 36–42 are sectional views of the semiconductor device of the fifth embodiment showing 1–7th steps of the manufacturing method thereof.

Referring to FIG. 36, a photoresist of a predetermined pattern is formed all over the surface of interlayer insulation film 141. Using this photoresist pattern, an etching process is carried out to form a first contact hole 141a reaching source/drain region 135.

Figure 37:
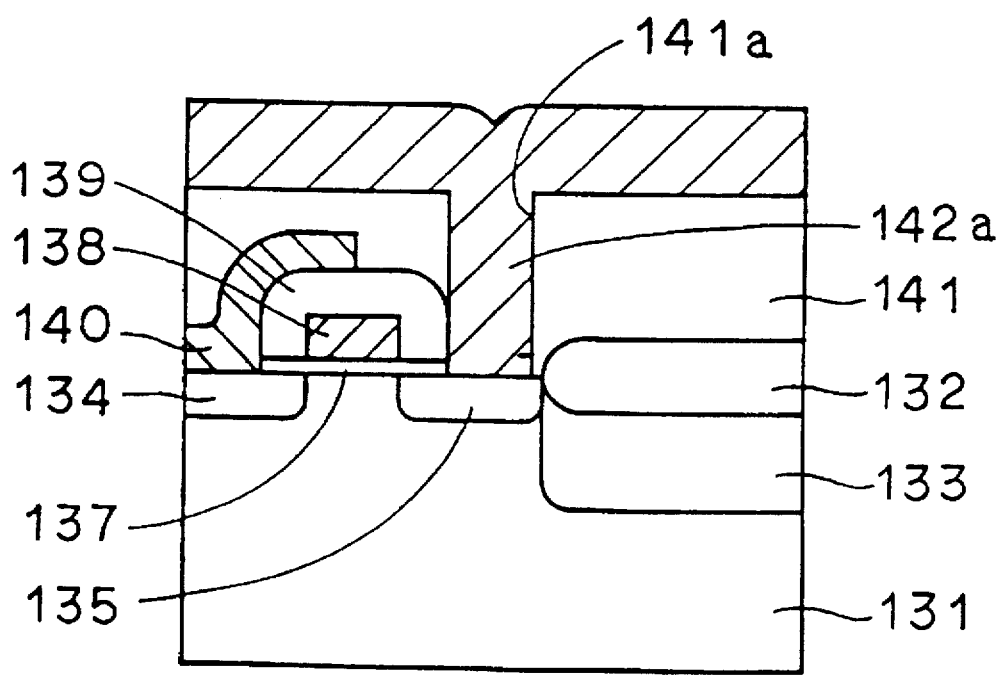

Referring to FIG. 37, doped polysilicon film 142a is deposited all over the surface of interlayer insulation film 141 until the interior of contact hole 141a is filled.

Figure 38:
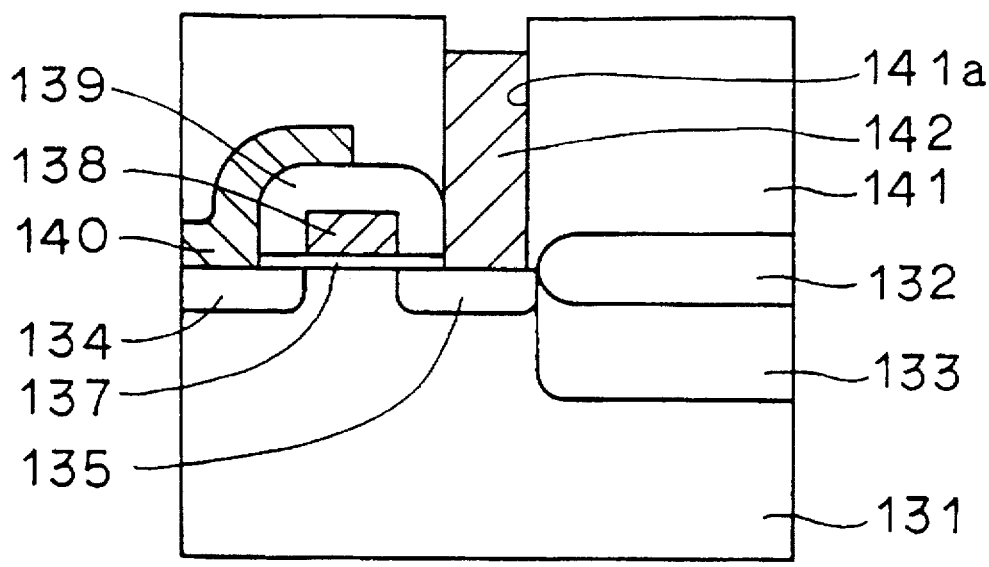

Referring to FIG. 38, doped polysilicon film 142a is etched back until the surface of interlayer insulation film 141 is exposed. This results in a buried conductive layer 142 in first contact hole 141a.

Figure 39:
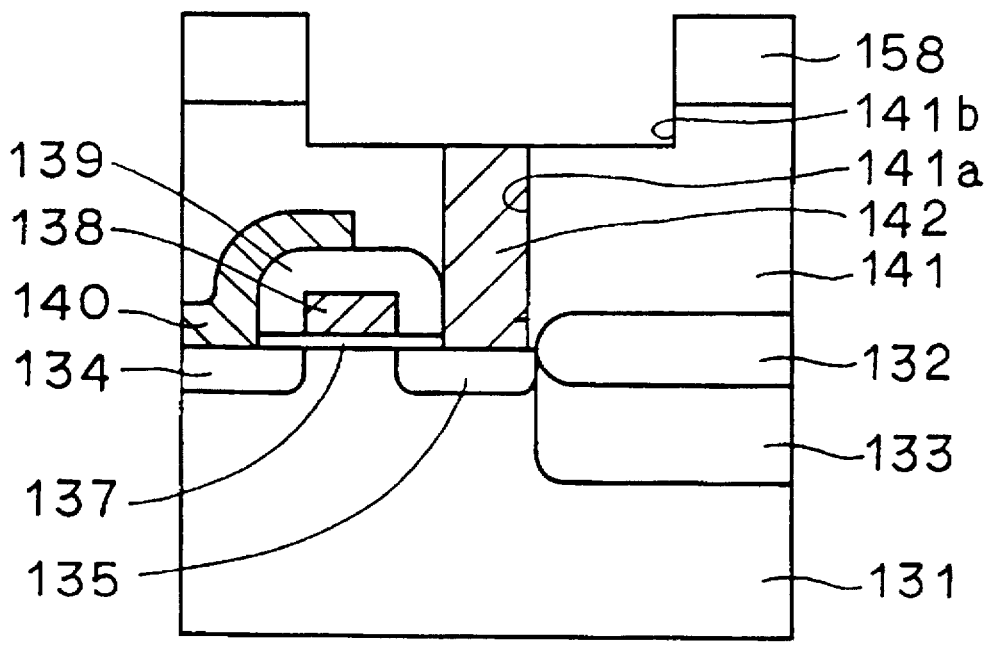

Referring to FIG. 39, a resist film 158 of a predetermined pattern is formed on interlayer insulation film 141. Using resist film 158 as a mask, interlayer insulation film 141 is etched to form second contact hole 141b having a second diameter greater than that of first contact hole 141a.

Figure 40:
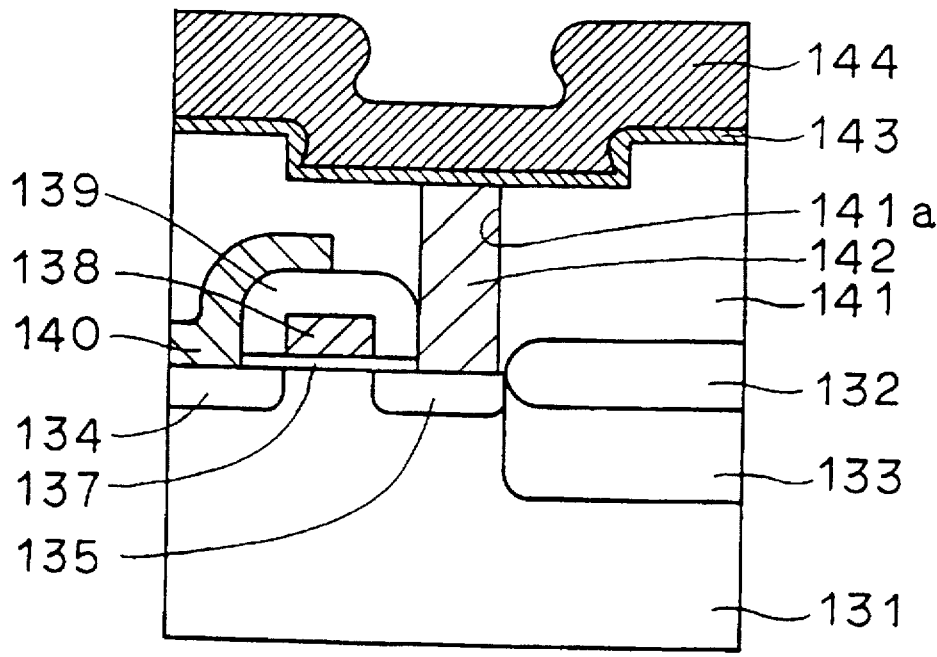

Referring to FIG. 40, following removal of resist film 158, barrier layer 143 of Ti/TiN/Ti, and then upper electrode layer 144 are sequentially layered by a sputtering method in contact hole 141b.

Figure 41:
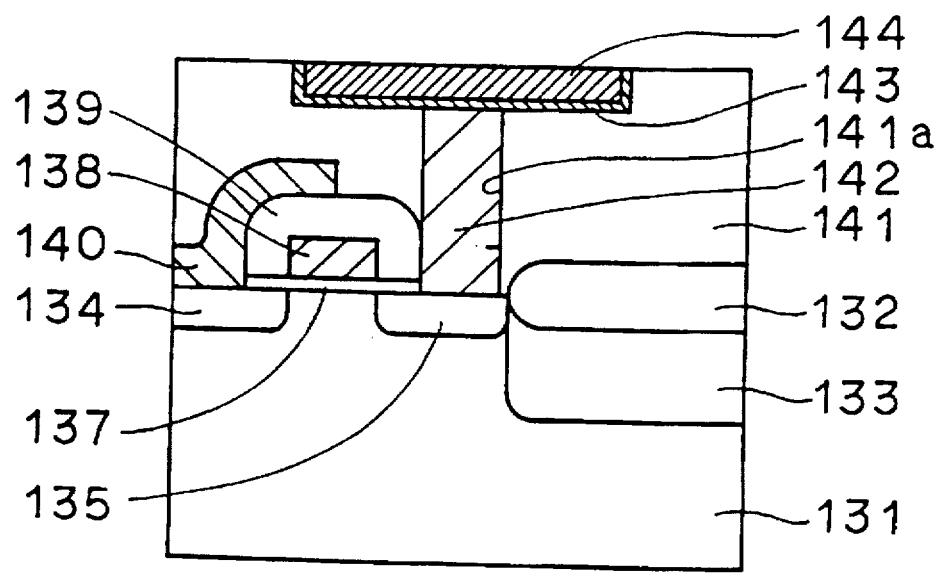

Referring to FIG. 41, barrier layer 143, lower electrode layer 144, and interlayer insulation film 141 are subjected to chemical-mechanical polishing, whereby the surface of lower electrode layer 144 is substantially flush with the surface of interlayer insulation film 141.

Figure 42:
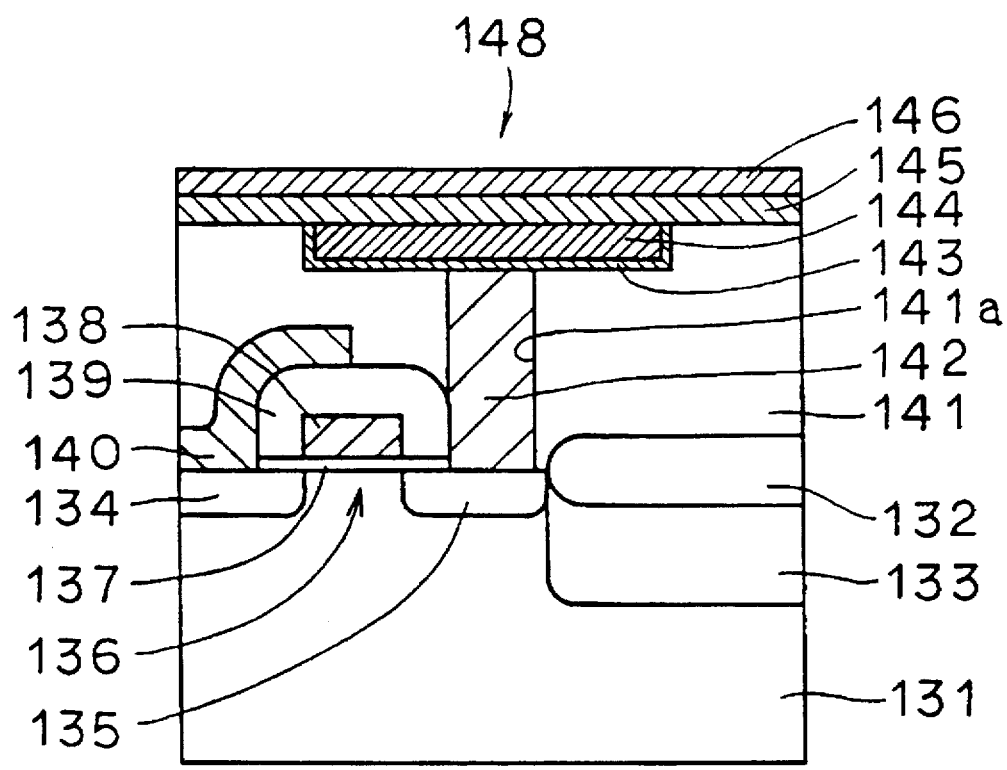

Referring to FIG. 42, high dielectric film 145 of a high dielectric constant material such as PZT is formed on the surface of lower electrode layer 144 by sputtering.

Then, upper electrode layer 146 of platinum, for example, is formed by a sputtering method on high dielectric film 145. Thus, capacitor 148 is formed including lower electrode layer 144, high dielectric film 145 and upper electrode layer 146.

Then, insulation film 147 is deposited so as to cover capacitor 148. Thus the semiconductor device of FIG. 35 is completed.

According to the fifth embodiment, interlayer insulation film 141 is provided including a first contact hole 141a having a first diameter, reaching partially a surface of source/drain region 135, and a second contact hole 141b having a second diameter greater than the first diameter, above first contact hole 141a in communication therewith. Buried conductive layer 142 is formed in first contact hole 141a, and lower electrode layer 144 is formed in second contact hole 141b, substantially flush with interlayer insulation film 141.

Therefore, a stepped portion as in a conventional case is not generated in lower electrode layer 144. High dielectric film 145 formed on lower electrode layer 144 is not reduced in thickness at the stepped portion. There is no portion between lower and upper electrode layers 144 and 146 that is reduced in thickness as in a conventional case when upper electrode layer 146 is formed on high dielectric film 145. Thus, breakdown voltage and anti-leak characteristics of a capacitor are not degraded.

Figure 43:
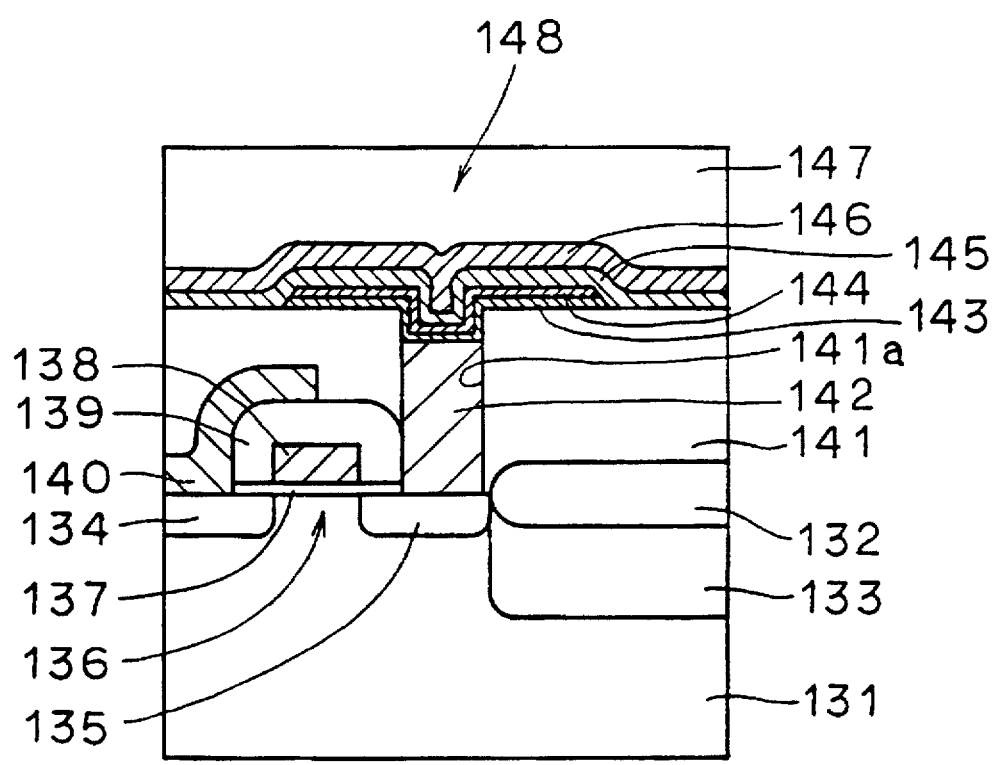
FIG. 43 is a sectional structural view of a semiconductor device according to a sixth embodiment of the present invention.

A sixth embodiment of the present invention will be described with reference to FIG. 43 schematically showing a sectional view of a semiconductor device of the sixth embodiment. The structure of transfer gate transistor 136 is similar to that of the first embodiment shown in FIG. 1, and their description will not be repeated.

Referring to FIG. 43, a capacitor 143 is formed to be electrically connected to a source/drain region 135 via a buried conductive layer 142.

Capacitor 148 includes a lower electrode layer 144, a high dielectric film 145, and an upper electrode layer 146. High dielectric film 145 of capacitor 148 is formed of a high dielectric constant material such as PZT. Therefore, platinum (Pt) layer is used for lower electrode layer 144.

Lower electrode layer 144 is formed to be electrically connected to buried conductive layer 142 via a barrier layer 143, and so as to extend over interlayer insulation film 141.

Similar to the above embodiments, barrier layer 143 serves to prevent impurities of buried conductive layer 142 from diffusing into lower electrode layer 144.

The side of the edge face portion of lower electrode layer 144 is provided to gradually form a gradient towards interlayer insulation film 141.

This prevents the generation of an abrupt stepped portion at the edge face portion of lower electrode layer 144.

A high dielectric film 145 of a high dielectric constant material is formed so as to cover lower electrode layer 144. An upper electrode layer 146 is formed so as to cover lower electrode layer 144 with high dielectric film 145 therebetween. Upper electrode layer 146 is formed of platinum, doped polysilicon, or the like. Insulation film 147 is formed to cover the surface of capacitor 148.

A method of manufacturing the above semiconductor device will be described hereinafter.

FIGS. 44–49 are sectional views of the semiconductor device of the sixth embodiment showing the manufacturing steps sequentially. The manufacturing process up to the deposition of interlayer insulation film 141 is similar to that of the first embodiment, and their description will not be repeated.

Figure 44:
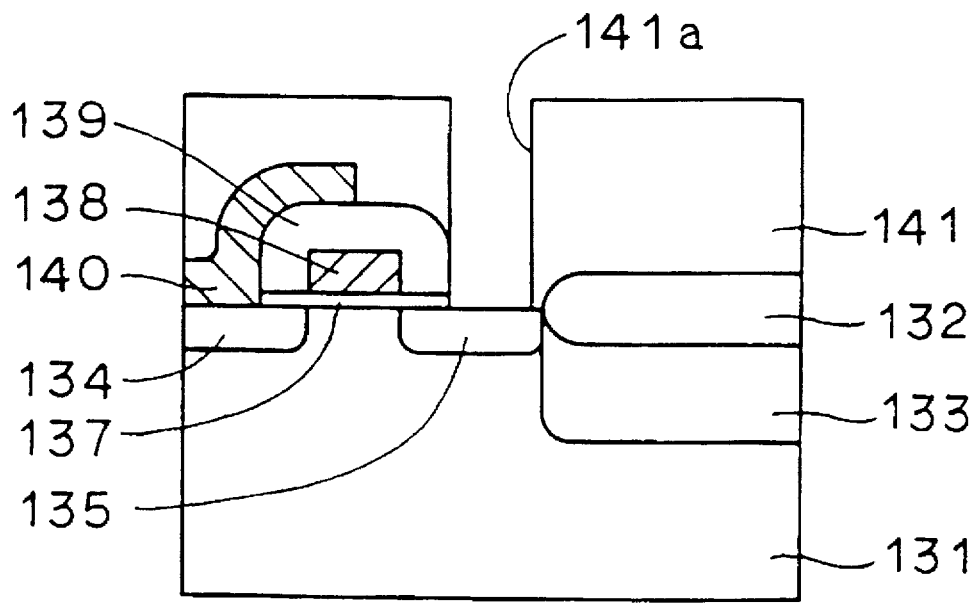
FIGS. 44–49 are sectional views of the semiconductor device of the sixth embodiment showing 1–6th steps of the manufacturing method thereof.

Referring to FIG. 44, a photoresist of a predetermined pattern is formed all over the surface of interlayer insulation film 141. Using this photoresist pattern, an etching process is carried out to form contact hole 121a reaching source/drain region 135.

Figure 45:
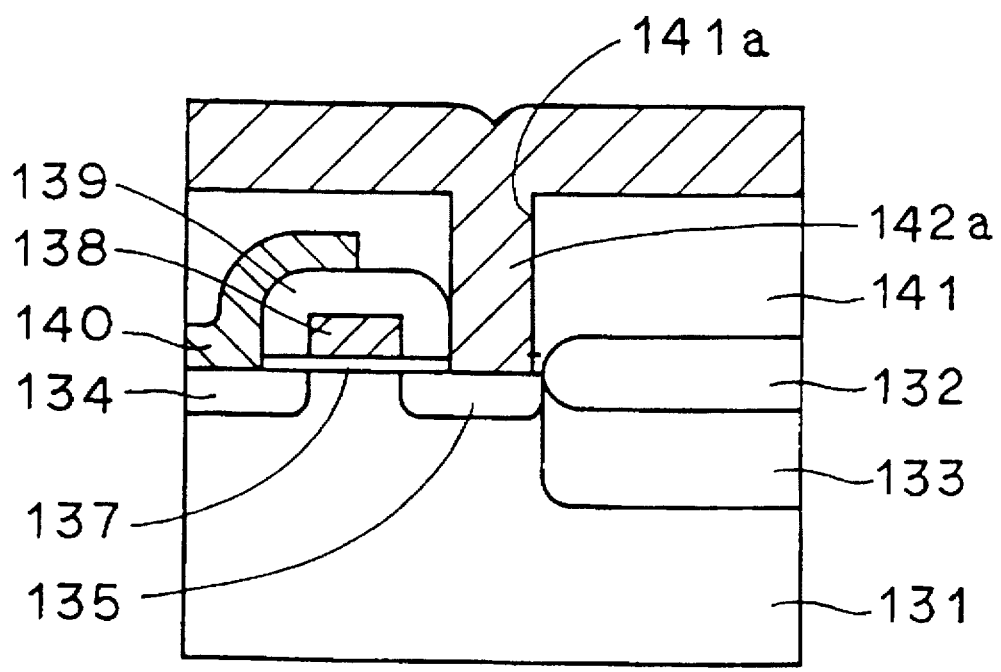

Referring to FIG. 45, doped polysilicon film 142a is deposited all over the surface of interlayer insulation film 141 so that the interior of contact hole 141a is filled.

Figure 46:
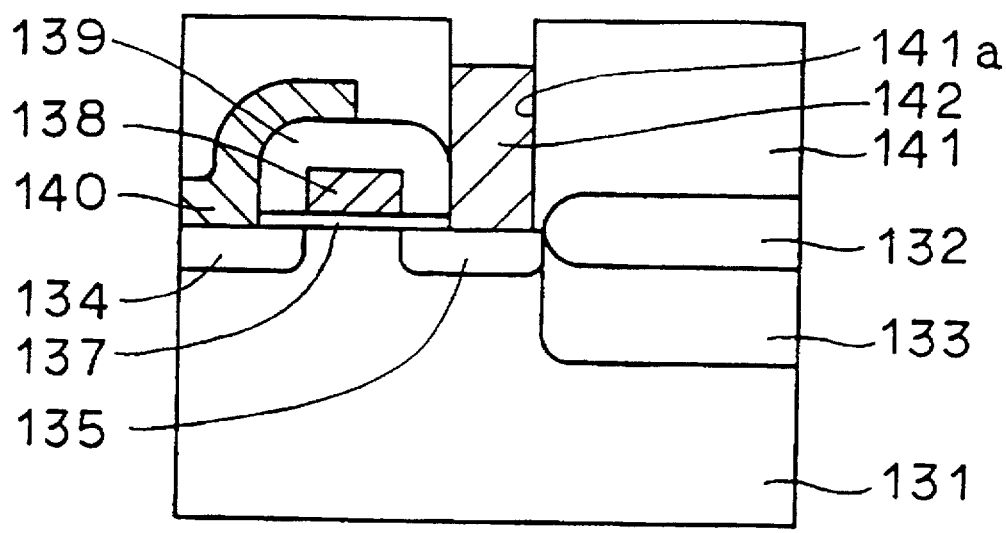

Referring to FIG. 46, doped polysilicon film 142a is etched back until the surface of interlayer insulation film 141 is exposed. This results in buried conductive layer 142 in contact hole 141a.

Figure 47:
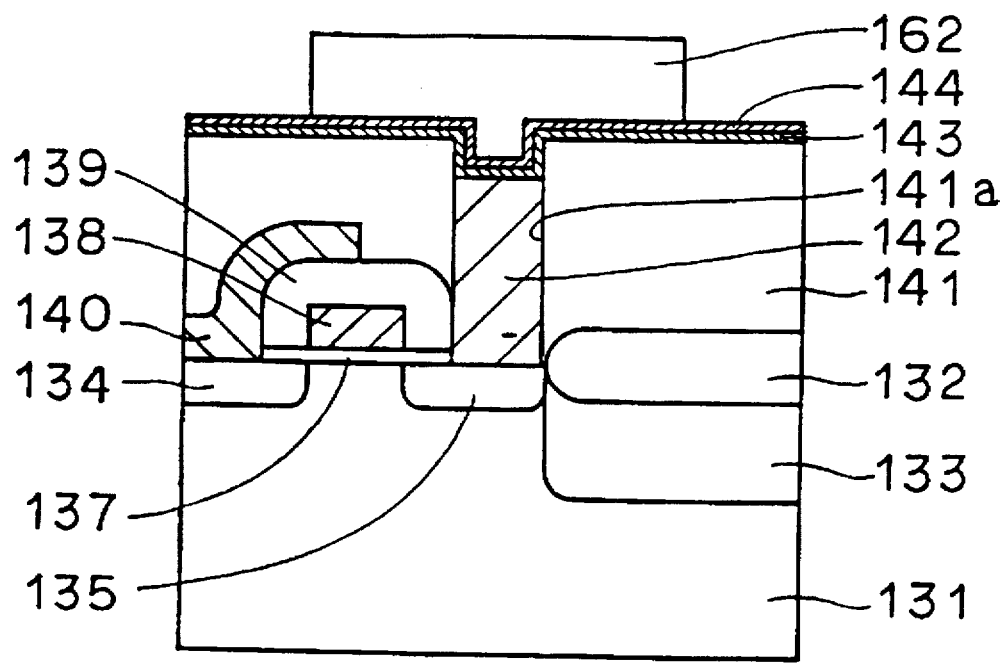

Referring to FIG. 47, barrier layer 143 of Ti/TiN/Ti by a sputtering method and then lower electrode layer 144 of platinum are sequentially layered on buried conductive layer 142 and interlayer insulation film 141. Then, resist film 162 of a predetermined pattern is formed on lower electrode layer 144.

Figure 48:
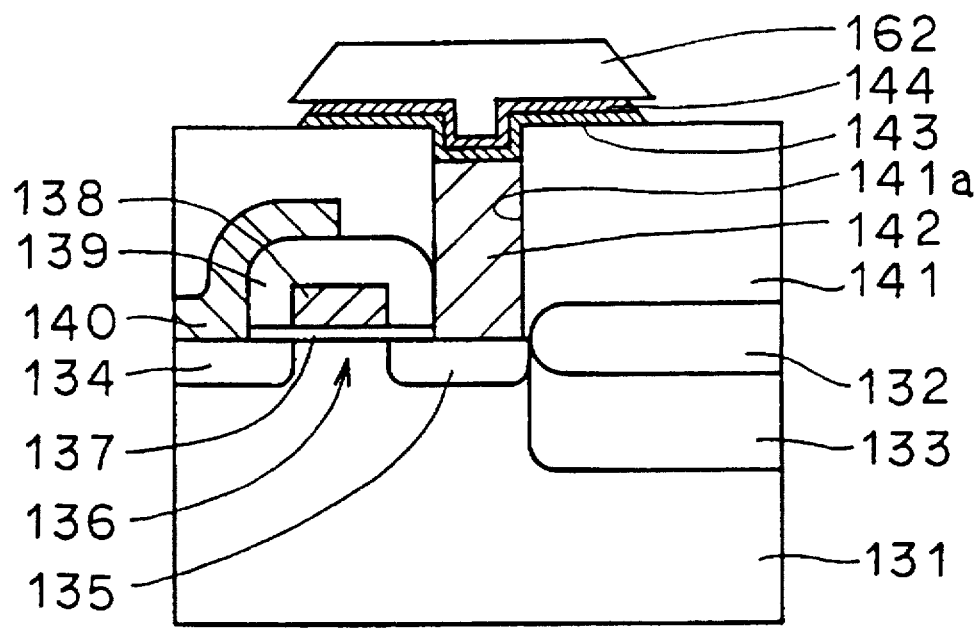

Referring to FIG. 48, using resist film 162 as a mask, lower electrode layer 144 is subjected to an etching process so that the edge face portion is inclined by a mask retrocession method or a deposition taper etching method.

Figure 49:
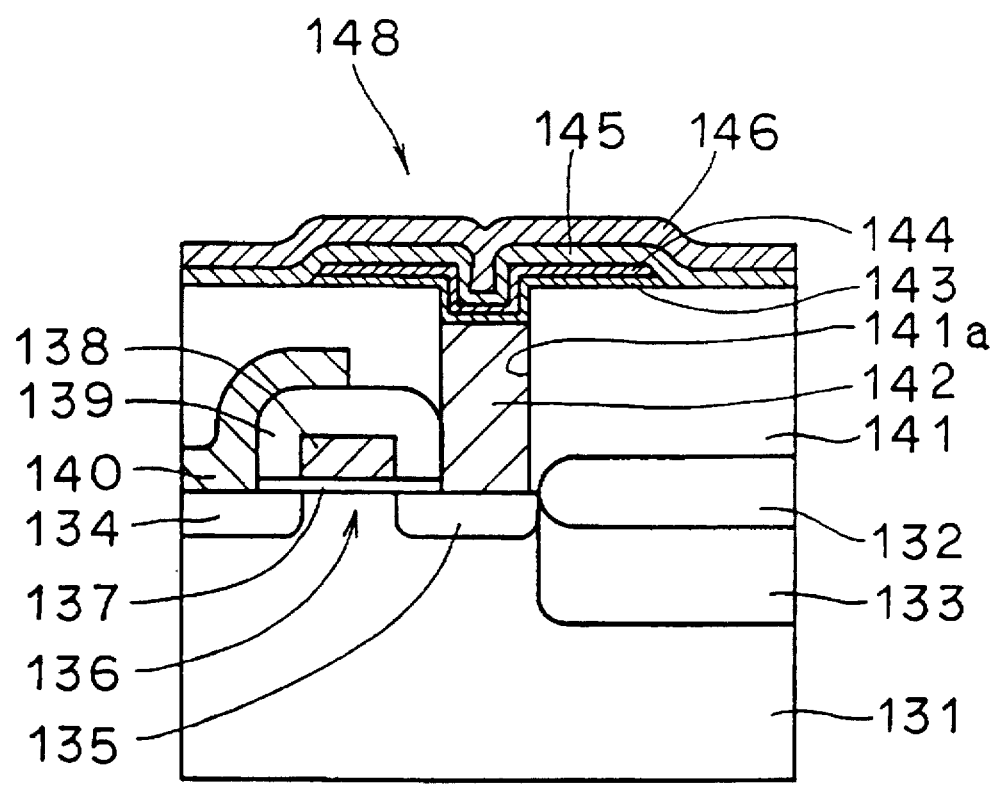

Referring to FIG. 49, high dielectric film 145 of a high dielectric constant material such as PZT is formed by a sputtering method so as to cover the surface of lower electrode layer 144, after resist film 162 is removed.

Then, upper electrode layer 146 of, platinum for example, is formed by a sputtering method on high dielectric film 145. Thus, capacitor 148 of lower electrode layer 144, high dielectric film 145, and upper electrode layer 146 is formed. Then, insulation film 147 is deposited so as to cover capacitor 148. Thus, the semiconductor device shown in FIG. 49 is completed.

According to the sixth embodiment, the side of the edge face portion of lower electrode layer 144 is formed to be gradually increased towards the interlayer insulation film 141.

Therefore, an abrupt stepped portion is not generated as in a conventional case in lower electrode layer 144. High dielectric film 145 formed on lower electrode layer 144 is not reduced in film thickness at the stepped portion thereof. There is no portion between lower and upper electrode layers 144 and 146 that is reduced in thickness as in a conventional case when upper electrode layer 146 is formed on high dielectric film 145. Thus, breakdown voltage and anti-leak characteristics of a capacitor are not degraded.

Figure 50:
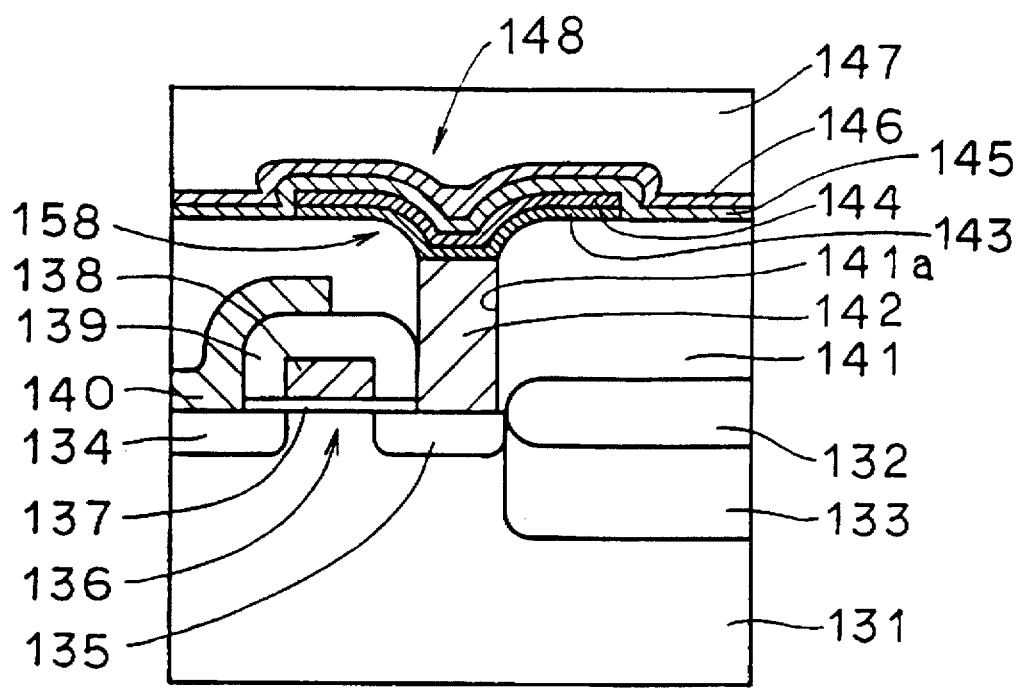
FIG. 50 is a sectional view schematically showing a structure of a semiconductor device according to a seventh embodiment of the present invention.

A seventh embodiment of the present invention will be described hereinafter with reference to FIG. 50 showing a sectional view of the semiconductor device of the seventh embodiment.

Referring to FIG. 50, DRAM memory cell is formed in a region isolated from other regions of the chip by an isolation oxide film 132 and a channel stopper region 133 of a silicon substrate 131.

This one-transistor one-capacitor type memory cell includes a transfer gate transistor 136 and a capacitor 148.

Transfer gate transistor 136 includes a gate oxide film 137, a gate electrode 138 and a pair of source/drain regions 134/135.

On the region sandwiched by source and drain regions 134 and 135, gate electrode 138 is formed with gate oxide film 137 thereunder. An insulation film 139 is formed so as to cover gate electrode 138.

A bit line 140 is formed extending on insulation film 139 so as to come into contact with one of source and drain regions 134 and 135 forming transfer gate transistor 136.

An interlayer insulation film 141 is formed all over the surface of silicon substrate 131 so as to cover bit line 140 and transfer gate transistor 136.

Bit line 140 is a buried bit line since the surface thereof is covered by interlayer insulation film 141.

A contact hole 141a is formed in interlayer insulation film 141. Contact hole 141a reaches the surface of the other of source and drain regions 134 and 135.

Interlayer insulation film 141 includes a gradient portion 158 of a convex plane having a predetermined radius of curvature at the intersection of the sidewall of contact hole 141a and the top plane of interlayer insulation film 141.

A buried conductive layer 142 is formed so as to fill contact hole 141a. Buried conductive layer 142 is formed of, for example, doped polysilicon having conductivity.

At the surface of buried conductive layer 142, capacitor 148 is formed electrically connected to source/drain region 135 via buried conductive layer 142.

Capacitor 148 includes a lower electrode 144, a high dielectric film 145, and an upper electrode layer 146. High dielectric film 145 of capacitor 148 is formed of PZT or the like. A metal layer of platinum (Pt), palladium, or the like is used for lower electrode layer 144.

Lower electrode layer 144 is formed to be electrically connected to buried conductive layer 142 via a barrier layer 143 and so as to extend on interlayer insulation film 141. Barrier layer 143 serves to prevent impurities of buried conductive layer 142 from diffusing into lower electrode layer 144.

A high dielectric film 145 is formed to cover the surface of lower electrode layer 144. An upper electrode layer 146 is formed to cover lower electrode layer 144 with high dielectric film 145 thereunder. Upper electrode layer 146 is formed of platinum, doped polysilicon, or the like.

An insulation film 147 is formed to cover the surface of capacitor 148.

A method of manufacturing the above semiconductor device will be described hereinafter.

FIGS. 51–55 are sectional views of the semiconductor device of the seventh embodiment showing the manufacturing steps sequentially.

Figure 51:
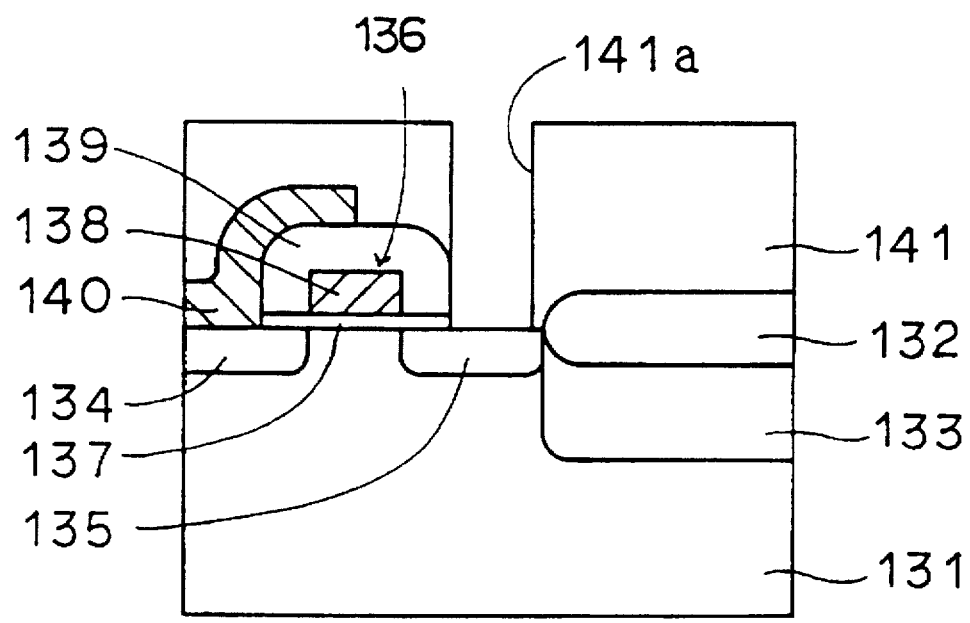
FIGS. 51–55 are sectional views of the semiconductor device of the seventh embodiment showing 1–5th steps of the manufacturing method thereof.

Referring to FIG. 51, isolation oxide film 132 is formed on the surface of silicon substrate 131 by a LOCUS method. Simultaneously, channel stopper region 133 is formed beneath isolation oxide film 132.

Gate electrode 138 is formed on silicon substrate 131 with gate oxide film 137 thereunder. Using gate electrode 138 as a mask, ions are implanted to form source/drain regions 134/135.

Insulation film 139 is formed to cover gate electrode 138. This results in transfer gate transistor 136.

Then, buried bit line 140 is formed extending over insulation film 139 so as to come into contact with source/drain region 134. Interlayer insulation film 141 of a silicon oxide film is formed all over the surface of silicon substrate 131 by CVD so as to cover buried bit line 140 and transfer gate transistor 136.

Then, a photoresist having a predetermined pattern is formed all over the surface of interlayer insulation film 141. Using this photoresist pattern, an etching step is carried out to form contact hole 141a reaching source/drain region 135.

Figure 52:
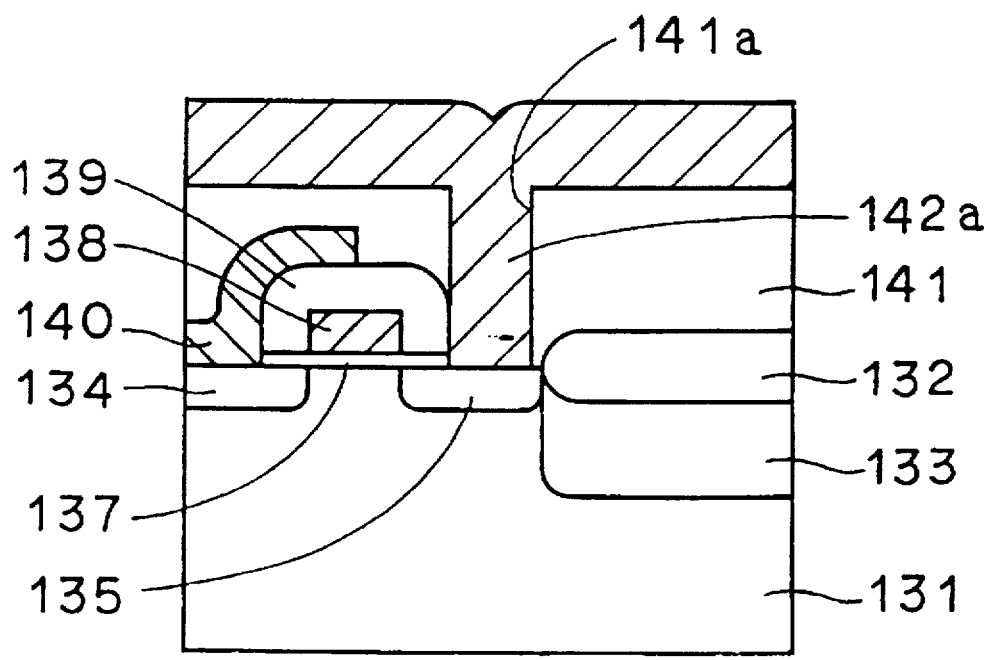

Referring to FIG. 52, doped polysilicon film 142a is deposited by CVD all over the surface of interlayer insulation film 141 until the interior of contact hole 141a is filled.

Figure 53:
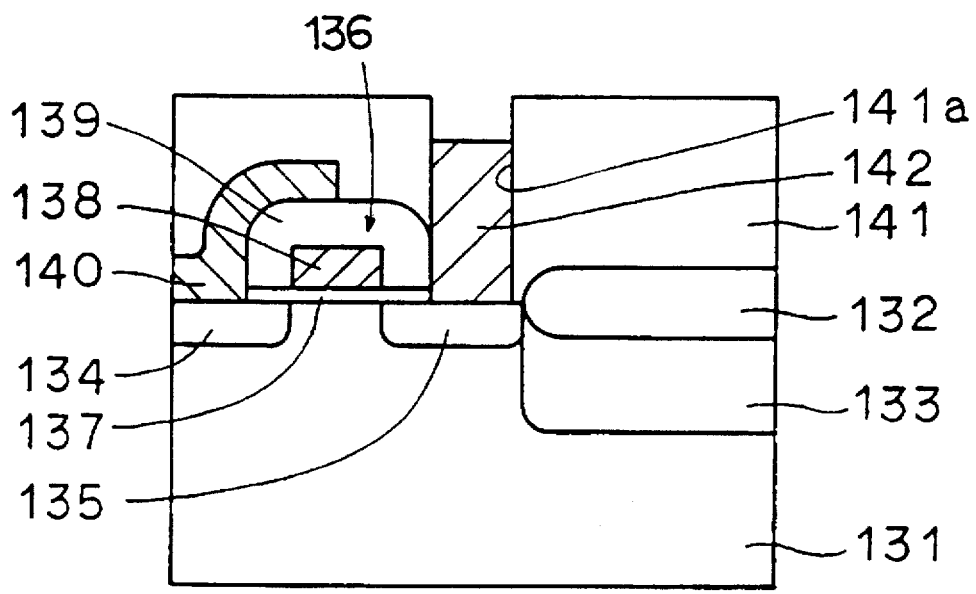

Referring to FIG. 53, doped polysilicon film 142a is etched back until the surface of interlayer insulation film 141 is exposed. An overetching process of approximately 20–30% of the film thickness of doped polycrystalline silicon film 142a is carried out to completely remove etching residues on other portions not shown on interlayer insulation film 141. This results in buried conductive layer 142 in contact hole 141a.

Figure 54:
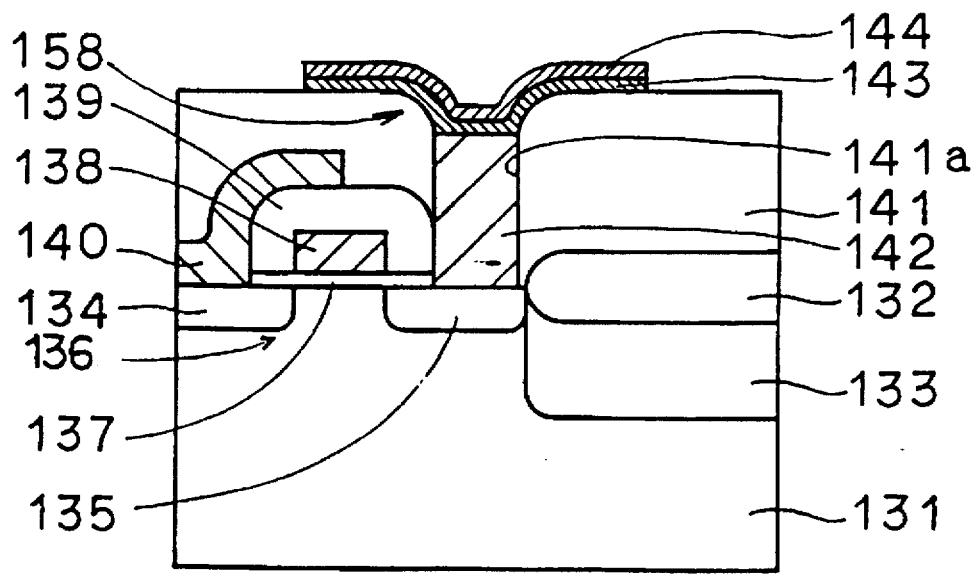

Referring to FIG. 54, isotropic wet etching is carried out on interlayer insulation film 141 to form gradient portion 158 at the intersection of the sidewall of contact hole 141a and the top face of interlayer insulation film 141.

Barrier layer 143 of Ti/TiN/Ti and then lower electrode layer 144 of platinum are sequentially layered on the surface of buried conductive layer 142 and interlayer insulation film 141 by a sputtering method, to be patterned to a predetermined configuration.

Figure 55:
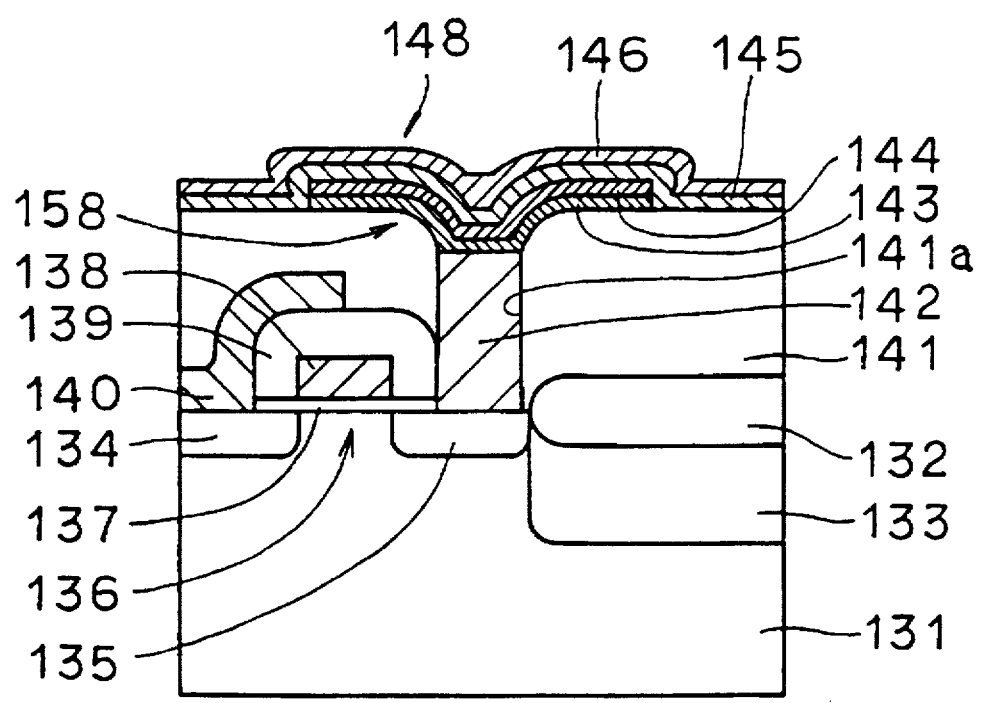

Referring to FIG. 55, high dielectric film 145 of, PZT, for example, is formed by a sputtering method so as to cover the surface of lower electrode layer 144.

Then, upper electrode layer 146 of platinum is formed by a sputtering method on high dielectric film 145. Thus, capacitor 148 is formed including lower electrode layer 144, high dielectric film 145, and upper electrode layer 146.

Then, insulation film 147 is deposited so as to cover capacitor 148. Thus, the semiconductor device shown in FIG. 50 is completed.

According to the semiconductor device of the seventh embodiment, a gradient portion 158 is formed at the intersection of the sidewall of contact hole 141a and the upper face of interlayer insulation film 141. Therefore, lower electrode layer 144 is not reduced in thickness when formed on buried conductive layer 142. Therefore, a stepped portion as in a conventional case is not generated in lower electrode layer 144.

High dielectric film 145 formed on lower electrode layer 144 is not reduced in thickness at the stepped portion thereof. There is no portion between the lower and upper electrode layers 144 and 146 that is reduced in thickness as in a conventional case when upper electrode layer 146 is formed on high dielectric film 145. Thus, breakdown voltage and anti-leak characteristics of a capacitor are not degraded.

Figure 56:
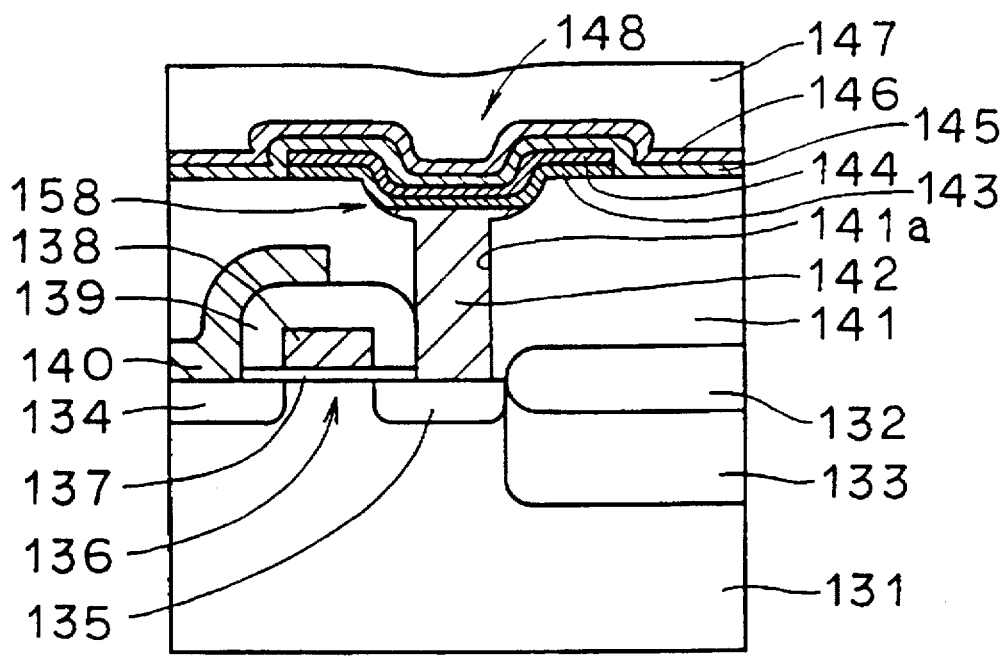
FIG. 56 is a sectional view schematically showing a structure of a semiconductor device according to an eighth embodiment of the present invention.

An eighth embodiment of the present invention will be described hereinafter with reference to FIG. 56 schematically showing a sectional view of the semiconductor device of the eighth embodiment. The structure of transfer gate transistor 136 of the eighth embodiment is similar to that of the seventh embodiment shown in FIG. 50, and their description will not be repeated.

Referring to FIG. 56, a contact hole 141a is formed in an interlayer insulation film 141. Contact hole 141a reaches one of source/drain regions 134/135.

A gradient portion 158 of a concave plane having a predetermined radius of curvature is provided at the intersection of the sidewall of contact hole 141a and the top face of interlayer insulation film 121.

Buried conductive layer 142 is formed to fill contact hole 141. The top face of buried conductive layer 142 is located at the lower portion of gradient portion 158 in the present embodiment. Doped polysilicon is used for buried conductive layer 142.

A capacitor 148 is formed at the surface of buried conductive layer 142 to be electrically connected to source/drain region 135 via buried conductive layer 142.

Capacitor 148 includes lower electrode layer 144, high dielectric film 145, and upper electrode layer 146. PZT, for example, is used for high dielectric film 145 of capacitor 148. Therefore, a platinum (Pt) layer is used for lower electrode layer 144.

Lower electrode layer is formed so as to be electrically connected to buried conductive layer 142 via barrier layer 143, and so as to extend over interlayer insulation film 141. Barrier layer 143 serves to prevent impurities of buried conductive layer 142 from diffusing into lower electrode layer 144.

A high dielectric film 145 is formed so as to cover the surface of lower electrode layer 144. An upper electrode layer 146 is formed so as to cover lower electrode layer 144 with high dielectric film 145 therebetween. Upper electrode layer 146 is formed of platinum, doped polysilicon, or the like. An insulation film 147 is formed to cover the surface of capacitor 148.

A method of manufacturing the above semiconductor device will be described hereinafter.

FIGS. 57–62 are sectional views of the semiconductor device of the eighth embodiment showing manufacturing steps sequentially. The manufacturing process up to the deposition of interlayer insulation film 141 is similar to that of the seventh embodiment, and their description will not be repeated.

Figure 57:
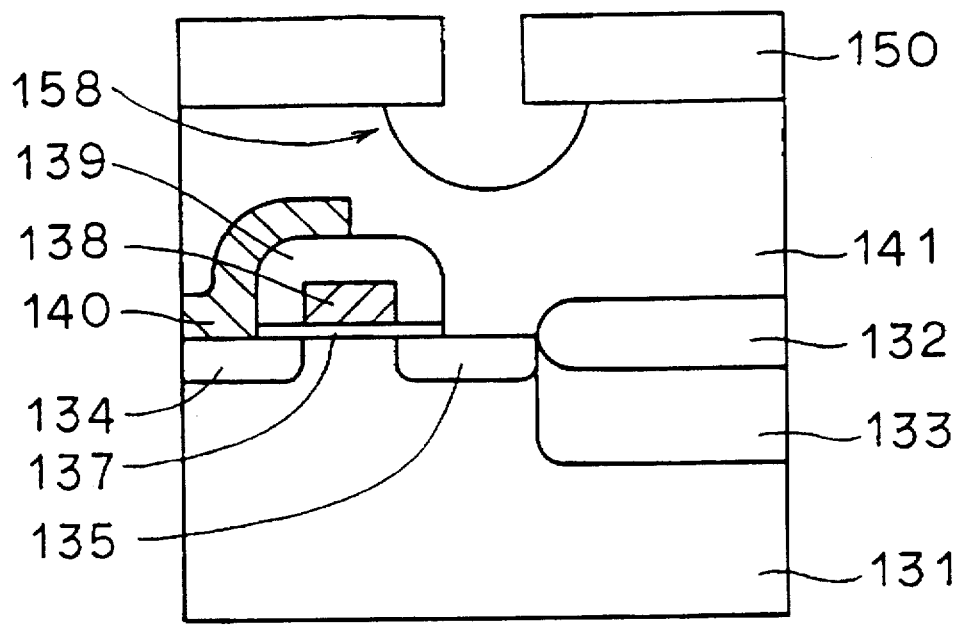
FIGS. 57–62 are sectional views of the semiconductor device of the eighth embodiment showing 1–6th steps of the manufacturing method thereof.

Referring to FIG. 57, a resist film 150 having a predetermined pattern is formed on interlayer insulation film 141. Using resist film 150 as a mask, isotropic wet etching is applied to form a gradient portion 158 of a predetermined curved configuration in interlayer insulation film 141.

Figure 58:
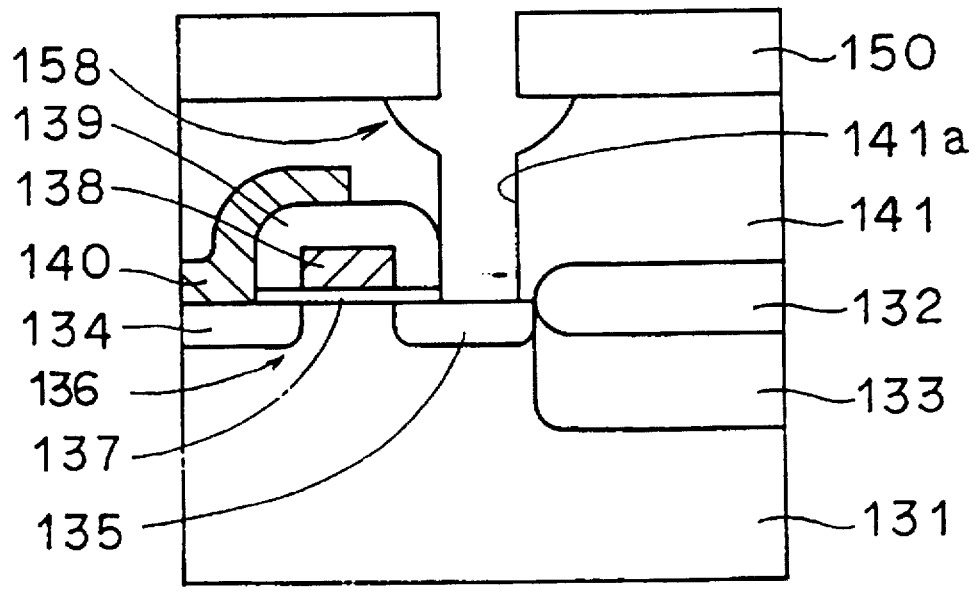
Figure 59:
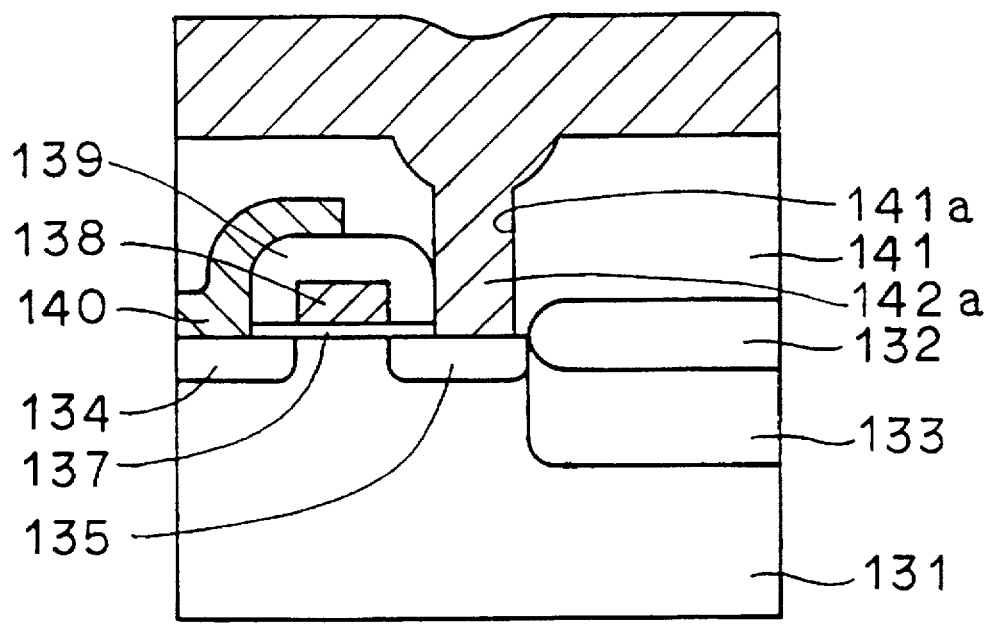

Referring to FIG. 58, contact hole 141a reaching source/drain region 135 is formed by anisotropic dry etching using resist film 150.

The etching conditions are as follows:

Gas system: $CHF_3:Ar:O_2 \approx 10:20:1$
Gas pressure: 200 mTorr
RF Power: 500–1000 W
Rate: 1000–3000 Å/min
Time: 30–60 seconds Referring to FIG. 59, following removal of resist film 150, doped polysilicon film 142a is deposited all over the surface of interlayer insulation film 141 so as to fill the interior of contact hole 141a and gradient portion 158.

Figure 60:
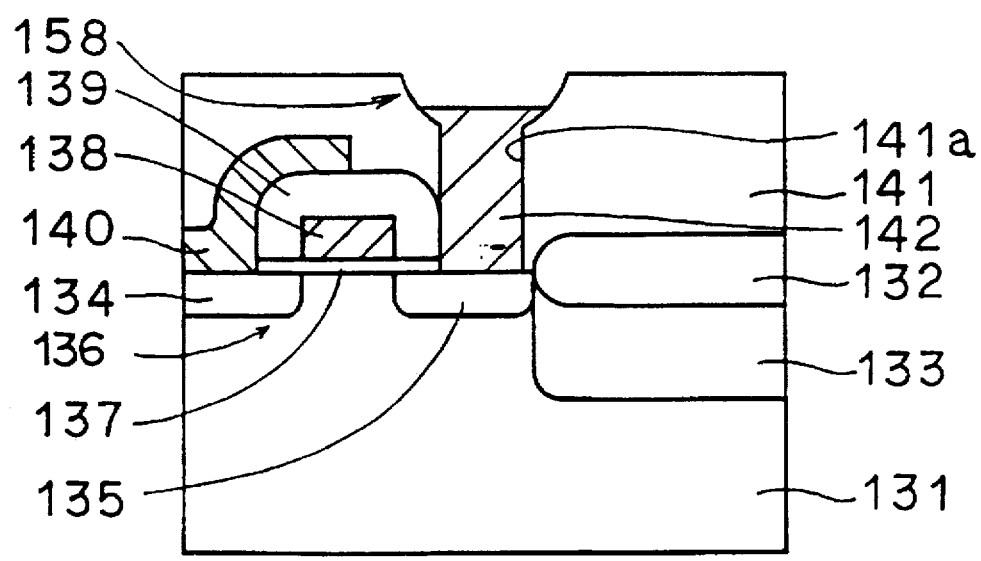

Referring to FIG. 60, doped polysilicon film 142a is etched back until the surface of silicon oxide film 141 is exposed. An overetching of approximately 20–30% of the film thickness of doped polysilicon film 142a is carried out to completely remove etching residues on silicon oxide film 141.

This overetching process is controlled so that the top face of doped polysilicon film 142a is located at the lower portion of gradient portion 158. This results in buried conductive layer 142 in contact hole 141a.

Figure 61:
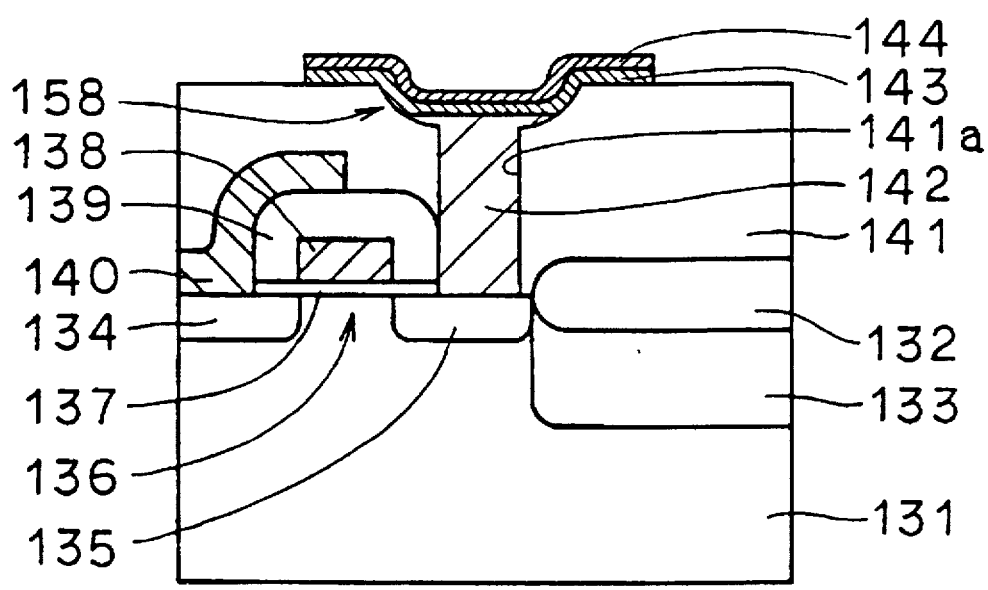

Referring to FIG. 61, barrier layer 143 of Ti/TiN/Ti and then a lower electrode layer 144 of platinum are sequentially layered by a sputtering method on the surface of buried conductive layer 142, which are then patterned to a predetermined configuration.

Figure 62:
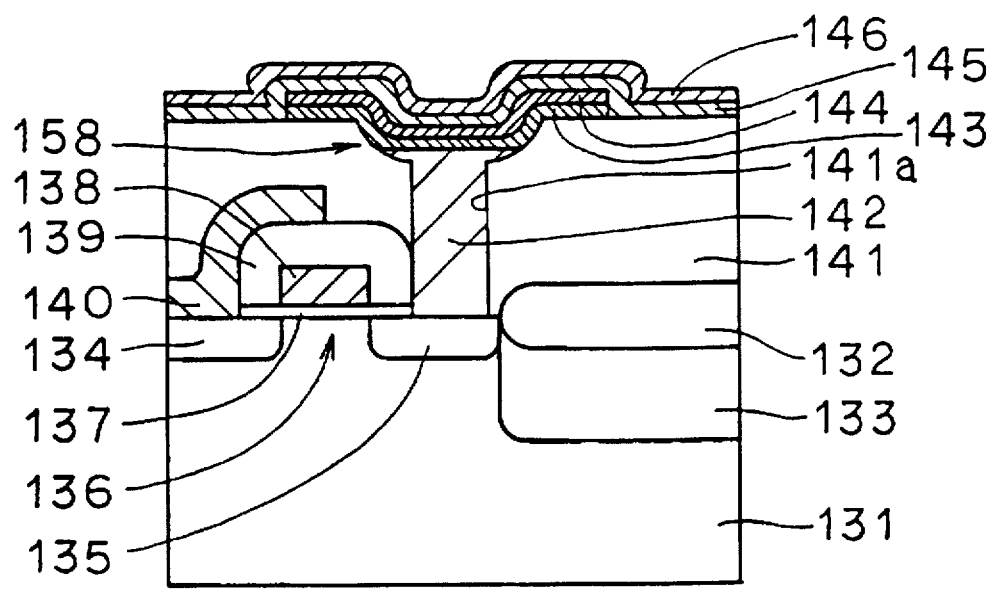

Referring to FIG. 62, high dielectric film 145 of PZT is formed by a sputtering method so as cover the surface of lower electrode layer 144.

Upper electrode layer 146 of platinum is formed by a sputtering method on high dielectric film 145. As a result, a capacitor 148 of lower electrode layer 144, high dielectric film 145, and upper electrode layer 146 is formed. Insulation film 147 is deposited so as to cover capacitor 48. Thus, the semiconductor device as shown in FIG. 56 is completed.

According to the semiconductor device and the manufacturing method of the eighth embodiment, a gradient portion 158 of a curved configuration is formed at the intersection of the sidewall of contact hole 141a and the top face of interlayer insulation film 141. Therefore, a stepped portion as in a conventional case is not generated in lower electrode layer 144 when lower electrode layer 144 is formed on buried conductive layer 142.

High dielectric film 145 formed on lower electrode layer 144 is not reduced in film thickness at the stepped portion. There is not portion between lower and upper electrode layers 144 and 146 that is reduced in thickness when upper electrode layer 146 is formed on high dielectric film 145. Thus, breakdown voltage and anti-leak characteristics of a capacitor are not degraded.

Figure 63:
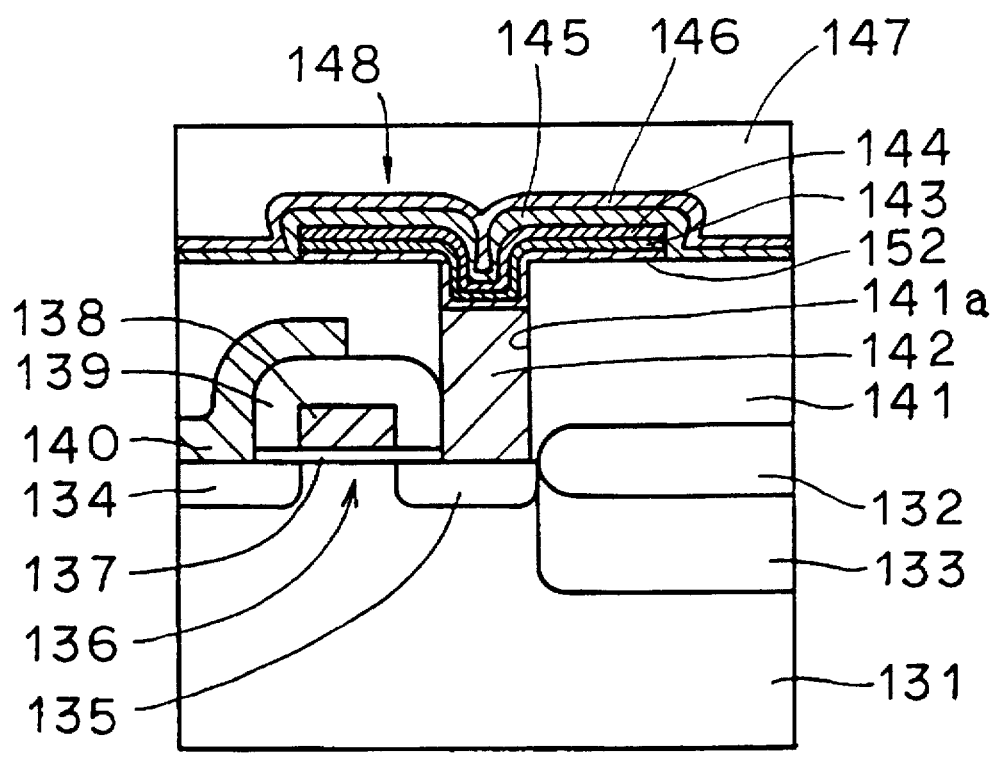
FIG. 63 is a sectional view schematically showing a structure of a semiconductor device according to a ninth embodiment of the present invention.

A ninth embodiment of the present invention will be described hereinafter with reference to FIG. 63 schematically showing a sectional view of the semiconductor device of the ninth embodiment. The structure of transfer transistor 136 is similar to that of the seventh embodiment shown in FIG. 50, and their description will not be repeated.

Referring to FIG. 63, a contact hole 141a is formed in an interlayer insulation film 141. Contact hole 141a reaches one of source/drain regions 134/135.

A buried conductive layer 142 is formed so as to fill contact hole 141a. Buried conductive layer 142 is formed of doped polysilicon.

A deposited conductive layer 152 formed by a CVD method is provided on the surface of buried conductive layer 142. A capacitor 148 is formed on deposited conductive layer 152 to be electrically connected to source/drain region 135 via buried conductive layer 142.

Capacitor 143 includes a lower electrode layer 144, a high dielectric film 145, and upper electrode layer 146. High dielectric film 145 of capacitor 148 is formed of PZT. A platinum (Pt) layer is used for lower electrode layer 144.

Lower electrode layer 144 is formed so as to be electrically connected to deposited conductive layer 152 and buried conductive layer 142 via barrier layer 143, and so as to extend over interlayer insulation film 141. Barrier layer 143 serves to prevent impurities of buried conductive layer 142 from diffusing into lower electrode layer 144.

A high dielectric film 145 is formed so as to cover the surface of lower electrode layer 144. An upper electrode layer 146 is formed so as to cover lower electrode layer 144 via high dielectric film 145. Upper electrode layer 146 is formed of platinum, doped polysilicon, or the like. An insulation film 147 is formed so as to cover the surface of capacitor 148.

A method of manufacturing the above semiconductor device will be described hereinafter.

FIGS. 64–68 are sectional views of the semiconductor device of the ninth embodiment showing the manufacturing steps sequentially. The manufacturing process up to the deposition of interlayer insulation film 141 is similar to that of the first embodiment, and their description will not be repeated.

Figure 64:
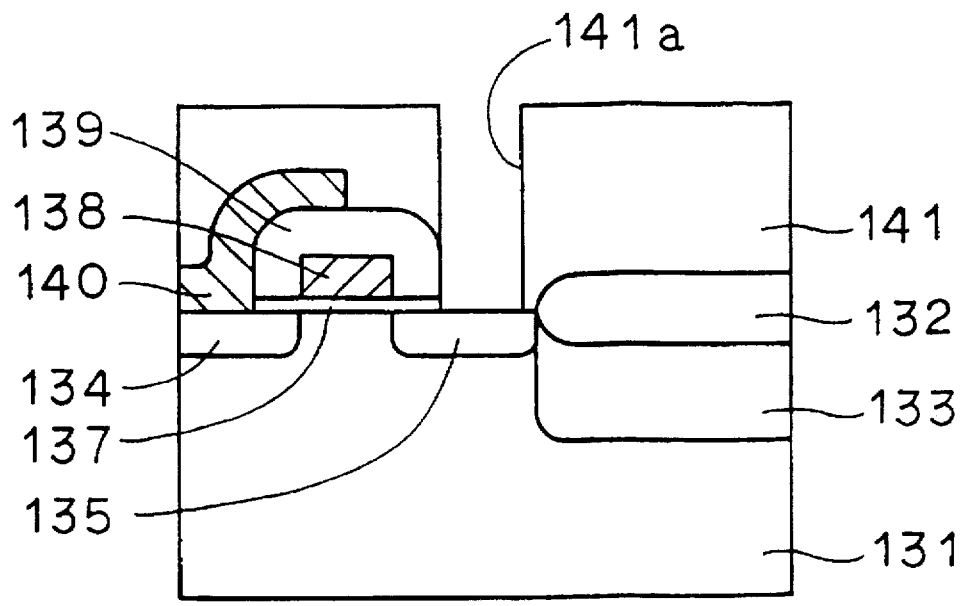
FIGS. 64–68 are sectional views of the semiconductor device according to the ninth embodiment showing 1–5th steps of the manufacturing method thereof.

Referring to FIG. 64, a photoresist of a predetermined pattern is formed all over the surface of interlayer insulation film 141. Using this photoresist pattern, an etching process is carried out to form a contact hole 141a reaching source/drain region 135.

Figure 65:
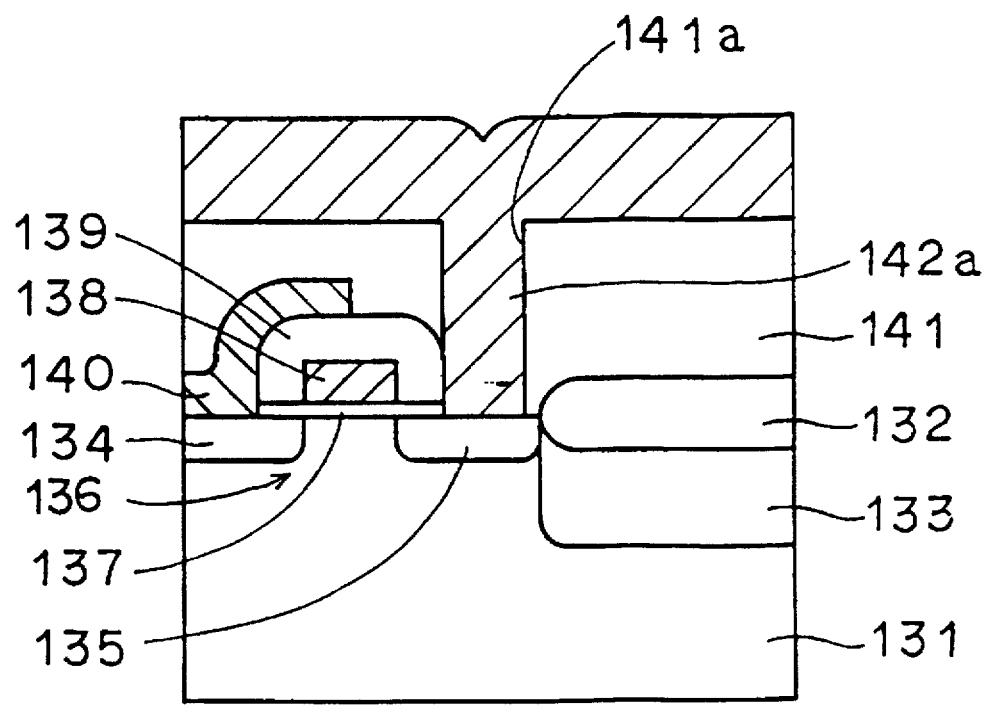

Referring to FIG. 65, a doped polysilicon film 142 is deposited all over the surface of interlayer insulation film 141 so as to fill the interior of contact hole 141a.

Figure 66:
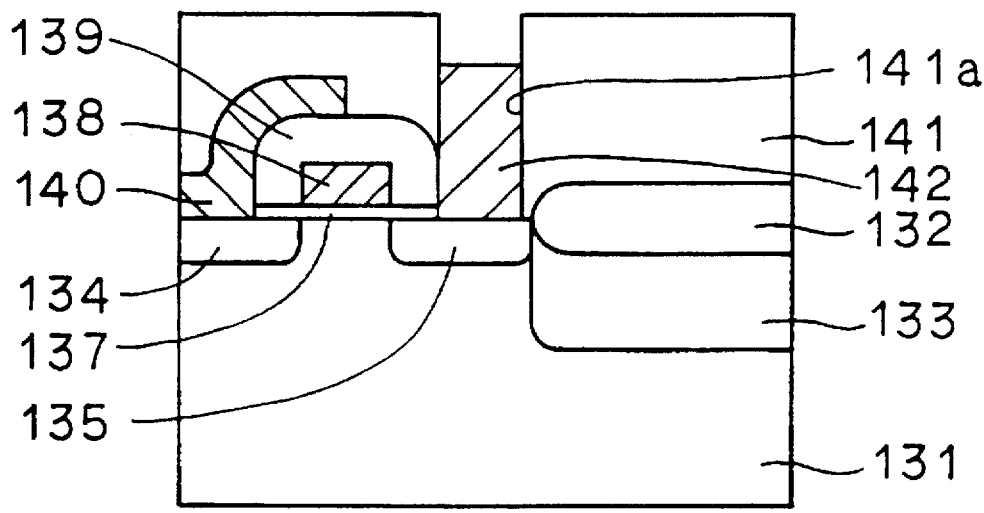

Referring to FIG. 66, doped polysilicon film 142a is etched back until the surface of silicon oxide film 141 is exposed. An overetching step of approximately 20–30% of the film thickness of doped polysilicon film 142a is carried out to completely remove etching residue on the surface of silicon oxide film 141.

This results in buried conductive layer 142 in contact hole 141a.

Figure 67:
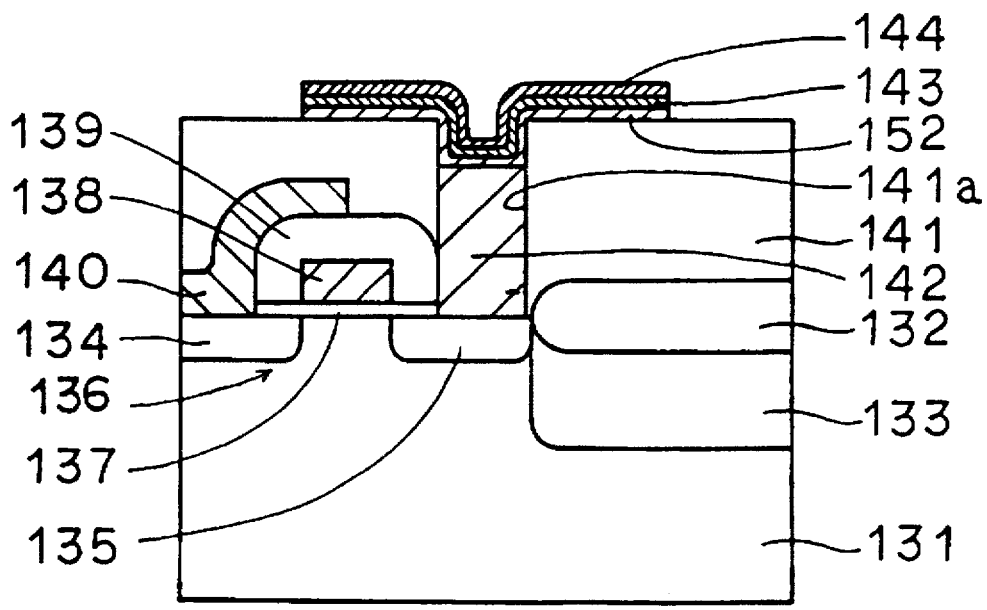

Referring to FIG. 67, deposited conductive layer 152 of doped polysilicon is formed on buried conductive layer 142 by a CVD method. Then, barrier layer 143 of Ti/TiN/Ti and lower electrode layer 144 of platinum are sequentially layered by a sputtering method on deposited conductive layer 152, which are then patterned to a predetermined configuration.

Figure 68:
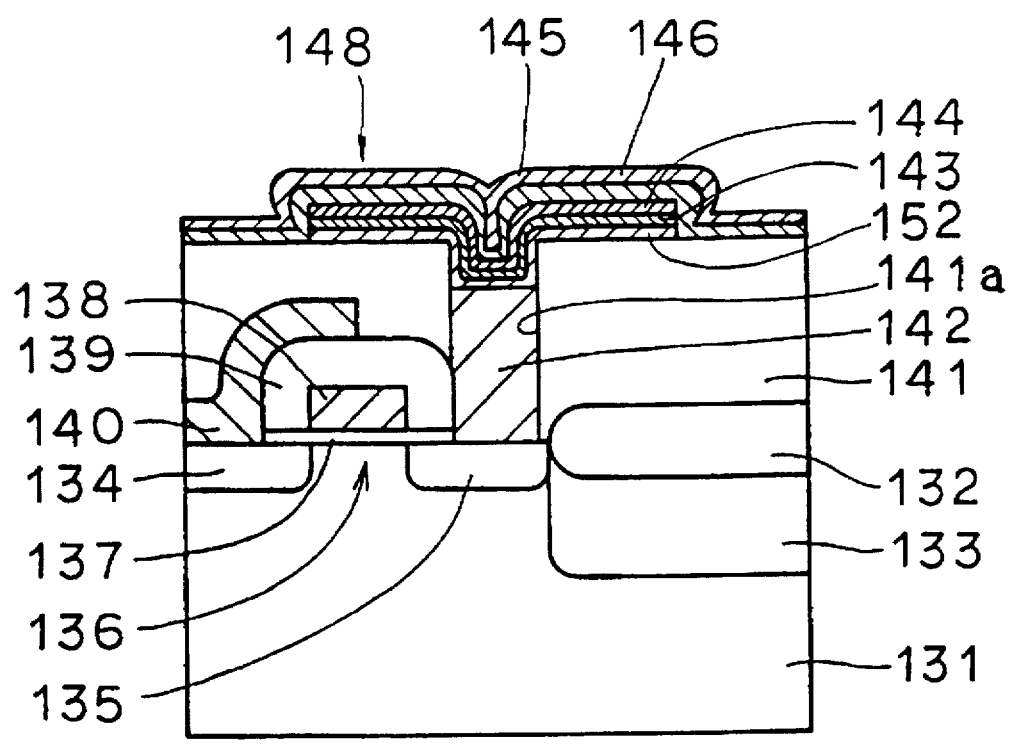

Referring to FIG. 68, high dielectric film 145 of PZT is formed by a sputtering method so as to cover the surface of lower electrode layer 144. Then, upper electrode layer 146 of platinum, for example, is formed by a sputtering method on high dielectric film 145.

Thus, capacitor 148 is formed including lower electrode layer 144, high dielectric film 145, and upper electrode layer 146. By depositing insulation film 147 so as to cover capacitor 148, the semiconductor device shown in FIG. 63 is completed.

According to the method of manufacturing the semiconductor device of the ninth embodiment, a deposited conductive layer 152 grown by a CVD method is provided between buried conductive layer 142 and lower electrode layer 144. Therefore, the stepped portion on buried conductive layer 142 can be rounded. When lower electrode layer 144 is formed on buried conductive layer 142, a stepped portion as in a conventional case will not be generated in lower electrode layer 144.

High dielectric film 145 formed on lower electrode layer 144 will not be reduced in film thickness at the stepped portion. There is no portion between lower and upper electrode layers 144 and 146 that is reduced in thickness when upper electrode layer 146 is formed on high dielectric film 145. Thus, breakdown voltage and anti-leak characteristics of a capacitor are not degraded.

Figure 69:
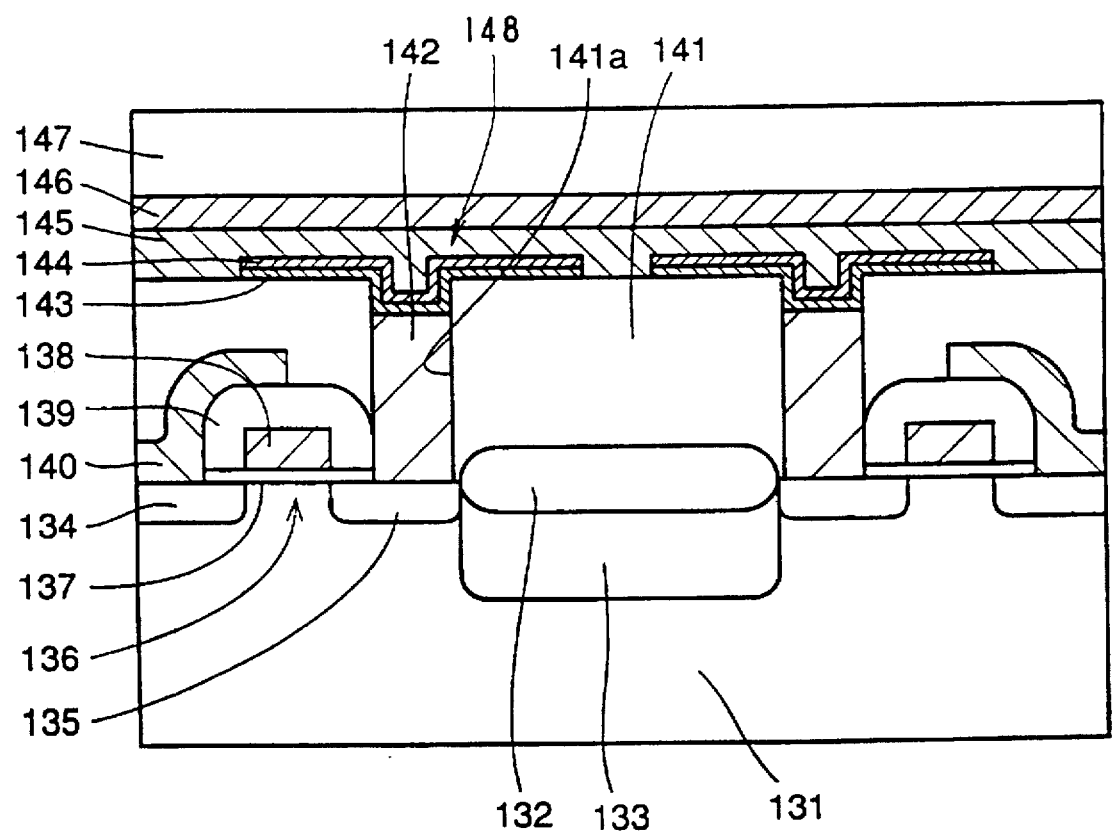
FIG. 69 is a sectional structural view of a semiconductor device according to a tenth embodiment of the present invention.

A tenth embodiment of the present invention will be described hereinafter with reference to FIG. 69 showing a sectional view of the semiconductor device of the tenth embodiment. The structure of transfer gate transistor 136 is similar to that of the first embodiment shown in FIG. 1, and their description will not be repeated. In order to clarify the feature of the present embodiment, two adjacent transfer gate transistors 136 isolated by an element isolation region 132 are shown in the present embodiment.

Referring to FIG. 69, a capacitor 148 is formed to be electrically connected to source/drain region 135 via a buried conductive layer 142.

Capacitor 148 includes a lower electrode layer 144, a high dielectric film 145, and an upper electrode layer 146. High dielectric film 145 of capacitor 148 is formed of a high dielectric constant material such as PZT. Therefore, a platinum (Pt) layer is used for lower electrode layer 144.

Lower electrode layer 144 is formed to be electrically connected to buried conductive layer 142 via a barrier layer 143, and so as to extend over interlayer insulation film 141.

Barrier layer 143 serves to prevent impurities of buried conductive layer 142 from diffusing into lower electrode layer 144.

High dielectric film 145 is formed to cover the surface of lower electrode layer 144. Upper electrode layer 146 is formed so as to cover lower electrode layer 144 with high dielectric film 145 thereunder.

Upper electrode layer 146 is formed of platinum or doped polysilicon.

An insulation film 147 is formed so as to cover capacitor 148.

A method of manufacturing the above semiconductor device will be described hereinafter.

FIGS. 70–75 are sectional views of the semiconductor device of the tenth embodiment showing manufacturing steps sequentially. The manufacturing process up to the deposition of interlayer insulation film 141 is similar to that of the first embodiment, and their description will not be repeated.

Figure 70:
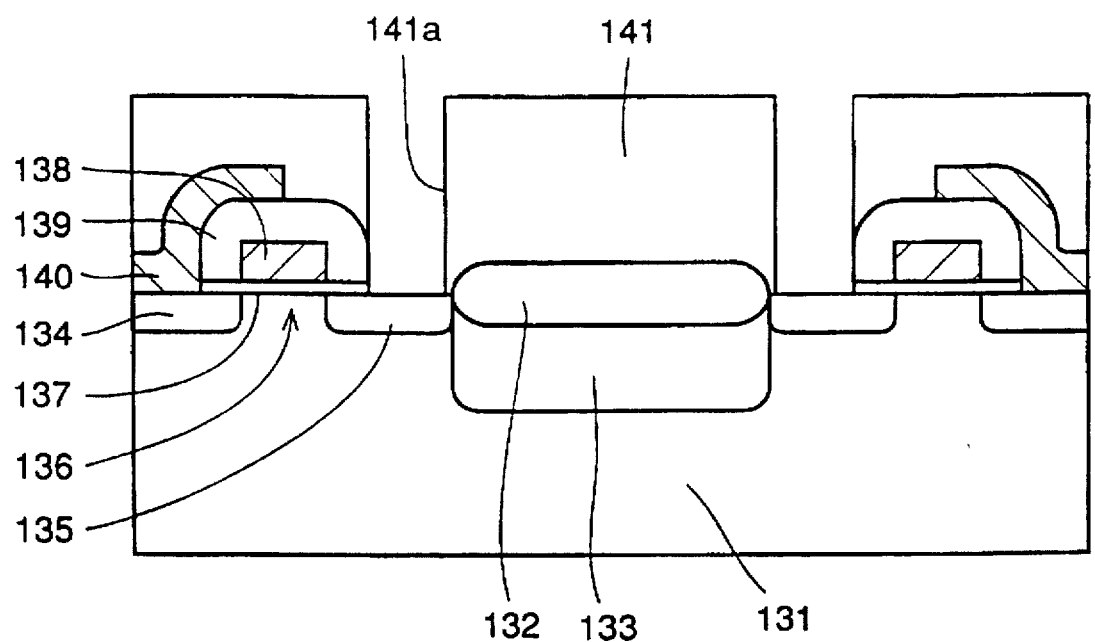
FIGS. 70–75 are sectional views of the semiconductor device of the tenth embodiment showing 1–6th steps of the manufacturing method thereof.

Referring to FIG. 70, a photoresist of a predetermined pattern is formed all over the surface of interlayer insulation film 141. Using this photoresist pattern, an etching step is carried out to form a contact hole 141a reaching source/drain region 135.

Figure 71:
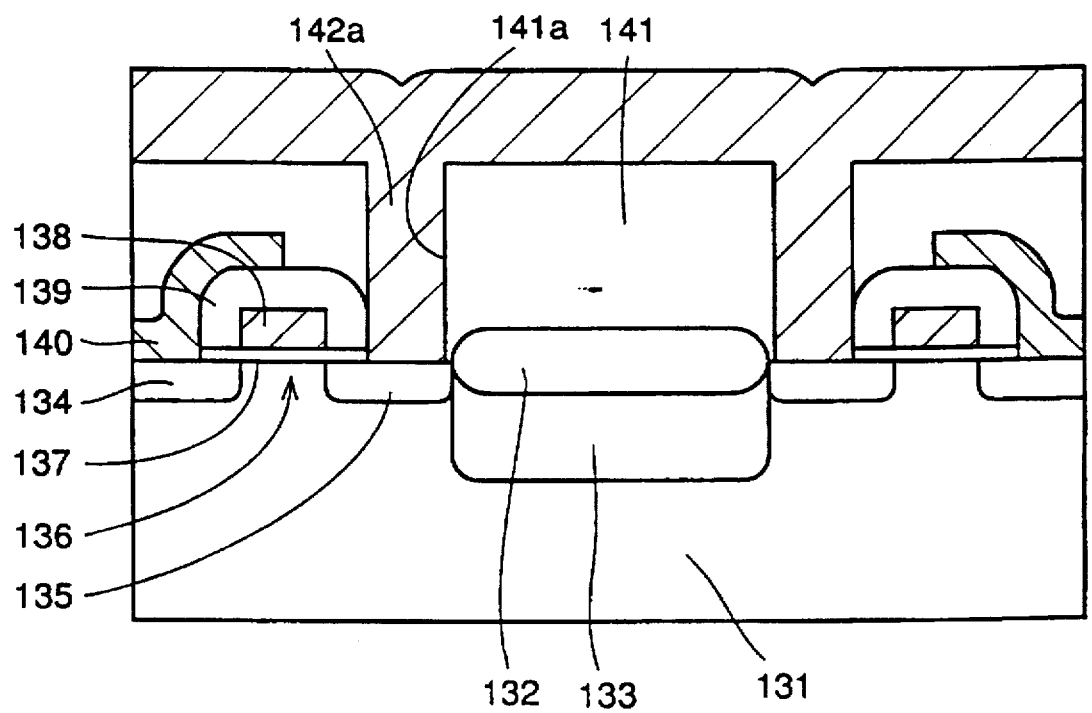

Referring to FIG. 71, a doped polysilicon film 142a is deposited all over the surface of interlayer insulation film 141 until the interior of contact hole 141a is filled.

Figure 72:
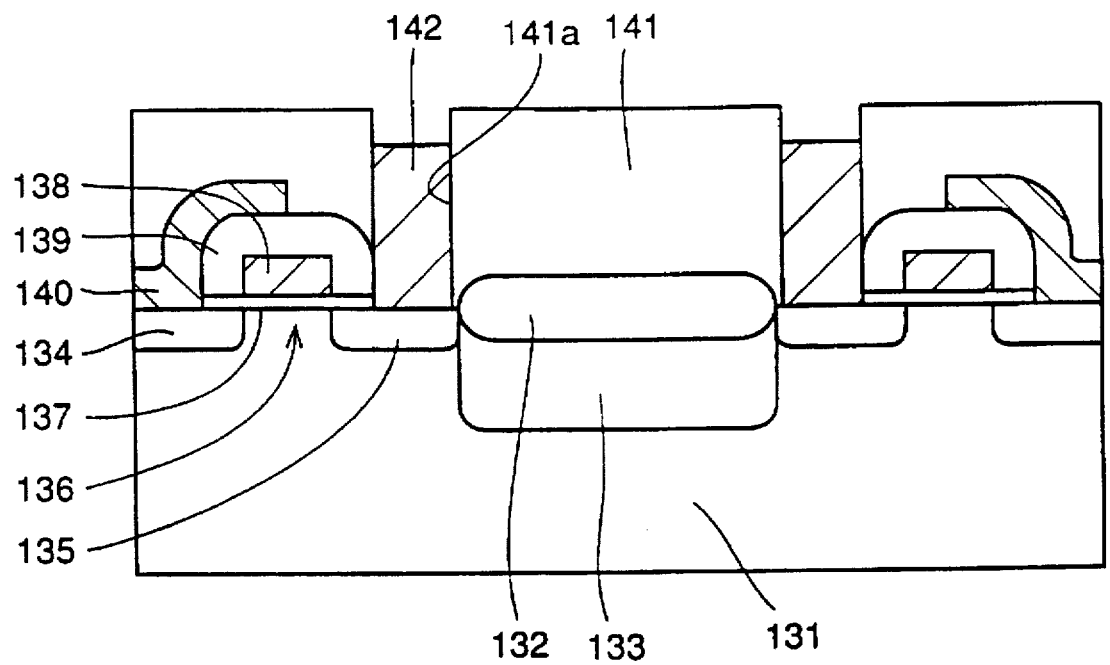

Referring to FIG. 72, doped polysilicon film 142a is etched back until the surface of interlayer insulation film 141 is exposed. An overetching of approximately 20–30% of the film thickness of doped polysilicon film 142a is carried out to completely remove etching residues on interlayer insulation film 141. This results in buried conductive layer 142 in contact hole 141a.

Figure 73:
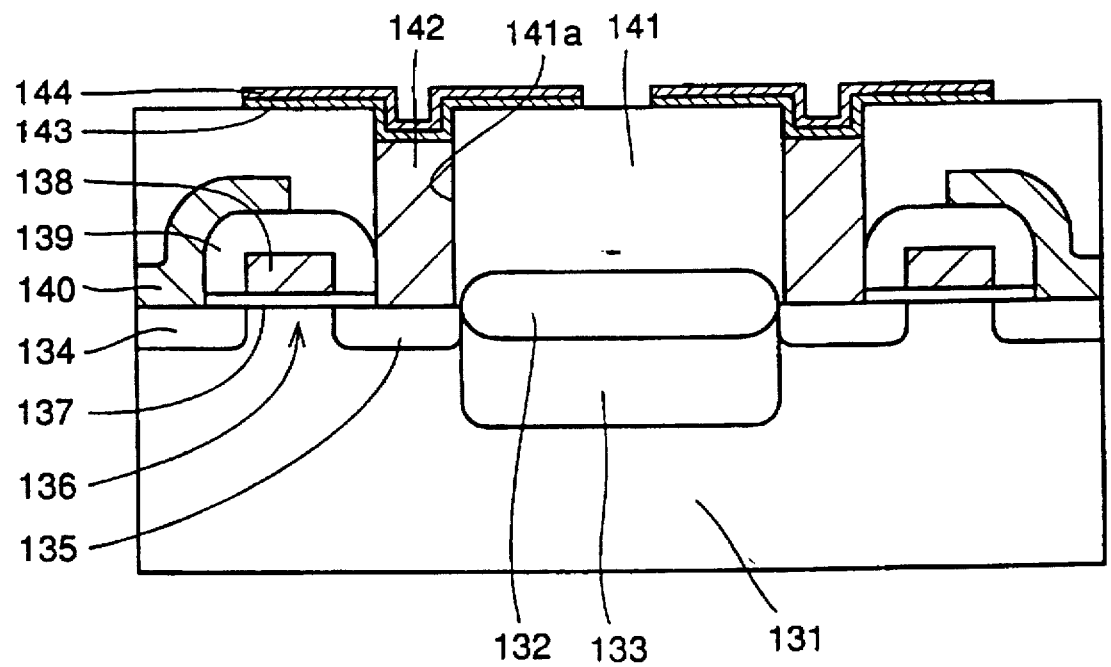

Referring to FIG. 73, barrier layer 143 of Ti/TiN/Ti and lower electrode layer 144 of a platinum layer are sequentially layered by a sputtering method on the surface of buried conductive layer 142 and interlayer insulation film 141, which are patterned to a predetermined configuration.

Figure 74:
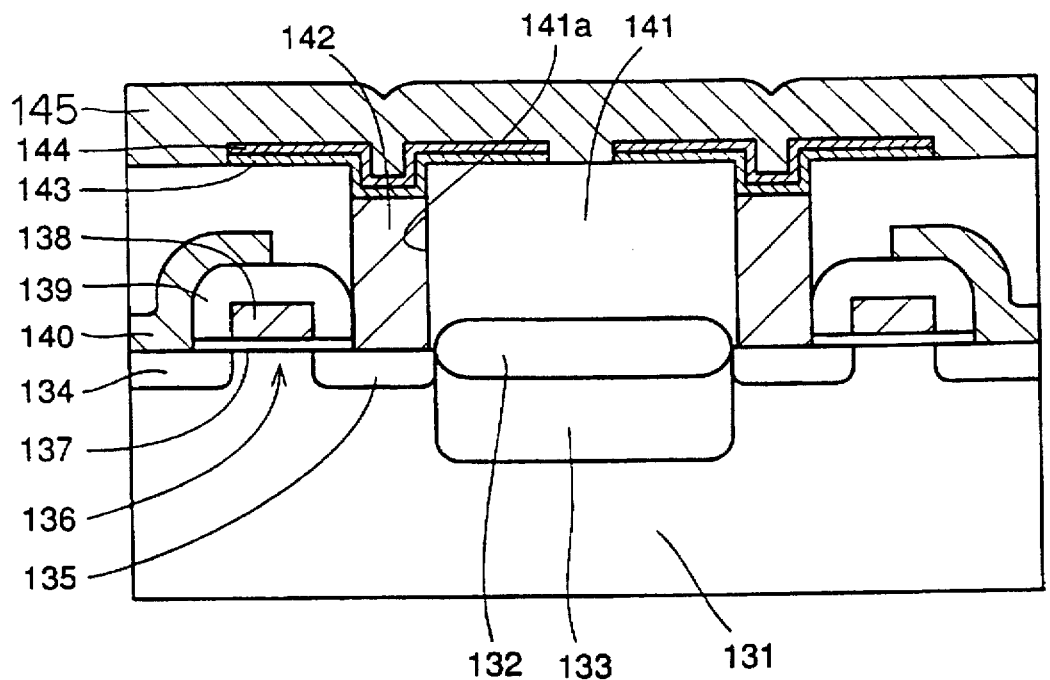

Referring to FIG. 74, high dielectric film 145 is formed by a sputtering method to a thickness of 1000–2000 Å so as to cover the surface of lower electrode layer 144.

Figure 75:
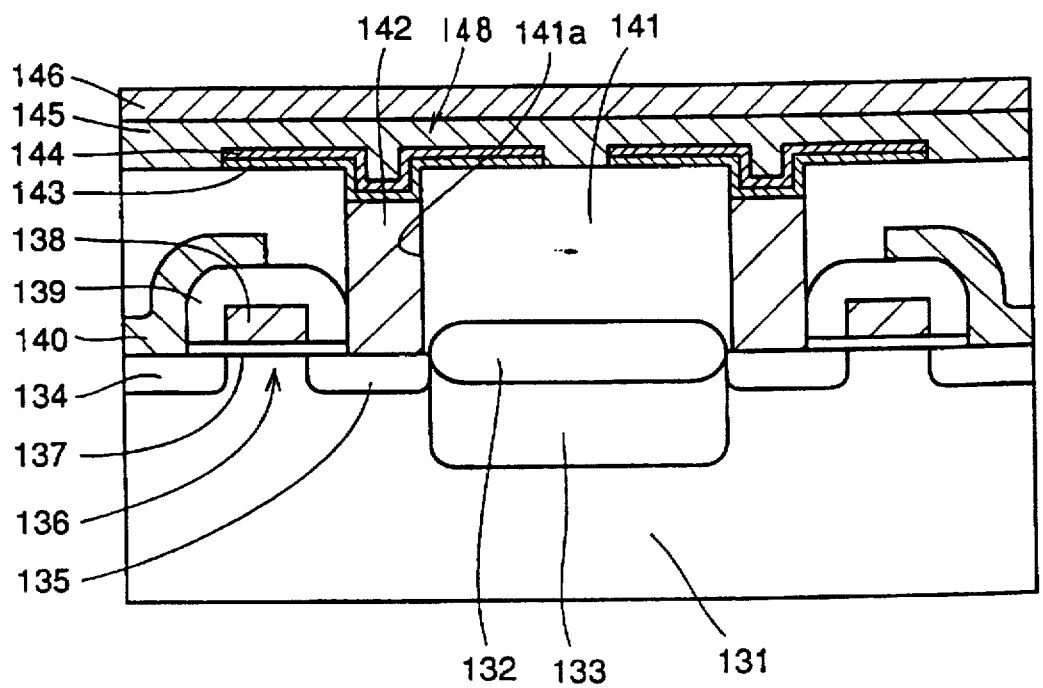
Figure 76:
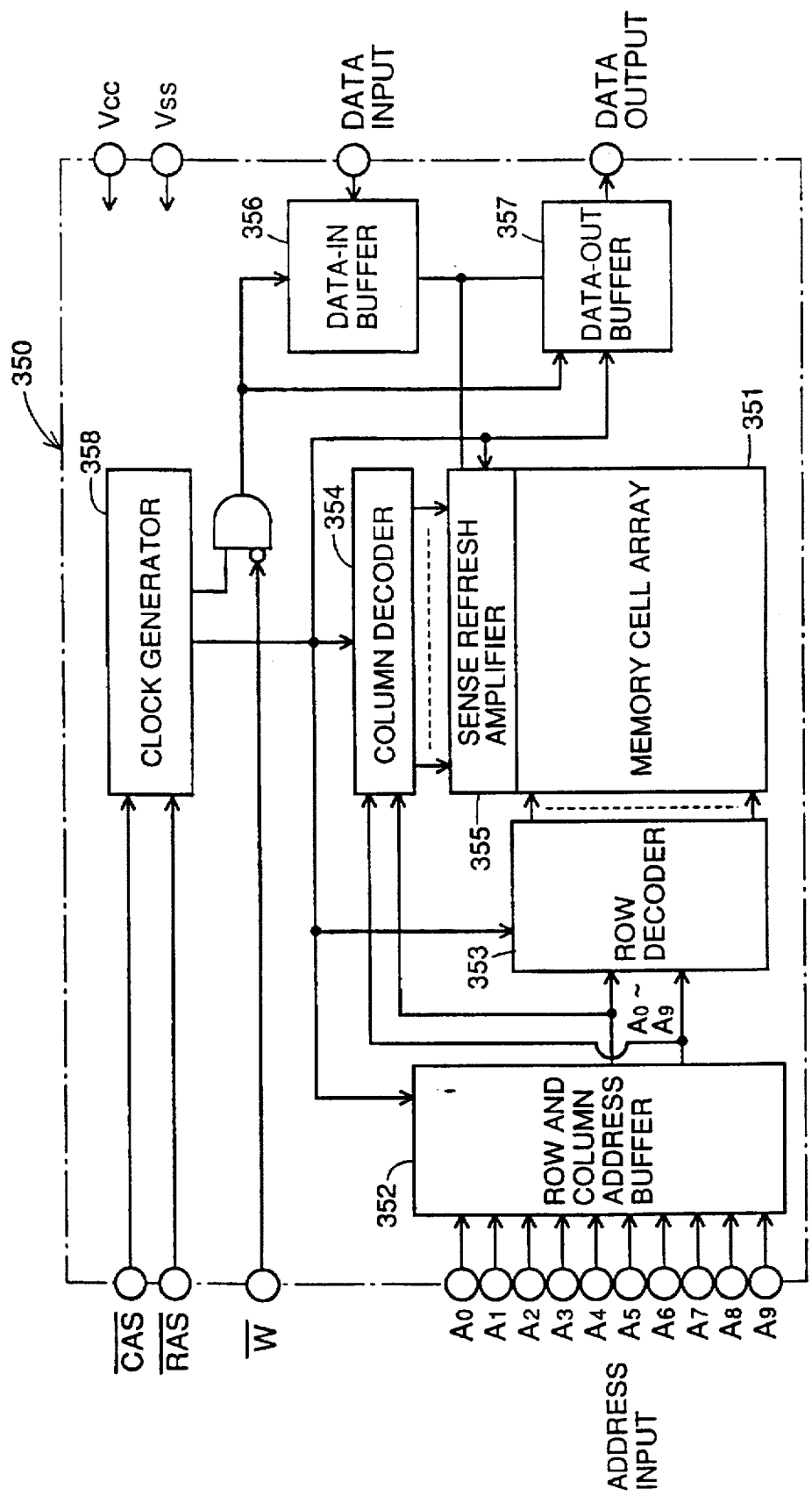
FIG. 76 is a block diagram of a general DRAM.
Figure 77:
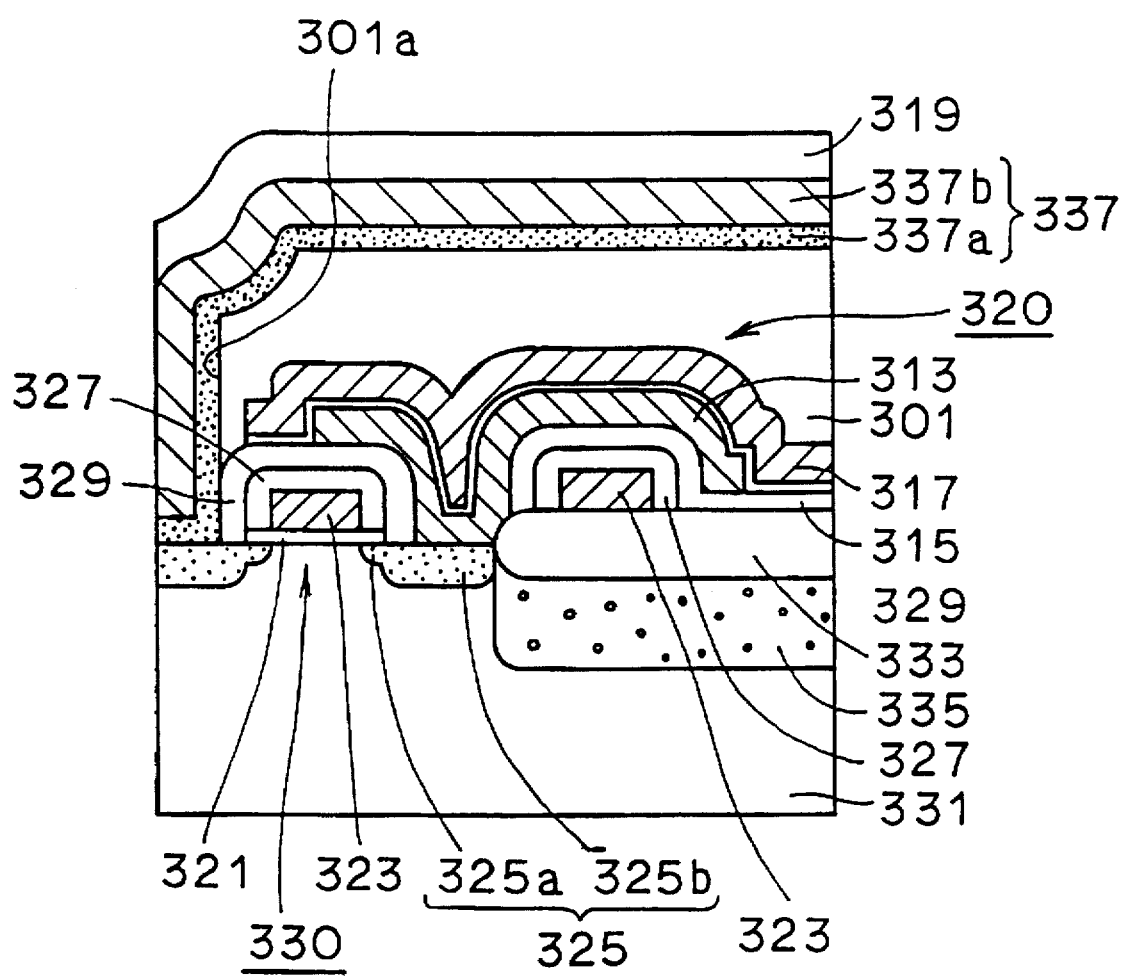
FIG. 77 is a sectional view showing a memory cell structure of a DRAM including a conventional stacked type capacitor.
Figure 78:
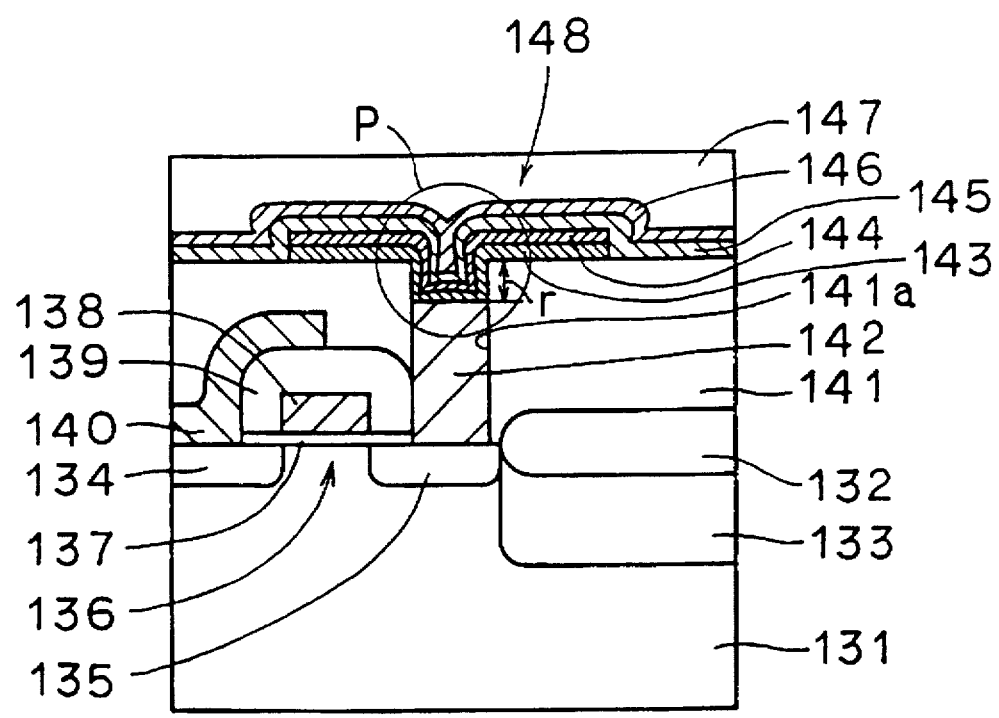
FIG. 78 is a sectional view schematically showing a structure of a conventional semiconductor device.
Figure 79:
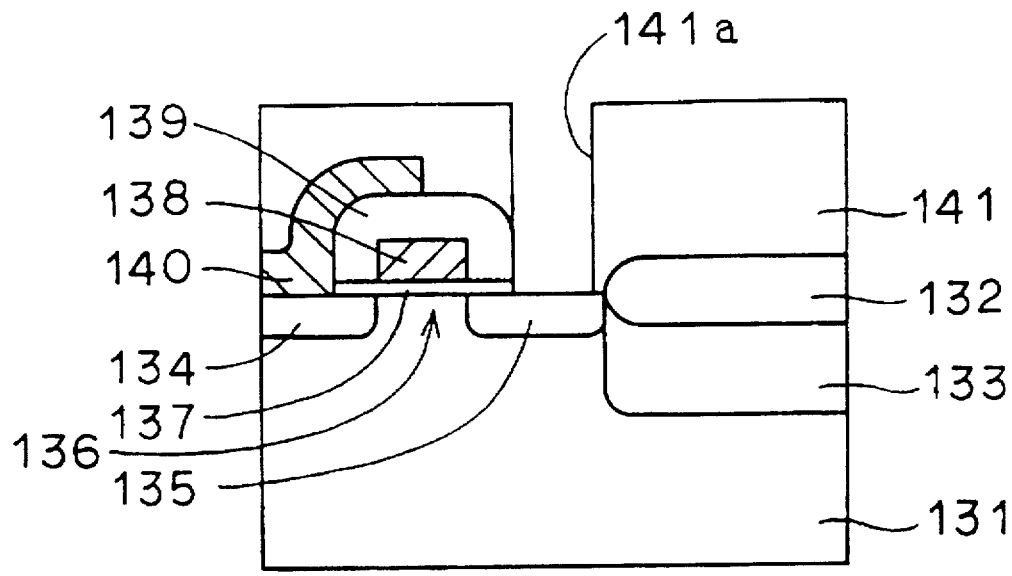
FIGS. 79–83 are sectional views of the conventional semiconductor device showing 1–5th steps of the manufacturing method thereof.
Figure 80:
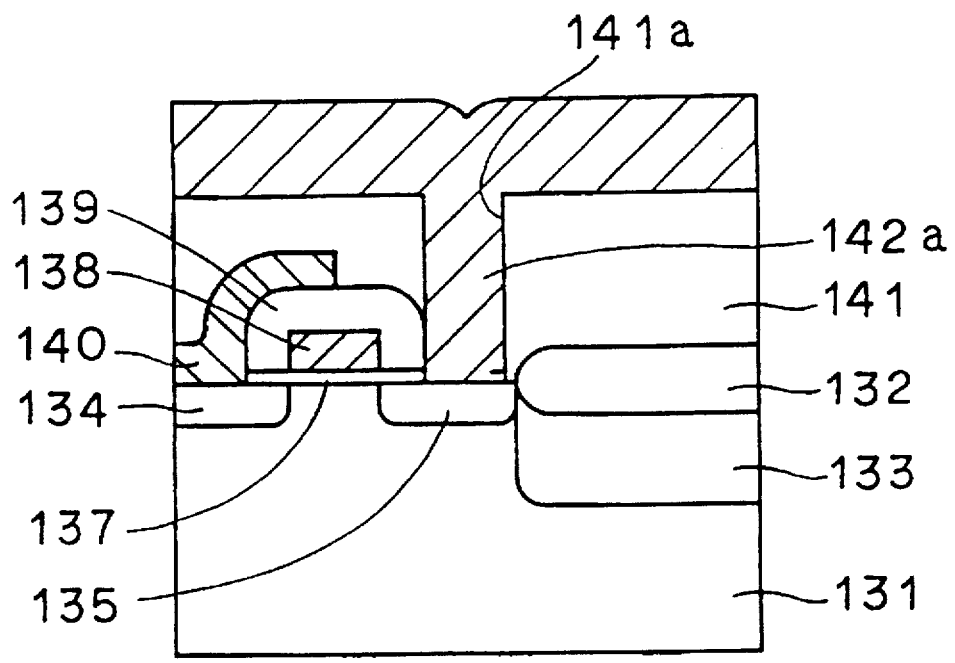
Figure 81:
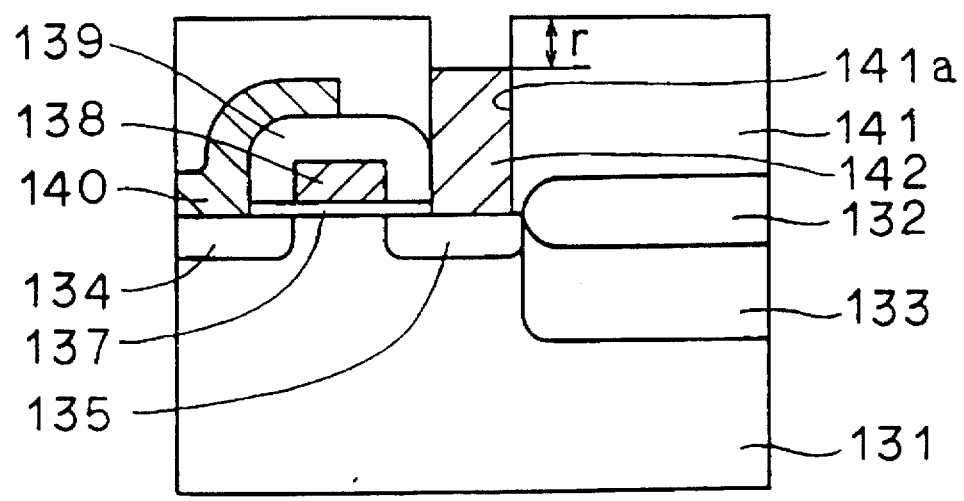
Figure 82:
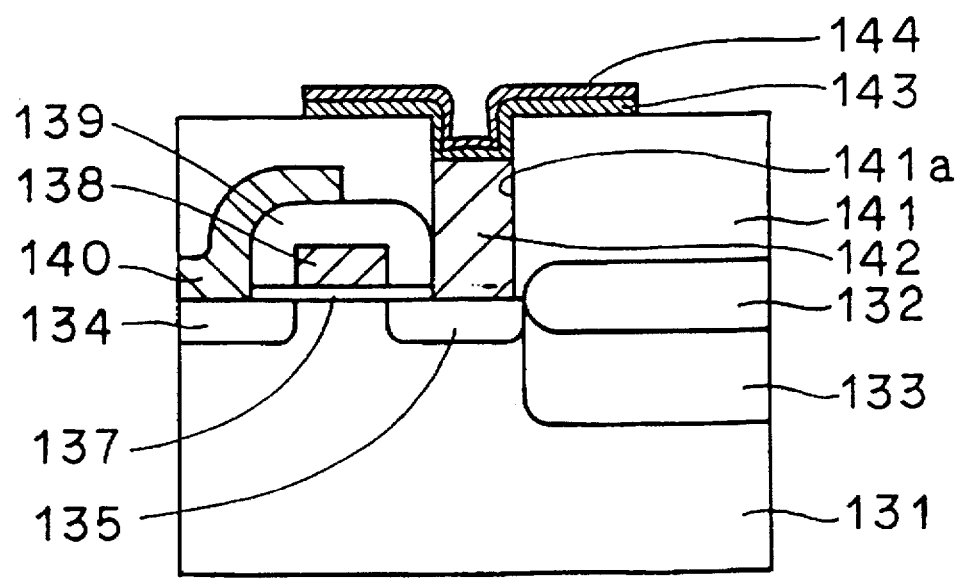
Figure 83:
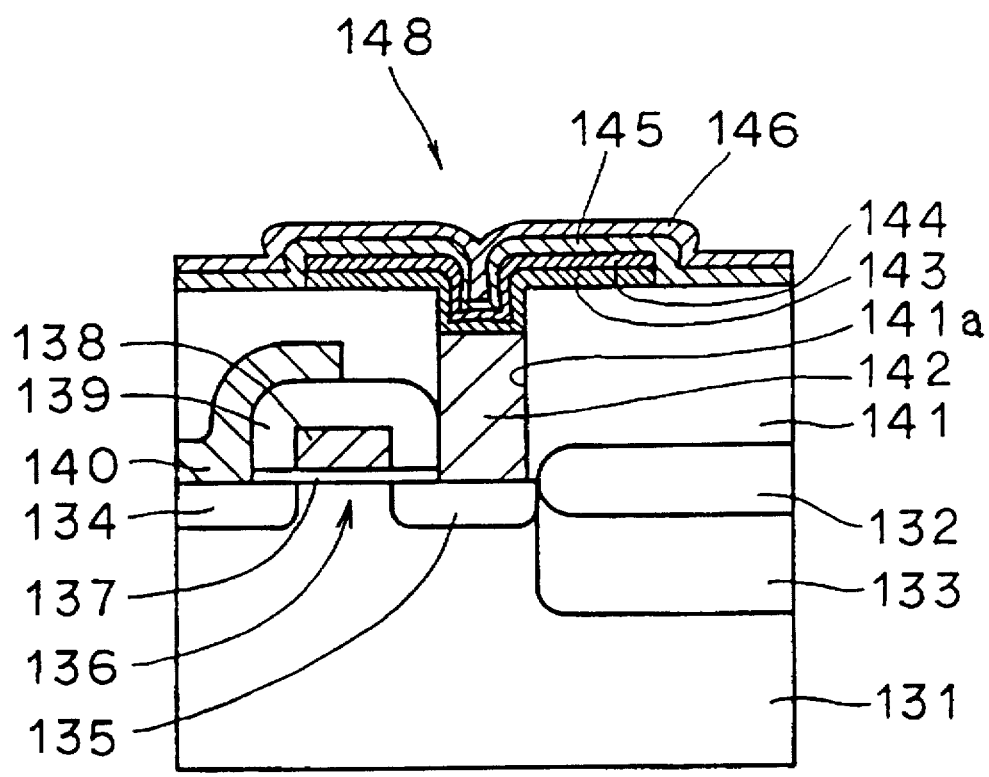
Figure 84:
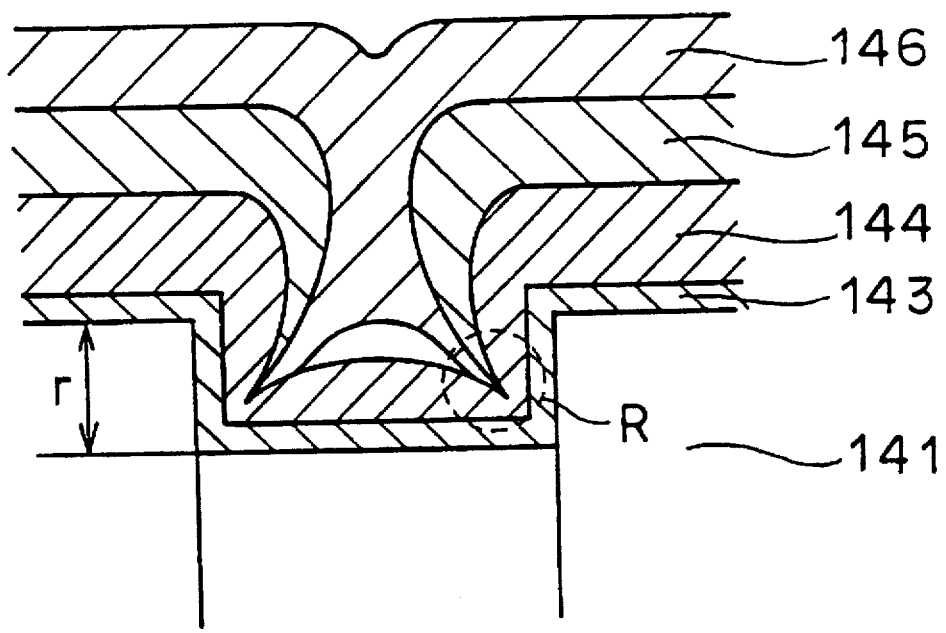
FIG. 84 in an enlarged sectional view of the conventional semiconductor device for describing problems thereof.

Referring to FIG. 75, the surface of the relatively thick high dielectric film 145 is planarized by a chemical-mechanical polishing method.

Then, upper electrode layer 146 of, for example platinum, is formed on high dielectric film 145. Thus, capacitor 148 is formed including lower electrode layer 144, high dielectric film 145, and upper electrode layer 146. Insulation film 147 is deposited so as to cover capacitor 148. Thus, the semiconductor device shown in FIG. 50 is completed.

According to the tenth embodiment, high dielectric film 145 is deposited to a relatively great amount of thickness so as to cover interlayer insulation film 141 with lower electrode layer 144 therebetween. The surface of high dielectric film 145 is planarized by a chemical-mechanical polishing method.

Therefore, a stepped portion is not generated at the surface of capacitor dielectric film. There is no portion between lower and upper electrode layers 144 and 146 that is reduced in thickness when upper electrode layer 146 is formed on high dielectric film 145.

Thus, breakdown voltage and anti-leak characteristics of a capacitor are not degraded.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming an impurity region on a main surface of semiconductor substrate, forming an interlayer insulation film on the main surface of said semiconductor substrate to cover said impurity region, including a first contact hole of a first diameter and reaching said impurity region, and a second contact hole of a second diameter greater than said first diameter and provided above said first contact hole in communication therewith, forming a buried conductive layer filling said first contact hole, and in contact with a part of the top face of said impurity region, forming a lower electrode layer, filling said second contact hole, in contact with the surface of said buried conductive layer, and having a top face substantially flush with a top face of said interlayer insulation film, forming a high dielectric film of a high dielectric constant material on said interlayer insulation film to come into contact with said lower electrode, and forming an upper electrode on said high dielectric film.

* * * * *